US012135503B2

(12) United States Patent
Meijer et al.

(10) Patent No.: US 12,135,503 B2
(45) Date of Patent: Nov. 5, 2024

(54) ORGANOMETALLIC PHOTORESISTS FOR DUV OR EUV LITHOGRAPHY

(71) Applicant: International Business Machines Corporation, Armonk, NY (US)

(72) Inventors: Gerhard Ingmar Meijer, Zurich (CH); Valery Weber, Gattikon (CH); Peter Willem Jan Staar, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 17/220,412

(22) Filed: Apr. 1, 2021

(65) Prior Publication Data
US 2022/0317572 A1    Oct. 6, 2022

(51) Int. Cl.
*G03F 7/20* (2006.01)
*G03F 7/004* (2006.01)

(52) U.S. Cl.
CPC .......... *G03F 7/2004* (2013.01); *G03F 7/0042* (2013.01)

(58) Field of Classification Search
CPC ........ G03F 7/2004; G03F 7/0042; C07F 9/94; C07F 9/92; C07F 9/902; C07F 9/90
See application file for complete search history.

(56) References Cited

U.S. PATENT DOCUMENTS

| 10,642,153 | B2 | 5/2020 | Meyers et al. |
| 10,775,696 | B2 | 9/2020 | Meyers et al. |
| 10,781,276 | B2 | 9/2020 | Enomoto et al. |
| 2018/0273664 | A1* | 9/2018 | Enomoto ............ C08F 220/303 |
| 2020/0041896 | A1 | 2/2020 | Moon et al. |

FOREIGN PATENT DOCUMENTS

| WO | 2019217749 A1 | 11/2019 |
| WO | WO-2020196140 A1 * | 10/2020 ............... G02B 1/04 |

OTHER PUBLICATIONS

Translated Description of Matsumura et al (Year: 2020).*
Francis Ignatious, Arjen Sein, Yadollah Delaviz, Israel Cabasso, Johannes Smid, Organobismuth polymers as X-ray contrast materials: synthesis, characterization and properties, Polymer, vol. 33, Issue 8, 1992, pp. 1724-1730 (Year: 1992).*
Passarelli, J., "Organometallic Carboxylate Resists for EUV with High Sensitivity", Nanoscale Science & Engineering, May 2015, 28 pages.

* cited by examiner

*Primary Examiner* — Sean M DeGuire
*Assistant Examiner* — Andrew Preston Traywick
(74) *Attorney, Agent, or Firm* — Scully, Scott, Murphy & Presser, P.C.; Daniel P. Morris, Esq.

(57) ABSTRACT

Organometallic photoresists suitable for use in deep ultraviolet (DUV) or extreme ultraviolet (EUV) lithography are provided. The organometallic photoresists contain an organometallic molecule having least a metal element M selected from the group consisting of Bi, Sb, and mixtures thereof, and having an oxidation state of 3+, and at least one polymerizable group R. A method of forming a patterned materials feature on a substrate utilizing the organometallic photoresist compositions is also provided.

15 Claims, 18 Drawing Sheets

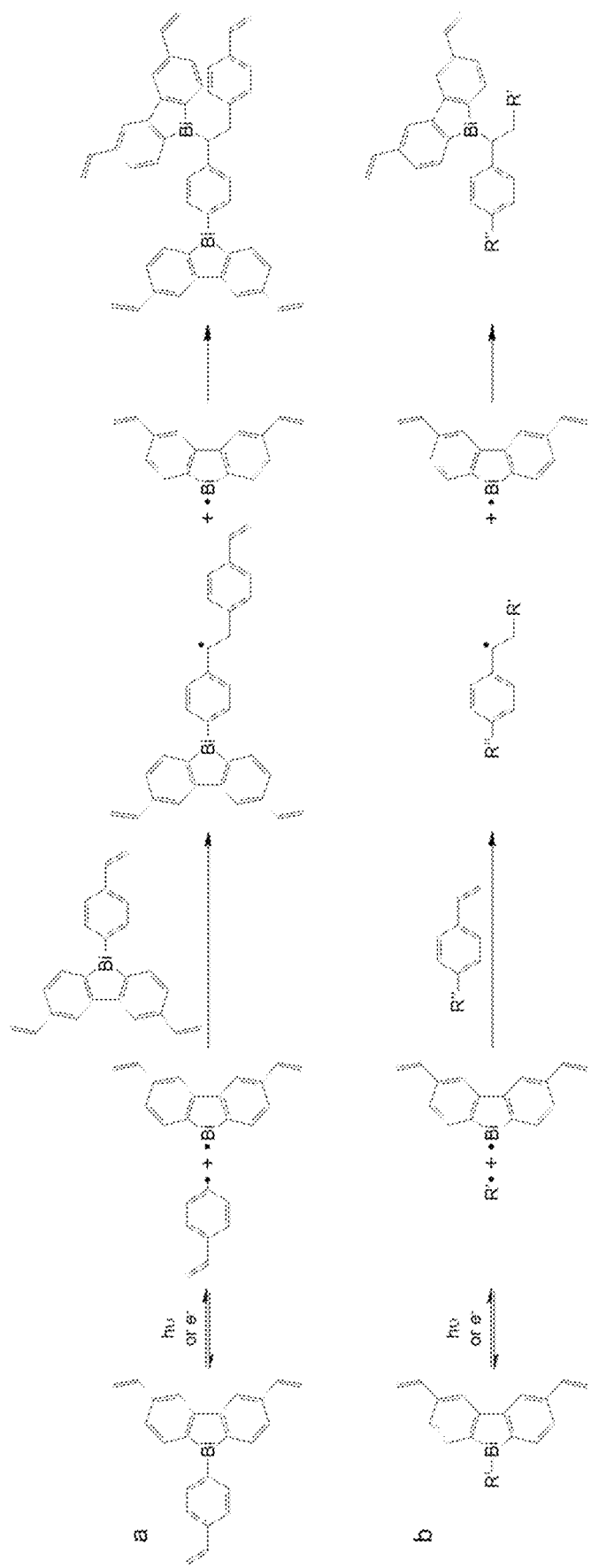
Figures 18 (a) and 18 (b)

ORGANOMETALLIC PHOTORESISTS FOR DUV OR EUV LITHOGRAPHY

BACKGROUND

The present invention relates to the field of organometallic photoresists for deep ultraviolet (DUV) or extreme ultraviolet (EUV) lithography. More specifically, the present invention relates to new organometallic molecules for organometallic photoresist compositions for DUV or EUV lithography. Finally, the present invention relates to a method of forming a patterned materials feature on a substrate my means of said organometallic photoresist composition.

Photoresists are photosensitive films for transfer of patterns to a substrate. They form negative or positive patterns. After coating a photoresist on a substrate, a source of activating energy, such as ultraviolet light, is used to project a patterned mask or reticle, typically using a so-called stepper and a 4x reduction lens assembly, onto the coating to form a latent pattern in the photoresist coating. The mask defines the pattern desired to be transferred to the underlying substrate.

Deep ultraviolet (DUV) and extreme ultraviolet (EUV) lithography are being used as one essential technology for semiconductor manufacturing of next generation devices. DUV lithography is the process of defining a pattern in a thin photosensitive polymer layer (photoresist) using controlled 193 nm or 248 nm light, which corresponds to an energy of about 6 eV or 5 eV, respectively, such that the resulting polymer pattern can be transferred into or onto the underlying substrate by etching, deposition, or implantation. EUV lithography is a technology platform that uses an EUV ray having a wavelength of about 13.5 nm, which corresponds to an energy of about 92 eV, as an exposure light source. With the help of the EUV lithography, patterns with very small feature sizes (e.g., patterns having a width or critical dimension of less than or equal to about 20 nm) may be formed in an exposure process during a manufacturing of a semiconductor device.

State of the art photoresists for DUV and for EUV lithography of the 7-nm and 5-nm technology nodes are polymer-based chemically amplified photoresists. These photoresist platforms comprise a photoacid generator and an acid-labile polymer. The acid-labile protection group of this polymer can be removed by an acid. The thereby created compounds are alkali-soluble or volatile.

A key metric of the photoresist is its sensitivity. Sensitivity is the ultraviolet dose that is required to print a feature in the photoresist. Currently available chemically amplified photoresists for EUV lithography have generally a too low sensitivity.

Another key metric of the photoresist is its resolution or pattern quality. Currently available chemically amplified photoresists for EUV lithography have generally a resolution or pattern quality pain-point due to stochastic effects related to the relatively small number of photons that are absorbed and due to the relatively long diffusion-length of the acid.

Organometallic photoresists for EUV lithography have been taught in U.S. Pat. No. 10,775,696. This photoresist platform comprises organotin clusters. Upon EUV exposure, the Sn—C bonds dissociate and the inorganic $SnO_x$ clusters crosslink. This leads to a change of the solubility. The not-exposed material is soluble in alkaline solvents whereas the exposed material is not. While this photoresist platform has a substantially higher sensitivity in the EUV than state-of-the-art chemically amplified photoresists, further sensitivity improvements are sought.

Related organometallic photoresists for EUV lithography have been taught in U.S. Patent Application Publication No. 2020/0041896. The disclosed photoresist platform comprises organotin molecules. Upon EUV exposure, the Sn—C bonds dissociate and the molecules crosslink. Some embodiments of the organotin molecule comprise acrylate groups, which can polymerize; photoresists comprising these organometallic molecules have an improved sensitivity but deteriorated resolution or pattern quality.

Furthermore, the photoresist's toxicity and chemical waste are increasingly in focus. Regulation bodies scrutinize used fluorinated materials and international actions on these fluorinated materials are to be expected (see, for example, EU regulatory actions to control and phase-down fluorinated materials such as perfluorocarbons and sulfur hexafluoride as part of its policy). Currently available chemically amplified photoresists for DUV and for EUV lithography have generally, due to the use of fluorinated PAG, a material's toxicity and chemical waste pain-point.

While organometallic photoresist platforms are generally fluorine-free, organometallic compounds often have a material's toxicity and chemical waste pain-point too due to incorporation of organotin compounds.

The foregoing indicates a need for photoresists for EUV lithography which have a high sensitivity, have a good resolution or pattern quality, and have a low material's toxicity and chemical waste.

SUMMARY

In a first aspect, the present invention relates to an organometallic molecule for an organometallic photoresist for deep ultraviolet (DUV) or extreme ultraviolet (EUV) lithography, the organometallic molecule comprising or consisting of:
  at least one metal element M selected from the group consisting of Bi, Sb, and mixtures thereof, and having an oxidation state of 3+; and
  at least one polymerizable group R.

In another aspect, the present invention relates to an organometallic photoresist composition comprising the organometallic molecule according to the present invention.

Finally, in a further aspect, the present invention relates to a method of forming a patterned materials feature on a substrate, comprising the steps of
  providing a material surface on a substrate;
  forming a layer of the photoresist composition according to the present invention over said material surface;
  patternwise irradiating the photoresist layer with an energy ray thereby creating a pattern of radiation-exposed regions in said photoresist layer;
  selectively removing portions of said photoresist layer to form exposed portions of said material surface; and
  etching or ion implanting said exposed portions of said material, thereby forming said patterned material feature.

The organometallic molecules for organometallic photoresists for DUV or EUV lithography according to the present invention comprise at least one polymerizable group. The organometallic molecules' composition and structure are selected such that upon DUV or EUV exposure it is a bond between a metal atom and a R group or, in some cases, a bond between a metal atom and a linking atom or a linking group, that dissociates, and it is a metal radical species that is formed. The organometallic molecules comprise at least one metal element selected from the group consisting of Bi, Sb, and mixtures thereof, which has a high absorption cross-section for photons in the EUV. The Bi's or Sb's oxidation state 3+ is selected such that the polymerization reaction that occurs upon DUV or EUV exposure is a controlled/living radical polymerization, i.e., a polymerization through a reversible activation of a dormant species to a propagating radical, but not a conventional free-radical polymerization, i.e., a polymerization though an uncontrolled cascade of propagating radical reactions.

Surprisingly, it has been discovered that the organometallic molecules for organometallic photoresists for DUV or EUV lithography comprising at least one polymerizable group and at least one metal element Bi and/or Sb, having an oxidation state of 3+, and a large absorption cross-section for EUV photons, have the property of causing upon DUV or EUV exposure a controlled/living radical polymerization, i.e., a polymerization through a reversible activation of a dormant species to a propagating radical, but not a conventional free-radical polymerization, i.e., a polymerization though an uncontrolled cascade of propagating radical reactions.

The organometallic photoresists for DUV or EUV lithography that comprise the organometal (III) molecules, in particular the organobismuth(III) and/or organoantimony (III) molecules, according to the present invention may have an improved, i.e., high, EUV sensitivity compared to currently available chemically amplified photoresists for EUV lithography. Organometallic photoresists for DUV or EUV lithography that comprise the organometal (III) molecules, in particular the organobismuth(III) and/or organoantimony (III) molecules, according to the present invention may have an improved EUV sensitivity compared to organometallic photoresists comprising molecules that crosslink and that don't polymerize (such as organotin clusters taught in U.S. Pat. No. 10,775,696).

The organometallic photoresists for DUV or EUV lithography that comprise the organometal (III) molecules, in particular the organobismuth(III) and/or organoantimony (III) molecules, according to the present invention may have an improved, i.e. good, resolution and/or pattern quality compared to organometallic photoresists comprising molecules that polymerize through conventional free-radical polymerization (such as organotin molecules that comprise acrylate groups as taught in U.S. Patent Application Publication No. 2020/0041896 or organobismuth (V) or organoantimony (V) polymerizable-carboxylate resist platforms).

The organometallic photoresists for DUV or EUV lithography that comprise the organometal (III) molecules, in particular the organobismuth(III) and/or organoantimony (III) molecules, according to the present invention may have a material's toxicity and chemical waste advantage over currently available chemically amplified photoresists comprising fluorinated photoacid generators and over organometallic photoresists comprising organotin molecules.

Various variants provide organometal (III) molecules, preferably organobismuth(III) or organoantimony(III) molecules, organometallic photoresists for DUV or EUV lithography, and methods, as described by the subject matter of the independent claims. Advantageous variants are described in the dependent claims. Embodiments of the present invention can be freely combined with each other if they are not mutually exclusive.

BRIEF DESCRIPTION OF THE DRAWINGS

FIG. 12 shows preferred variants of organobismuth(III) and organoantimony(III) molecules according to the present invention comprising phenylacrylate groups: (a) tris(4-(prop-2-enoyloxy)phenyl)bismuthane, (b) 1,4-bis(di(4-(prop-2-enoyloxy)phenyl)bismuthanyl)benzene, (c) 1,3,5-tris(di(4-(prop-2-enoyloxy)phenyl)bismuthanyl)benzene, (d) tris(4-(prop-2-enoyloxy)phenyl)stibane, (e) 1,4-bis(di(4-(prop-2-enoyloxy)phenyl)stibanyl)benzene, and (f) 1,3,5-tris(di(4-(prop-2-enoyloxy)phenyl)stibanyl)benzene.

FIGS. 18 (a) and (b) are schematics of controlled/living radical polymerization of the exemplary organometallic molecule 5-(4-ethenylphenyl)-2,8-diethenyl-dibenzobismole. FIG. 18 (a) displays a specific example of a controlled/living radical polymerization reaction that can occur upon ultraviolet exposure. FIG. 18 (b) displays generalized the controlled/living radical polymerization reaction that occur upon ultraviolet exposure.

DETAILED DESCRIPTION

Figure 1:
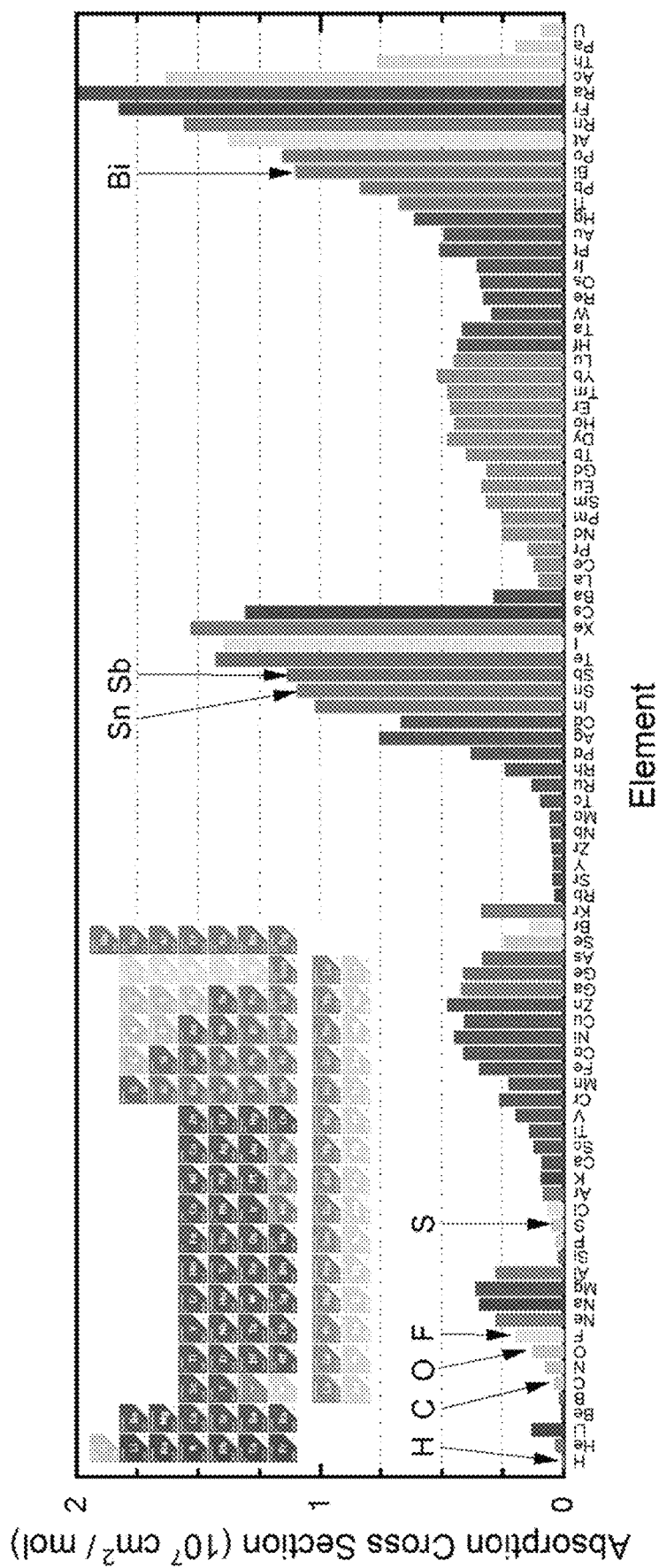
FIG. 1 is a diagram, showing the photon absorption cross-section at 92 eV for all naturally occurring elements.

The descriptions of the various embodiments of the present invention will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Unless otherwise stated, the following terms used in this application, including the specification and claims, have the definitions given below. It must be noted that, as used in the specification and the appended claims, the singular forms "a," "an," and "the" include plural referents unless the context clearly dictates otherwise.

As used herein, the term "comprising" means that the named components are essential, but other components may be added and are still embraced by a composition.

As used herein, the term "consisting of" as used according to the present invention means in general that the total amount of components of a composition adds up to 100% and signifies that the subject matter is closed-ended and can only include the limitations that are expressly recited.

Whenever reference is made to "comprising" it is intended to cover both meanings as alternatives, that is the meaning can be either "comprising" or "consisting of," unless the context dictates otherwise.

As used herein the term "aliphatic" encompasses the terms alkyl, alkenyl, alkynyl, each of which being optionally substituted as set forth below.

As used herein, an "alkyl" group refers to a saturated aliphatic hydrocarbon group containing from 1 to 20 (e.g., 2 to 18, 2 to 8, 2 to 6, or 2 to 4) carbon atoms. An alkyl group can be straight, branched, cyclic, or any combination thereof. Examples of alkyl groups include, but are not limited to, methyl, ethyl, propyl, isopropyl, butyl, isobutyl, sec-butyl, tert-butyl, n-pentyl, n-heptyl, or 2-ethylhexyl. An alkyl group can be substituted (i.e., optionally substituted) with one or more substituents or can be multicyclic as set forth below.

Unless specifically limited otherwise, the term "alkyl," as well as derivative terms such as "alkoxy" and "thioalkyl," as used herein, include within their scope, straight chain, branched chain, and cyclic moieties.

As used herein, an "alkenyl" group refers to an aliphatic carbon group that contains from 2 to 20 (e.g., 2 to 18, 2 to 8, 2 to 6, or 2 to 4) carbon atoms and at least one double bond. Like an alkyl group, an alkenyl group can be straight, branched, or cyclic, or any combination thereof. Examples of an alkenyl group include, but are not limited to, allyl, isoprenyl, 2-butenyl, and 2-hexenyl. An alkenyl group can be substituted (i.e., optionally substituted) with one or more substituents as set forth below.

As used herein, an "alkynyl" group refers to an aliphatic carbon group that contains from 2 to 20 (e.g., 2 to 18, 2 to 8, 2 to 6, or 2 to 4) carbon atoms and has at least one triple bond. Like an alkyl group, an alkynyl group can be straight, branched, or cyclic, or any combination thereof. Examples of an alkynyl group include, but are not limited to, propargyl and butynyl. An alkynyl group can be substituted (i.e., optionally substituted) with one or more substituents as set forth below.

As used herein, the term "alicyclic" refers to an aliphatic ring compound or group comprising at least three carbon atoms and the bonds between pairs of adjacent atoms may all be of the type designated single bonds (involving two electrons), or some of them may be double or triple bonds (with four or six electrons, respectively).

A "halogen" is an atom of the group 17 of the periodic table of elements, which includes fluorine, chlorine, bromine, and iodine.

As used herein, an "aryl" group refers to an aromatic ring compound or group having 3 to 30 carbon atoms and used alone or as part of a larger moiety as in "aralkyl," "aralkoxy," or "aryloxyalkyl" and refers to monocyclic (e.g., phenyl); bicyclic (e.g., indenyl, naphthalenyl, tetrahydronaphthyl, or tetrahydroindenyl); and tricyclic (e.g., fluorenyl, tetrahydrofluorenyl, tetrahydroanthracenyl, or anthracenyl) ring systems in which the monocyclic ring system is aromatic or at least one of the rings in a bicyclic or tricyclic ring system is aromatic. The bicyclic and tricyclic groups include benzofused 2 to 3 membered carbocyclic rings. For example, a benzofused group includes phenyl fused with two or more $C_4$ to $C_8$ carbocyclic moieties. An aryl is optionally substituted with one or more substituents as set forth below.

As used herein, an "aralkyl" or "arylalkyl" group refers to an alkyl group (e.g., a $C_1$ to $C_4$ alkyl group) that is substituted with an aryl group. Both "alkyl" and "aryl" have been defined above. An example of an aralkyl group is benzyl. An aralkyl is optionally substituted with one or more substituents as set forth below.

As used herein, a "cycloalkyl" group refers to a saturated carbocyclic mono to pentacyclic (fused or bridged) ring of 3 to 30 (e.g., 5 to 30) carbon atoms. Examples of cycloalkyl groups include cyclopropyl, cyclobutyl, cyclopentyl, cyclohexyl, cycloheptyl, adamantyl, norbornyl, cubyl, octahydroindenyl, decahydro-naphthyl, bicyclo[3.2.1]octyl, bicyclo[2.2.2]octyl, bicyclo[3.3.1]nonyl, bicyclo[3.3.2]decyl, bicyclo[2.2.2]octyl, adamantyl, azacycloalkyl, or ((aminocarbonyl) cycloalkyl) cycloalkyl.

As used herein, the term "heteroaryl" group refers to a monocyclic, bicyclic, or tricyclic ring system having 3 to 30 ring atoms wherein one or more of the ring atoms is a heteroatom (e.g., N, O, S, or combinations thereof) and in which the monocyclic ring system is aromatic or at least one of the rings in the bicyclic or tricyclic ring systems is aromatic. A heteroaryl group includes a benzofused ring system having 2 to 3 rings. For example, a benzofused group includes benzo fused with one or two 4 to 8 membered heterocycloaliphatic moieties (e.g., indolizyl, indolyl, isoindolyl, 3H-indolyl, indolinyl, benzo[b]furyl, benzo[b]thiophenyl, quinolinyl, or isoquinolinyl). Some examples of heteroaryl are azetidinyl, pyridyl, 1H-indazolyl, furyl, pyrrolyl, thienyl, thiazolyl, oxazolyl, imidazolyl, tetrazolyl, benzofuryl, isoquinolinyl, benzthiazolyl, xanthene, thioxanthene, phenothiazine, dihydroindole, benzo[1,3]dioxole, benzo[b]furyl, benzo[b]thiophenyl, indazolyl, benzimidazolyl, benzthiazolyl, puryl, cinnolyl, quinolyl, quinazolyl, cinnolyl, phthalazyl, quinazolyl, quinoxalyl, isoquinolyl, 4H-quinolizyl, benzo-1,2,5-thiadiazolyl, or 1,8-naphthyridyl.

Without limitation, monocyclic heteroaryls include furyl, thiophenyl, 2H-pyrrolyl, pyrrolyl, oxazolyl, thazolyl, imidazolyl, pyrazolyl, isoxazolyl, isothiazolyl, 1,3,4-thiadiazolyl, 2H-pyranyl, 4-H-pranyl, pyridyl, pyridazyl, pyrimidyl, pyrazolyl, pyrazyl, or 1,3,5-triazyl. Monocyclic heteroaryls are numbered according to standard chemical nomenclature.

Without limitation, bicyclic heteroaryls include indolizyl, indolyl, isoindolyl, 3H-indolyl, indolinyl, benzo[b]furyl, benzo[b]thiophenyl, quinolinyl, isoquinolinyl, indolizyl, isoindolyl, indolyl, benzo[b]furyl, bexo[b]thiophenyl, indazolyl, benzimidazyl, benzthiazolyl, purinyl, 4H-quinolizyl, quinolyl, isoquinolyl, cinnolyl, phthalazyl, quinazolyl, quinoxalyl, 1,8-naphthyridyl, or pteridyl. Bicyclic heteroaryls are numbered according to standard chemical nomenclature.

The heteroaryl is optionally substituted with one or more substituents as is set forth below.

A "heteroarylalkyl" group, as used herein, refers to an alkyl group (e.g., a $C_1$ to $C_4$ alkyl group) that is substituted with a heteroaryl group. Both "alkyl" and "heteroaryl" have been defined above. A heteroarylalkyl is optionally substituted with one or more substituents as is set forth below.

As used herein, an "acyl" group refers to a formyl group or $R^X$—C(O)— (such as -alkyl-C(O)—, also referred to as "alkylcarbonyl") where "alkyl" has been defined previously.

As used herein, the term "acyloxy" includes straight-chain acyloxy, branched-chain acyloxy, cycloacyloxy, cyclic acyloxy, heteroatom-unsubstituted acyloxy, heteroatom-substituted acyloxy, heteroatom-unsubstituted $C_n$-acyloxy, heteroatom-substituted $C_n$-acyloxy, alkylcarbonyloxy, arylcarbonyloxy, alkoxycarbonyloxy, aryloxycarbonyloxy, and carboxylate groups.

As used herein, an "alkoxy" group refers to an alkyl —O— group where "alkyl" has been defined previously.

As used herein, a "carboxy" group refers to —COOH, —COOR$^X$, —OC(O)H, —OC(O)R$^X$ when used as a terminal group; or —OC(O)— or —C(O)O— when used as an internal group.

As used herein, "alkoxycarbonyl" means —COOR, where R is alkyl as defined above, e.g., methoxycarbonyl, ethoxycarbonyl, and the like.

As used herein, a "sulfonate" group refers to R—S(O)$_2$—O$^-$ when used terminally. Sulfonates are the conjugate base of sulfonic acids with the general formula R—S(O)$_2$—OH.

As used herein, a "sulfonic acid" group refers to R—S(O)$_2$—OH when used terminally.

As used herein, a "sulfinyl" group refers to —S(O)—R$^X$ when used terminally or —S(O)— when used internally.

As used herein, a "sulfonyl" group refers to —S(O)$_2$—R$^X$ when used terminally or —S(O)$_2$— when used internally.

The term "alkylthio" includes straight-chain alkylthio, branched-chain alkylthio, cycloalkylthio, cyclic alkylthio, heteroatom-unsubstituted alkylthio, heteroatom-substituted alkylthio, heteroatom-unsubstituted $C_n$-alkylthio, and heteroatom-substituted $C_n$-alkylthio. In certain embodiments, lower alkylthios are contemplated.

As used herein, the term "amine" or "amino" includes compounds where a nitrogen atom is covalently bonded to at least one carbon or heteroatom. The term "amine" or "amino" also includes —NH$_2$ and also includes substituted moieties. The term includes "alkyl amino" which comprises groups and compounds wherein the nitrogen is bound to at least one additional alkyl group. The term includes "dialkyl amino" groups wherein the nitrogen atom is bound to at least two additional independently selected alkyl groups. The term includes "arylamino" and "diarylamino" groups wherein the nitrogen is bound to at least one or two independently selected aryl groups, respectively.

The term "haloalkyl" refers to alkyl groups substituted with from one up to the maximum possible number of halogen atoms. The terms "haloalkoxy" and "halothioalkyl" refer to alkoxy and thioalkyl groups substituted with from one up to five halogen atoms.

The phrase "optionally substituted" is used interchangeably with the phrase "substituted or unsubstituted." As described herein, compounds of the present disclosure can optionally be substituted with one or more substituents, such as are illustrated generally above, or as exemplified by particular classes, subclasses, and species of the present disclosure. As described herein any of the above moieties or those introduced below can be optionally substituted with one or more substituents described herein. Each substituent of a specific group is further optionally substituted with one to three of halogen, cyano, oxoalkoxy, hydroxy, amino, nitro, aryl, haloalkyl, and alkyl. For instance, an alkyl group can be substituted with alkyl sulfonyl and the alkyl sulfonyl can be optionally substituted with one to three of halogen, cyano, oxoalkoxy, hydroxy, amino, nitro, aryl, haloalkyl, and alkyl.

In general, the term "substituted," whether preceded by the term "optionally" or not, refers to the replacement of hydrogen radicals in a given structure with the radical of a specified substituent. Specific substituents are described above in the definitions and below in the description of compounds and examples thereof. Unless otherwise indicated, an optionally substituted group can have a substituent at each substitutable position of the group, and when more than one position in any given structure can be substituted with more than one substituent selected from a specified group, the substituent can be either the same or different at every position. A ring substituent, such as a hetero cycloalkyl, can be bound to another ring, such as a cycloalkyl, to form a spiro-bicyclic ring system, e.g., both rings share one common atom. As one of ordinary skill in the art will recognize, combinations of substituents envisioned by this present disclosure are those combinations that result in the formation of stable or chemically feasible compounds.

Modifications or derivatives of the compounds disclosed throughout this specification are contemplated as being useful with the methods and compositions of the present disclosure. Derivatives may be prepared and the properties of such derivatives may be assayed for their desired properties by any method known to those of skill in the art. In certain aspects, "derivative" refers to a chemically modified compound that still retains the desired effects of the compound prior to the chemical modification.

The present invention comprises novel organometallic molecules to be formulated into organometallic photoresist compositions that are useful in lithographic processes, especially when DUV or EUV radiation is used. In carrying out the present invention, conventional materials and processing techniques can be employed and, hence, such conventional aspects are not set forth herein in detail. For example, the selection of suitable solvents, photosensitizers, pigments, fillers, antistatic agents, flame retardants, defoaming agents, light stabilizers, and antioxidants is conducted in a conventional manner.

In accordance with the purpose of the present invention as embodied and broadly described herein, the invention provides in a first aspect an organometallic molecule for an organometallic photoresist for DUV or EUV lithography. The organometallic molecule comprises or consists of at least one metal element M and at least one polymerizable group R. The metal element M represents an element selected from the group consisting of Bi, Sb, and mixtures thereof. The metal element has an oxidation state of 3+.

It is crucial to understand and to appreciate the microscopic mechanisms that cause photon absorption events in the EUV (in contrast to in the DUV) to devise materials that can be used to increase the sensitivity of photoresists for EUV lithography:

The DUV (193 nm, 6 eV) photon absorption is determined by the molecular orbitals of the photoresist material. The absorbed photons can directly and selectively cause resonant electronic transitions in the photoresist material. The sensitivity of photoresists for DUV lithography can be increased by adjusting the molecular structure of the photoresist material.

The EUV (13.5 nm, 92 eV, soft X-ray) photon absorption, on the other hand, is determined by the atomic composition of the photoresist material, i.e., the molecular structure is not relevant. FIG. 1 displays the photon absorption cross-section $u_a$ at 92 eV of all naturally occurring elements. The absorption of photons in a layer of thickness d is given by $1-\exp(-n \mu_a d)$, where n is the number of atoms per unit volume in the layer. To increase the photoresists' 92-eV-photon absorption cross-section, elements that have a large absorption cross-section at this photon energy must be added to the photoresist composition. For example, the elements In, Sn, Sb, Te, Bi, Sb, and Po have a large absorption cross-section for EUV photons. Material's toxicity and stability of organometallic compounds lead preferably to consider the elements Sn, Sb, and Bi.

It is further crucial to understand and to appreciate the microscopic mechanisms that cause polymerization events through controlled/living radical polymerization (in contrast to though conventional free-radical polymerization) to devise materials that can be used to increase the sensitivity, while maintaining resolution or pattern quality, of photoresists for DUV or EUV lithography.

In conventional free-radical polymerization, upon ultraviolet exposure, i.e., DUV exposure or EUV exposure alike, a molecule's bond dissociates and subsequently an uncontrolled cascade of polymerization reactions occurs. In more detail: Upon ultraviolet exposure, homolytic bond cleavage of an excited molecule generates free radicals. These free radicals undergo thermal propagation reactions in the presence of suitable monomers to yield a polymer. Since the free radicals are not instantly and reversibly consumed in the polymerization reaction, the free radicals propagate uncontrolled until eventually terminated via a bi-radical reaction. The propagation and termination reactions can occur in ultraviolet exposed or unexposed areas. When conventional free-radical polymerization is deployed in photoresists, this generally results in a deteriorated resolution or pattern quality.

On the other hand, in controlled/living radical polymerization, upon ultraviolet exposure, i.e., DUV exposure or EUV exposure alike, a molecule's bond dissociates and subsequently a controlled polymerization reaction occurs. In more detail: The basic concept of controlled/living radical polymerization is the reversible activation of a dormant molecule to the propagating radical.

Figure 2:
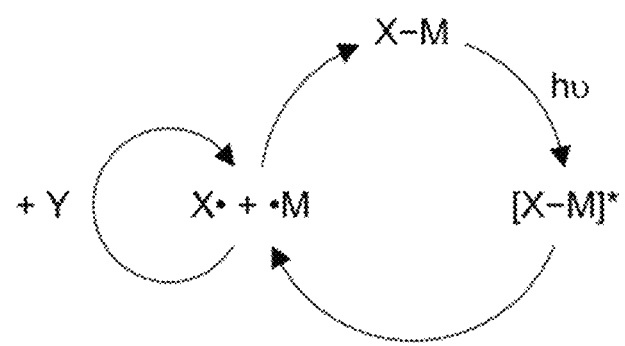
FIG. 2 depicts the general mechanism of controlled/living radical polymerization.
Figure 3:
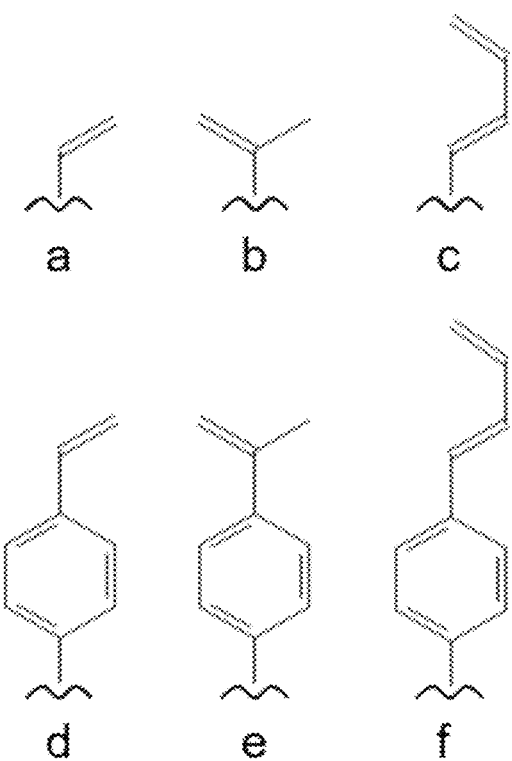
FIG. 3 shows preferred examples of polymerizable groups R according to the present invention: (a) vinyl, (b) isopropenyl, (c) 1,3-butadienyl, (d) styrene, (e) alpha-methylstyrene, and (f) vinylstyrene.
Figure 4:
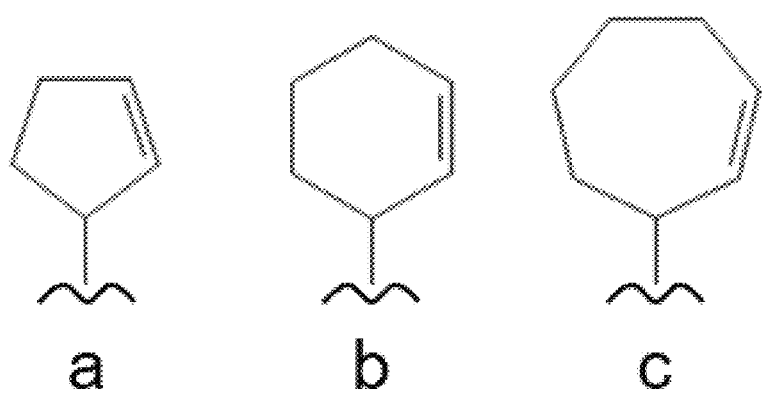
FIG. 4 shows preferred examples of polymerizable groups R according to the present invention: (a) cyclopent-2-enyl, (b) cyclohex-2-enyl, and (c) cyclohept-2-enyl.
Figure 5:
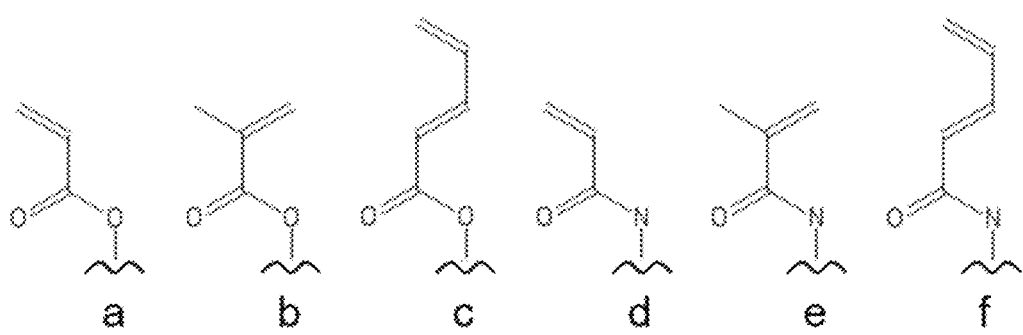
FIG. 5 shows preferred examples of polymerizable groups R according to the present invention: (a) acrylate, (b) methacrylate, (c) 2,4-pentadienoate, (d) acrylamide, (e) methacrylamide, and (f) 2,4-pentadienamide.
Figure 6:
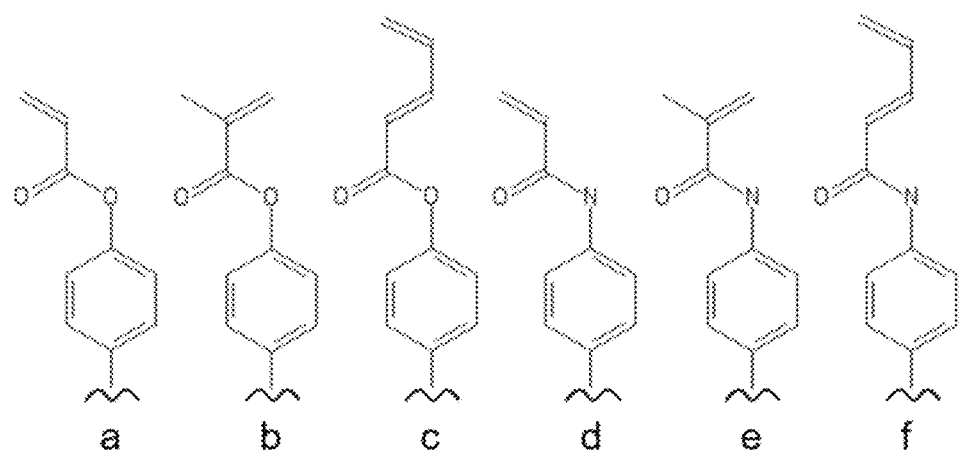
FIG. 6 shows preferred examples of polymerizable groups R according to the present invention: (a) phenylacrylate, (b) phenylmethacrylate, (c) phenyl-2,4-pentadienoate, (d) phenylacrylamide, (e) phenylmethacrylamide, and (f) phenyl-2,4-pentadienamide.
Figure 7:
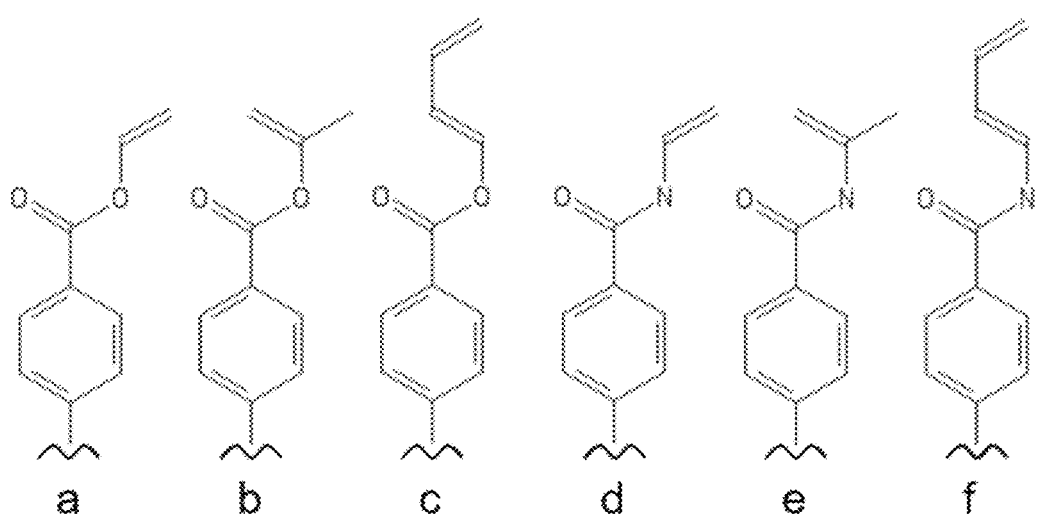
FIG. 7 shows preferred examples of polymerizable groups R according to the present invention: (a) vinylbenzoate, (b) isopropenylbenzoate, (c) butadienylbenzoate, (d) N-vinylbenzamide, (e) N-isopropenylbenzamide, and (f) N-butadienylbenzamide.

The general mechanism or principle of controlled/living radical polymerization is illustrated in FIG. 2. A dormant molecule X-M acts as initiator and as reversible terminator. X and M generally represent an organic group and a metal element species, respectively. Upon ultraviolet exposure, homolytic bond cleavage of the excited initiator [X-M]* generates the radicals X· and M·. The radical X· undergoes a thermal propagation reaction in the presence of a suitable monomer Y and, subsequently, a termination reaction with M· to form the (new) dormant molecule X'-M.

These reactions can occur in ultraviolet exposed areas only, i.e., when in the context of the present invention controlled/living radical polymerization is deployed in photoresists, this generally results in a maintained resolution or pattern quality.

The elements Bi or Sb in their lowest stable oxidation state 3+ have the property of causing a controlled/living radical polymerization upon ultraviolet exposure.

Regarding the polymerization events upon EUV exposure (in contrast to upon DUV exposure), it was found out that in EUV lithography the absorbed photon ionizes an atom in the photoresist. The photoelectron (~80 eV) subsequently causes a cascade of nonradiative processes; the fluorescence yield is negligible. Inelastic scattering from the valance electrons is the major loss mechanism for incident electrons at this energy range. The electron's inelastic scattering mean-free-path in the order of 1 Å at 80 eV to 10 Å at 10 eV. The lower-energy electrons (<10 eV) cause electronic transitions in the molecules, resulting in the homolytic bond cleavage of the excited molecules.

In a preferred variant, the present invention relates to an organometallic molecule for organometallic photoresists for DUV or EUV lithography represented by the general formula (I):

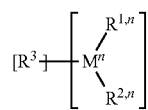

wherein
M represents a metal element selected from the group consisting of Bi, Sb, and mixtures thereof, and having an oxidation state of 3+;
at least one R group represents a polymerizable group;
the remaining R group(s) represent a non-polymerizable group; and
n is an integer in a range from 1 to the maximum number of hydrogen atoms of the $R^3$ group.

The organometallic molecule of the general formula (I) according to the present invention is characterized in that it comprises a metal element M which is selected from the group consisting of Bi, Sb, and mixtures thereof. The metal elements Bi and Sb have a high absorption cross-section for photons in the EUV, i.e., have for 92 eV photons an absorptions cross section of at least $1 \times 10^7 \cdot cm_2/mol$, and are, thus especially suited for EUV lithography. Additionally, the metal elements Bi and Sb in their 3+ oxidation state, have the property to cause upon DUV or EUV exposure a controlled/living radical polymerization, i.e., a polymerization through a reversible activation of a dormant species to a propagating radical and not a conventional free-radical polymerization, i.e., a polymerization through an uncontrolled cascade of propagating radical reactions. Thus, the organometallic molecule of the general formula (I) comprises the metal element Bi(III) and/or Sb(III).

Depending on the number "n" in the general formula (I), the metal elements M in one organometallic molecule according to the present invention can be either identical or can be different. An organometallic molecule with n>1, can have either two or more identical metal atoms, i.e., $M^1$ and $M^2$, etc., are Bi(III) atoms or $M^1$ and $M^2$, etc., are Sb(III) atoms, or alternatively, can have a combination of Bi(III) atoms and Sb(III) atoms, i.e., $M^1$=Bi(III) atom and $M^2$=Sb(III) atom, or $M^1$=Sb(III) atom and $M^2$=Bi(III) atom, etc. For ease of synthesizing the organometallic molecule, however, it is preferred to have identical metal elements M in one organometallic molecule.

Organometallic molecules comprising a metal element Bi or Sb in a different oxidation state than 3+, for example, Bi(V) or Sb(V), or organometallic molecules comprising a metal element different from Bi or Sb and having an oxidation state greater than 2+, for example, Sn(IV) or Te(IV), do not have the property of causing a controlled/living radical polymerization upon DUV or EUV exposure. The reason for this is believed to be related to the kinetics of the dormant molecule; Bi, Sb, Sn, and Te in their high oxidation states are strong oxidants which cause parasitic reactions that prevent controlled/living radical polymerization.

The organometallic molecule of the general formula (I) according to the present invention is characterized in that it comprises at least one polymerizable R group. The term "at least one polymerizable R group" in the context of the present invention means that the organometallic molecule includes either one polymerizable R group or includes two, three, four, or even more polymerizable R groups, which can be either identical or different. For ease of synthesizing the organometallic molecule, however, it is preferred to have identical polymerizable groups in one organometallic molecule.

The term "polymerizable group" in the context of the present invention means any reactive organic group comprising a functional group that undergoes or is subject to polymerization in order to form a polymer chain or three-dimensional polymer networks.

In chemical compounds, polymerization can occur via a variety of reaction mechanisms that vary in complexity due to the functional groups present in the polymerizable group and their inherent steric effects.

Most photopolymerization reactions are chain-growth polymerizations which are initiated by the absorption of visible or ultraviolet light. The light may be absorbed either directly by the reactant monomer (direct photopolymerization), or else by a photosensitizer which absorbs the light and then transfers energy to the monomer. In general, only the initiation step differs from that of the ordinary thermal polymerization of the same monomer; subsequent propagation, termination and chain transfer steps are unchanged. In step-growth photopolymerization, absorption of light triggers an addition (or condensation) reaction between two comonomers that do not react without light.

In chain-growth (or chain) polymerization, the only chain-extension reaction step is the addition of a monomer to a growing chain with an active center such as a free radical, cation or anion. Once the growth of a chain is initiated by formation of an active center, chain propagation is usually rapid by addition of a sequence of monomers. Long chains are formed from the beginning of the reaction.

Chain-growth polymerization (or addition polymerization) involves the linking together of unsaturated monomers, especially containing carbon-carbon double bonds. The pi-bond is lost by formation of a new sigma bond. Chain-growth polymerization is involved in the manufacture of polymers such as polyethylene, polypropylene, polyvinyl chloride (PVC), acrylate, etc. In these cases, the alkenes $RCH=CH_2$ are converted to high molecular weight alkanes $(-RCHCH_2-)_n$ (R=H, $CH_3$, Cl, $CO_2CH_3$).

Other forms of chain growth polymerization include cationic addition polymerization and anionic addition polymerization.

A special case of chain-growth polymerization leads to living polymerization. Ziegler-Natta polymerization allows considerable control of polymer branching.

In a preferred variant, the polymerizable group of the organometallic molecule according to the general formula (I) is a monomer group, that can react and polymerize upon ultraviolet exposure initiation with an identical or different monomer group to form a homopolymer or a copolymer.

Preferably, the polymerizable group of the organometallic molecule according to the general formula (I) is an unsaturated monomer comprising at least one functional group which is selected from the group consisting of an alkenyl group or an alkynyl group. In a more preferred variant, the polymerizable group of the organometallic molecule according to the general formula (I) is a linear, a branched, a cyclic, or a heterocyclic unsaturated monomer having an alkenyl group or an alkynyl group.

Preferably, the unsaturated monomer comprising an alkenyl group or an alkynyl group has 2 to 30 carbon atoms, more preferred 2 to 24, still more preferred 2 to 18, and most preferred 2 to 12 carbon atoms.

As used herein, an "alkenyl" group refers to an aliphatic carbon group that contains from 2 to 30 (preferably 2 to 18, more preferred 2 to 8, still more preferred 2 to 6, and most preferred 2 to 4) carbon atoms and at least one double bond. Like an alkyl group, an alkenyl group can be straight, branched, or cyclic, or any combination thereof.

As used herein, an "alkynyl" group refers to an aliphatic carbon group that contains from 2 to 30 (preferably 2 to 18, more preferred 2 to 8, still more preferred 2 to 6, and most preferred 2 to 4) carbon atoms and has at least one triple bond. Like an alkyl group, an alkynyl group can be straight, branched, or cyclic, or any combination thereof.

The remaining R group(s) in the organometallic molecule according to the general formula (I) represent a non-polymerizable group.

The term "non-polymerizable group" in the context of the present invention means any organic group, which does not undergo nor is subject to polymerization.

In the organometallic molecule according to the general formula (I), the number "n" is an integer in a range from 1 to the maximum number of hydrogen atoms of the $R^3$ group.

The "maximum number of n" in the context of the present invention depends on the number of covalent bonds that the $R^3$ group in the general formula (I) can form, the number of which is equivalent to the number of hydrogen atoms in the $R^3$ group that can be substituted by the $(-M''(-R^{1,''})(-R^{2,''}))$ group of the general formula (I). For example: if the $R^3$ group is a methyl group, the carbon of the methyl group contains four electrons in its outer shell; therefore, it can form four covalent bonds with other atoms or molecules. Hence, n can be an integer in a range from 1 to 4, i.e., n can be 1, 2, 3, or 4. If the $R^3$ group is a phenyl group, n can be an integer in a range from 1 to 6, since phenyl can form six covalent bonds with other atoms or molecules, i.e., n can be 1, 2, 3, 4, 5, or 6. If the $R^3$ group is a naphthyl group, n can be an integer in a range from 1 to 8, since naphthyl can form eight covalent bonds with other atoms or molecules, i.e., n can be 1, 2, 3, 4, 5, 6, 7, or 8.

In a preferred variant, in the organometallic molecule of the general formula (I), n is an integer in a range from 1 to 12, more preferred an integer in a range from 1 to 6 and most preferred an integer in a range from 1 to 3. Especially preferred is an organometallic molecule of the general formula (I) with n is 2 or 3.

In an alternative variant, the $R^3$ group in the general formula (I) can bear one or more substituent(s). In such a case, the maximum number of covalent bonds that the $R^3$ group can form, and that can be substituted by the $(-M''(-R^{1,''})(-R^{2,''}))$ group of the general formula (I) is reduced by the number of substituents of the $R^3$ group. For example: if the $R^3$ group is a methyl group which is substituted by one substituent, the carbon of the methyl group can form three further covalent bonds with other atoms or molecules. Hence, n can be an integer in a range from 1 to 3, i.e., n can be 1, 2, or 3. If the $R^3$ group is a phenyl group and the phenyl group is substituted by two substituents, the phenyl can form four further covalent bonds with other atoms or molecules, i.e., n can be 1, 2, 3, or 4, etc.

In a further preferred variant, the organometallic molecule according to the present invention has one of the general formulae (a), (b), (c), (d), (e), or (f):

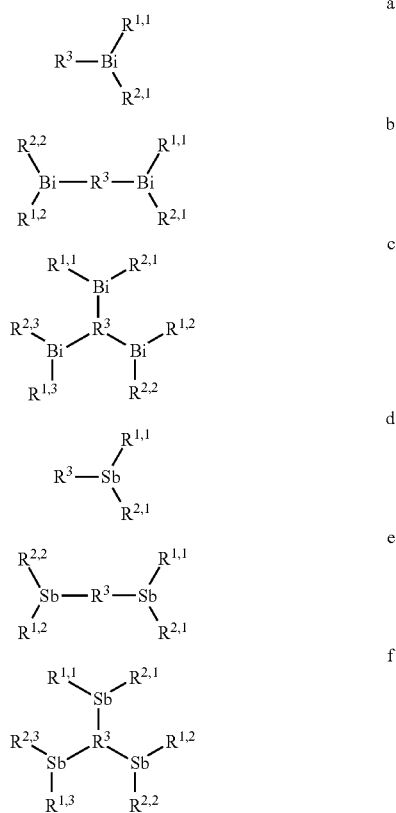

wherein
at least one R group represents a polymerizable group, as defined above; and
the remaining R group(s) represent a non-polymerizable group, as defined above.

In the preferred variants of the organometallic molecules, in the general formula (a) n=1 and $M^1$=Bi(III); in the general formula (b) n=2 and $M^1$=$M^2$=Bi(III); in the general formula (c) n=3 and $M^1$=$M^2$=$M^3$=Bi(III); in the general formula (d) n=1 and $M^1$=Sb(III); in the general formula (e) n=2 and $M^1$=$M^2$=Sb(III); and in the general formula (f) n=3 and $M^1$=$M^2$=$M^3$=Sb(III).

For controlled/living radical polymerization of organometallic molecules comprising Bi(III) and/or Sb(III) to occur, upon DUV or EUV exposure, it must be the metal-R bond that dissociates, such that a Bi or Sb radical species is formed. Therefore the organometallic molecule composition is selected such that the organometallic molecule's weakest bond is a Bi(III)-R or Sb(III)-R bond. Examples of "not allowed" bonds in the organometallic molecule are, for example, C—I, C—S—S—C, and C—N=N—C bonds, because then free radicals that interfere with the controlled/living radical polymerization would be formed.

In a preferred variant of the organometallic molecule according to the present invention, the polymerizable group is selected from the group consisting of vinyl or ethenyl, isopropenyl, 1,3-butadienyl, styrene, alpha-methylstyrene, vinylstyrene, cyclopentenyl, cyclohexenyl, cycloheptenyl, acrylate, methacrylate, 2,4-pentadienoate, acrylamide, methacrylamide, 2,4-pentadienamide, phenylacrylate, phenylmethacrylate, phenyl-2,4-pentadienoate, phenylacrylamide, phenylmethacrylamide, phenyl-2,4-pentadienamide, vinylbenzoate, isopropenylbenzoate, butadienylbenzoate, N-vinylbenzamide, N-isopropenylbenzamide, N-butadienylbenzamide, and derivatives thereof.

The above specified polymerizable groups of the organometallic molecule are shown in FIGS. 3 to 7.

In a particularly preferred variant of the organometallic molecule according to the present invention, the polymerizable group is selected from the group consisting of vinyl or ethenyl, isopropenyl, 1,3-butadienyl, styrene, alpha-methylstyrene, vinylstyrene, cyclopentenyl, cyclohexenyl, cycloheptenyl, acrylamide, methacrylamide, 2,4-pentadienamide, phenylacrylamide, phenylmethacrylamide, phenyl-2,4-pentadienamide, vinylbenzoate, isopropenylbenzoate, butadienylbenzoate, N-vinylbenzamide, N-isopropenylbenzamide, N-butadienylbenzamide, and derivatives thereof, because of material's toxicity and chemical waste consideration.

In a most preferred variant of the organometallic molecule according to the present invention, the polymerizable group comprises an aryl group, due to its delocalized electrons. Especially preferred is a phenyl group, having the advantage of extending the wavelength range that such organometallic molecule will absorb light into the DUV.

The polymerizable group also comprises derivatives or structure analog of the above specified compounds. A derivative or a structure analogue is a compound having a structure similar to that of another compound but differing from it in respect to a certain component. It can differ in one or more atoms, functional groups, or substructures, which are replaced with other atoms, groups, or substructures.

In a preferred variant, the derivatives or structure analogues of the polymerizable group encompass such compounds, substituted with one or more substituent(s). In a preferred variant, the polymerizable group compound(s) include(s) at least one substituent selected from the group consisting of halogen, hydroxyl, alkyl, alkoxy, aryl, aryloxy, nitro, and cyano.

In a preferred variant of the organometallic molecule according to the present invention, the non-polymerizable group is selected from the group consisting of linear or branched or a cyclic unsubstituted or substituted alkyl group having 1 to 20 carbon atoms; an unsubstituted or substituted aryl group having 3 to 30 carbon atoms; an unsubstituted or an substituted unsaturated or a saturated heterocyclic group having a 3 to 30 membered ring; and derivatives thereof.

In a particularly preferred variant of the organometallic molecule according to the present invention, the linear or the branched alkyl group is selected from the group consisting of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, icosayl, and derivatives thereof; and/or the cyclic alkyl group is selected from the group consisting of cyclopentane, cyclohexane, cycloheptane, cyclooctane, and derivatives thereof; and/or the aryl group is selected from the group consisting of phenyl, naphthyl, anthracenyl, phenanthrenyl, and derivatives thereof; and/or the saturated or unsaturated heterocyclic group having one or two heteroatoms is selected from the group consisting of pyrrolidine, pyrrole, tetrahydrofuran, furan, tetrahydrothiophene, thiophene, imidazolidine, imidazole, oxazolidine, oxyzole, thiazolidine, thiazole, dioxolane, dithiolane, piperidine, pyridine, tetrahydropyran, pyran, thiane, thiopyran, diazinane, diazine, in particular pyridazin (1,2-diazin), pyrimidine (1,3-diazin) and pyrazin (1,4-diazin), morpholine, oxazine, thiomorpholine, thiazine, dioxane, dioxine, dithiane, dithiin, quinolone, isoquinoline, and derivatives thereof.

In a most preferred variant of the organometallic molecule according to the present invention, the non-polymerizable group is an unsubstituted or substituted aryl group, due to its delocalized electrons. Especially preferred is an unsubstituted or substituted phenyl group, having the advantage of extending the wavelength range that such organometallic molecule will absorb light into the DUV.

The non-polymerizable group also comprises derivatives or structure analog of the above specified compounds. A derivative or a structure analogue is a compound having a structure similar to that of another compound but differing from it in respect to a certain component. It can differ in one or more atoms, functional groups, or substructures, which are replaced with other atoms, groups, or substructures.

In a preferred variant, the derivatives or structure analogues encompass such compounds, substituted with one or more substituents. In a preferred variant, the polymerizable group compound(s) include(s) at least one substituent selected from the group consisting of halogen, hydroxyl, alkyl, alkoxy, aryl, aryloxy, nitro, and cyano.

In a particularly preferred variant, in the organometallic molecule according to the present invention all R groups are polymerizable groups. Controlled/living radical polymerization reactions scale with the product of radical concentration and polymerizable-unit concentration; it is therefore advantageous to have organobismuth(III) or organoantimony(III) molecules with a large number, i.e., a large concentration, of polymerizable units, resulting in a higher sensitivity.

Additionally, the polymerizable groups R in one organometallic molecule according to the present invention can be either identical or can be different. For ease of synthesizing the organometallic molecule, however, it is preferred to have identical polymerizable groups R in one organometallic molecule.

Figure 8:
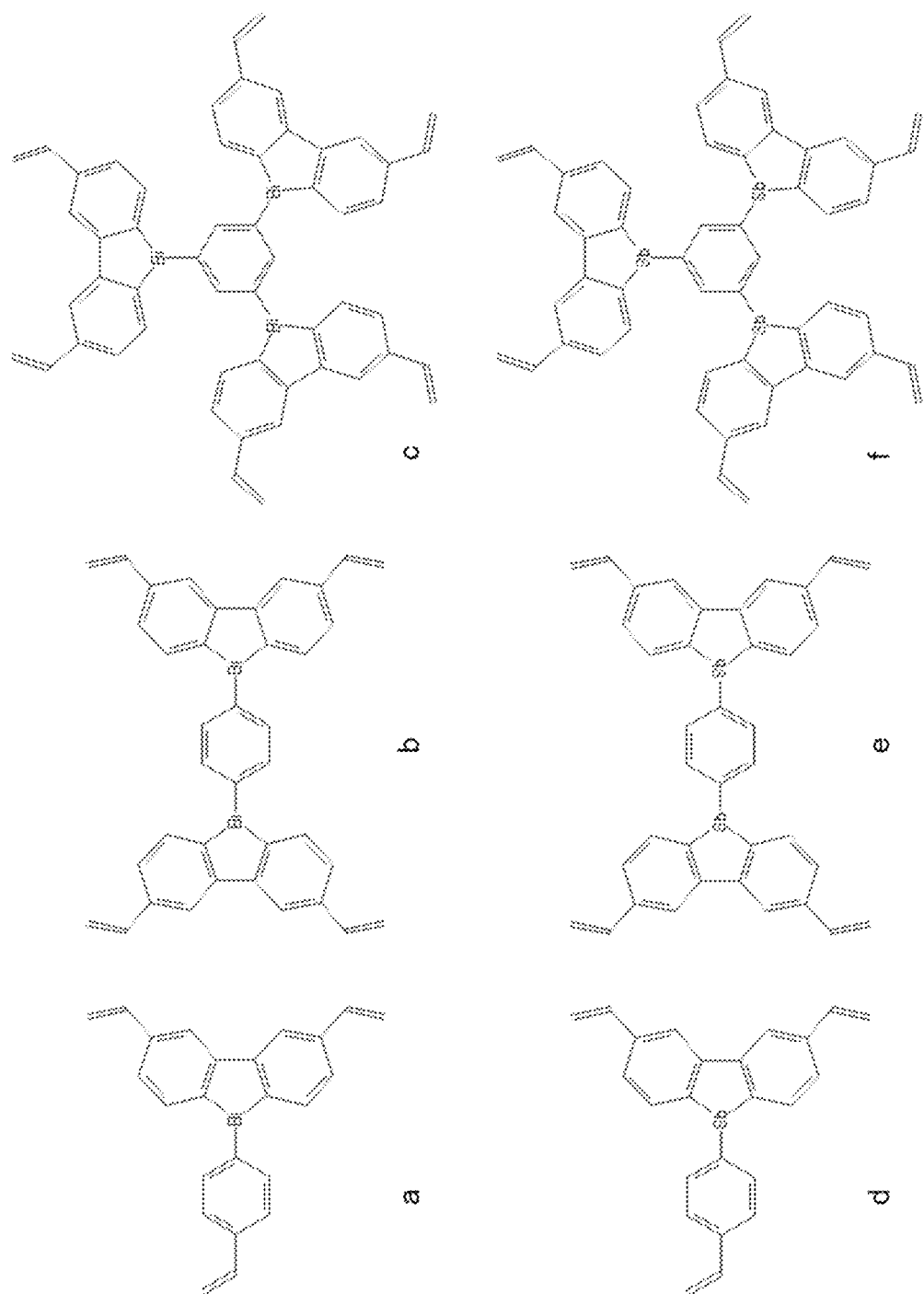
FIG. 8 shows preferred variants of organobismuth(III) and organoantimony(III) molecules according to the present invention comprising styrene groups: (a) 5-(4-ethenylphenyl)-2,8-diethenyl-dibenzobismole, (b) 1,4-bis(2,8-diethenyl-dibenzobismol-5-yl)benzene, (c) 1,3,5-tris(2,8-diethenyl-dibenzobismol-5-yl)benzene, (d) 5-(4-ethenylphenyl)-2,8-diethenyl-dibenzostibole, (e) 1,4-bis(2,8-diethenyl-dibenzostibol-5-yl)benzene, and (f) 1,3,5-tris(2,8-diethenyl-dibenzostibol-5-yl)benzene.
Figure 9:
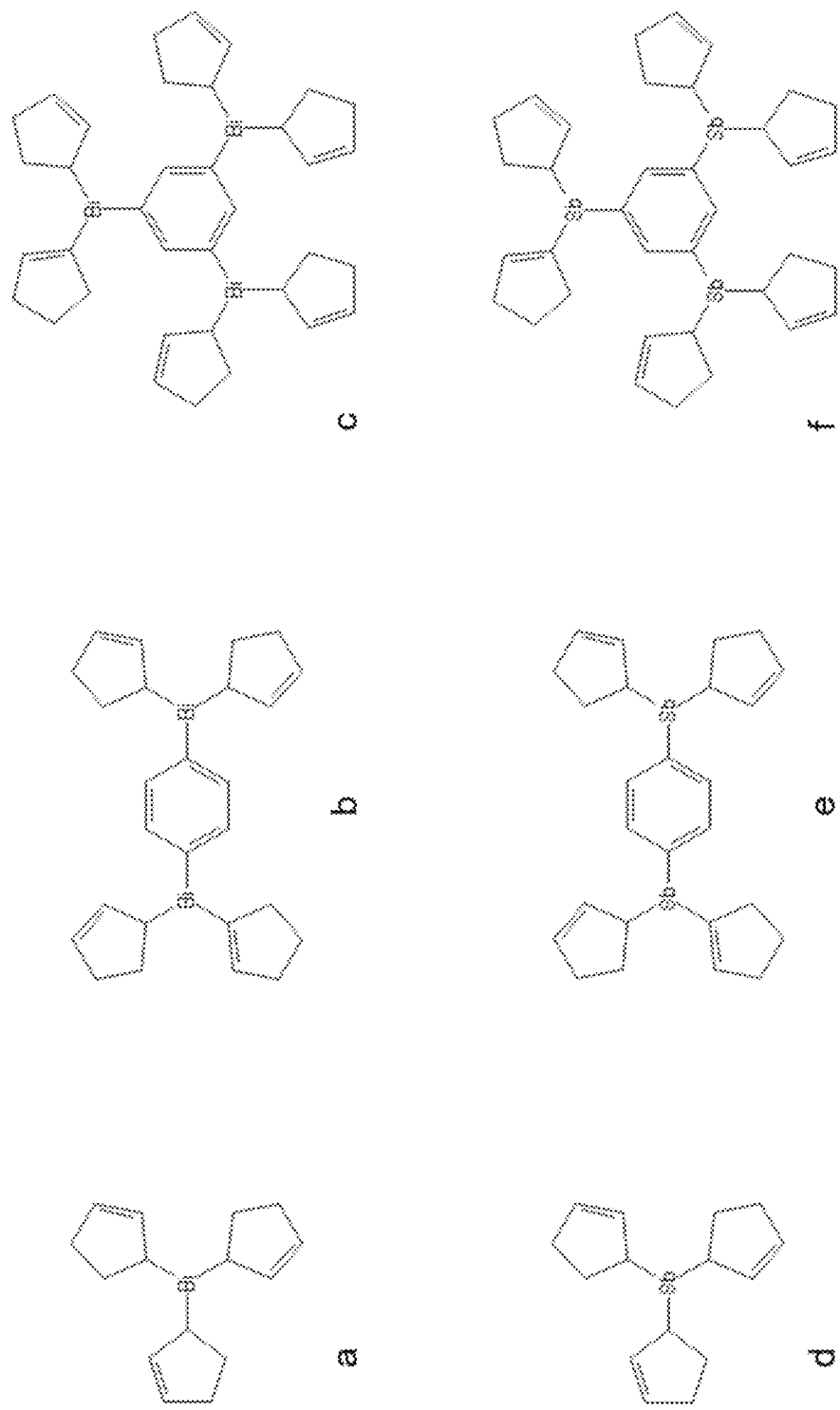
FIG. 9 shows preferred variants of organobismuth(III) and organoantimony(III) molecules according to the present invention comprising cyclopentenyl groups: (a) tris(cyclopent-2-enyl)bismuthane, (b) 1,4-bis(cyclopent-2-enyl)-bismuthanyl)benzene, (c) 1,3,5-tris(di(cyclopent-2-enyl)bismuthanyl)benzene, (d) tris(cyclopent-2-enyl)stibane, (e) 1,4-bis(di(cyclopent-2-enyl)stibanyl)benzene, and (f) 1,3,5-tris(di(cyclopent-2-enyl)stibanyl)benzene.
Figure 10:
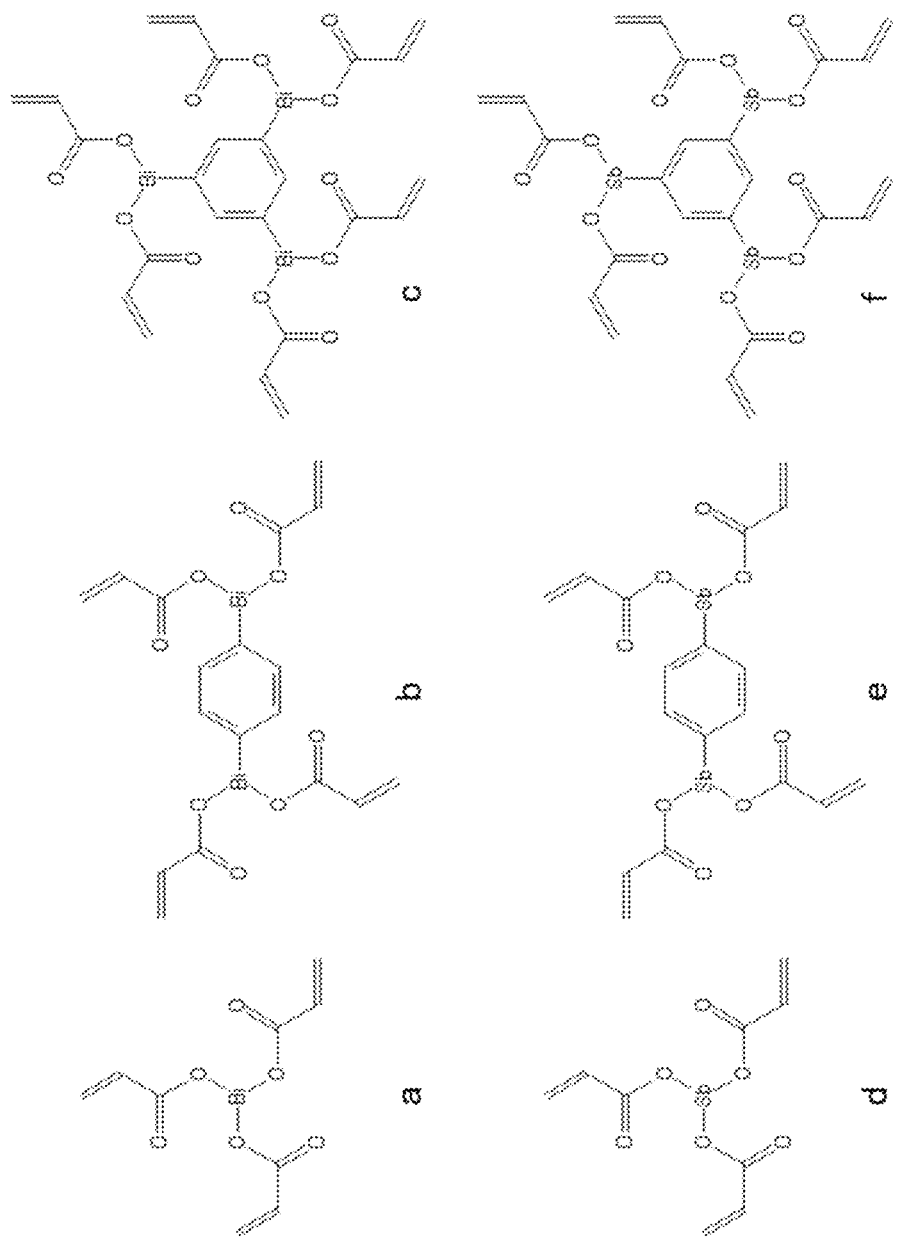
FIG. 10 shows preferred variants of organobismuth(III) and organoantimony(III) molecules according to the present invention comprising acrylate groups: (a) tris(prop-2-enoyloxy)bismuthane, (b) 1,4-bis(di(prop-2-enoyloxy)-bismuthanyl)benzene, (c) 1,3,5-tris(di(prop-2-enoyloxy)bismuthanyl)benzene, (d) tris(prop-2-enoyloxy)stibane, (e) 1,4-bis(di(prop-2-enoyloxy)stibanyl)benzene, and (f) 1,3,5-tris(di(prop-2-enoyloxy)stibanyl)benzene.
Figure 11:
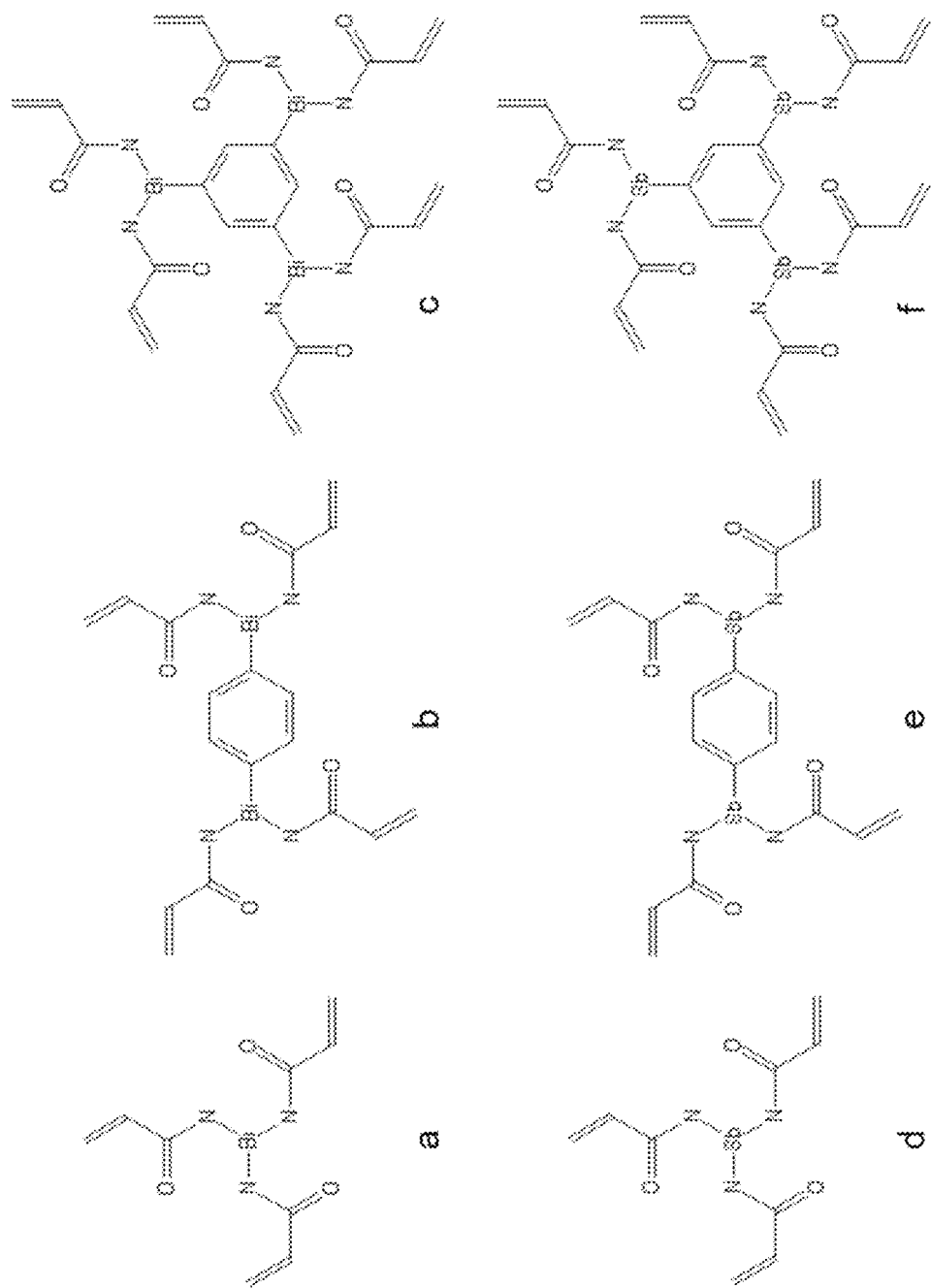
FIG. 11 shows preferred variants of organobismuth(III) and organoantimony(III) molecules according to the present invention comprising acrylamide groups: (a) tris(prop-2-enoylamino)bismuthane, (b) 1,4-bis(di(prop-2-enoylamino)bismuthanyl)benzene, (c) 1,3,5-tris(prop-2-enoylamino)-bismuthanyl)-benzene, (d) tris(prop-2-enoylamino)stibane, (e) 1,4-bis(di(prop-2-enoylamino)-stibanyl)benzene, and (f) 1,3,5-tris(di(prop-2-enoylamino)stibanyl)-benzene.
Figure 1:
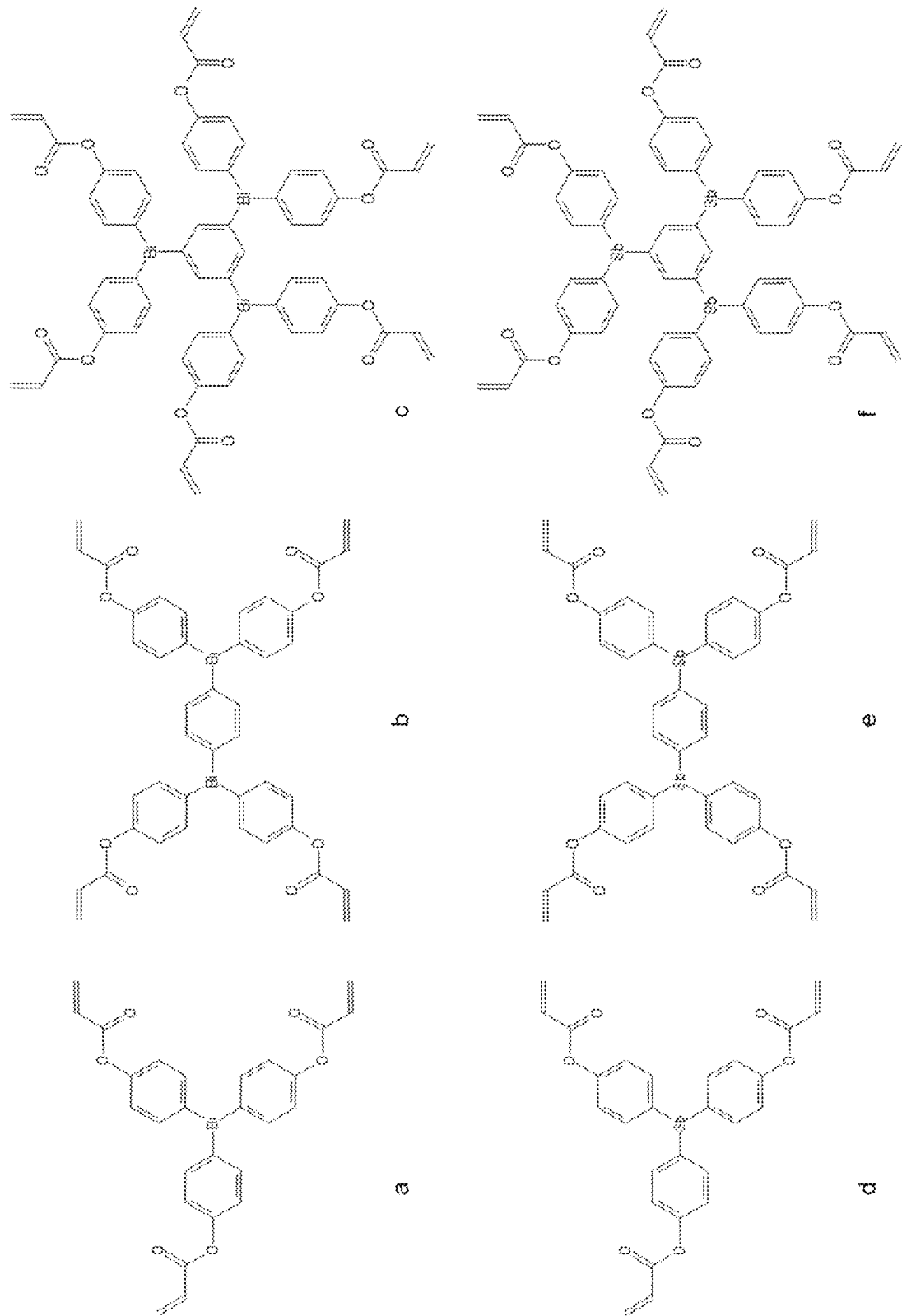
Figure 13:
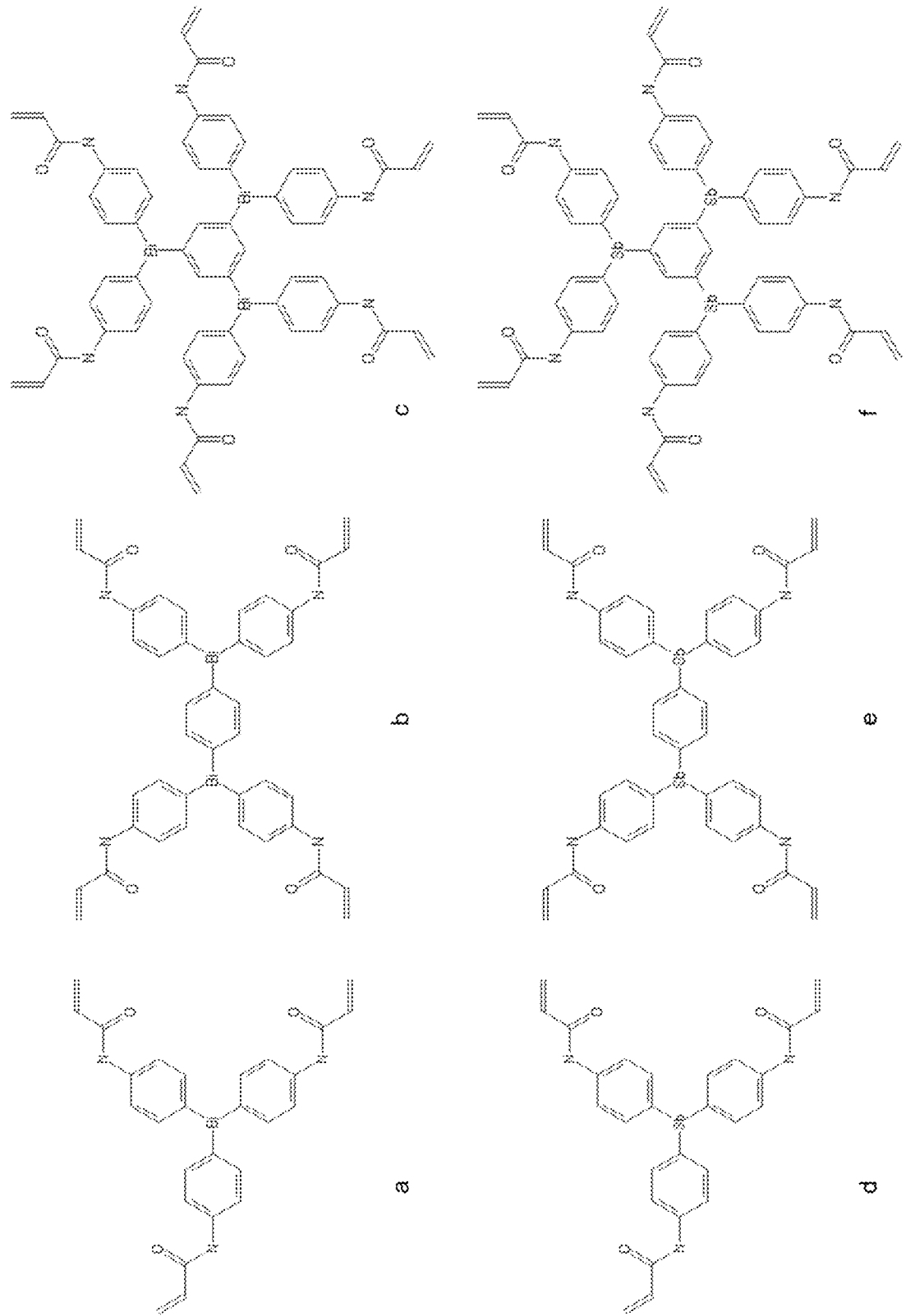
FIG. 13 shows preferred variants of organobismuth(III) and organoantimony(III) molecules according to the present invention comprising phenylacrylamide groups: (a) tris(4-(prop-2-enoylamino)phenyl)bismuthane, (b) 1,4-bis(di(4-(prop-2-enoylamino)phenyl)bismuthanyl)benzene, (c) 1,3,5-tris(di(4-(prop-2-enoylamino)phenyl)bismuthanyl) benzene, (d) tris(4-(prop-2-enoylamino)phenyl)-stibane, (e) 1,4-bis(di(4-(prop-2-enoylamino)phenyl)stibanyl)benzene, and (f) 1,3,5-tris(di(4-(prop-2-enoylamino)phenyl)stibanyl) benzene.
Figure 14:
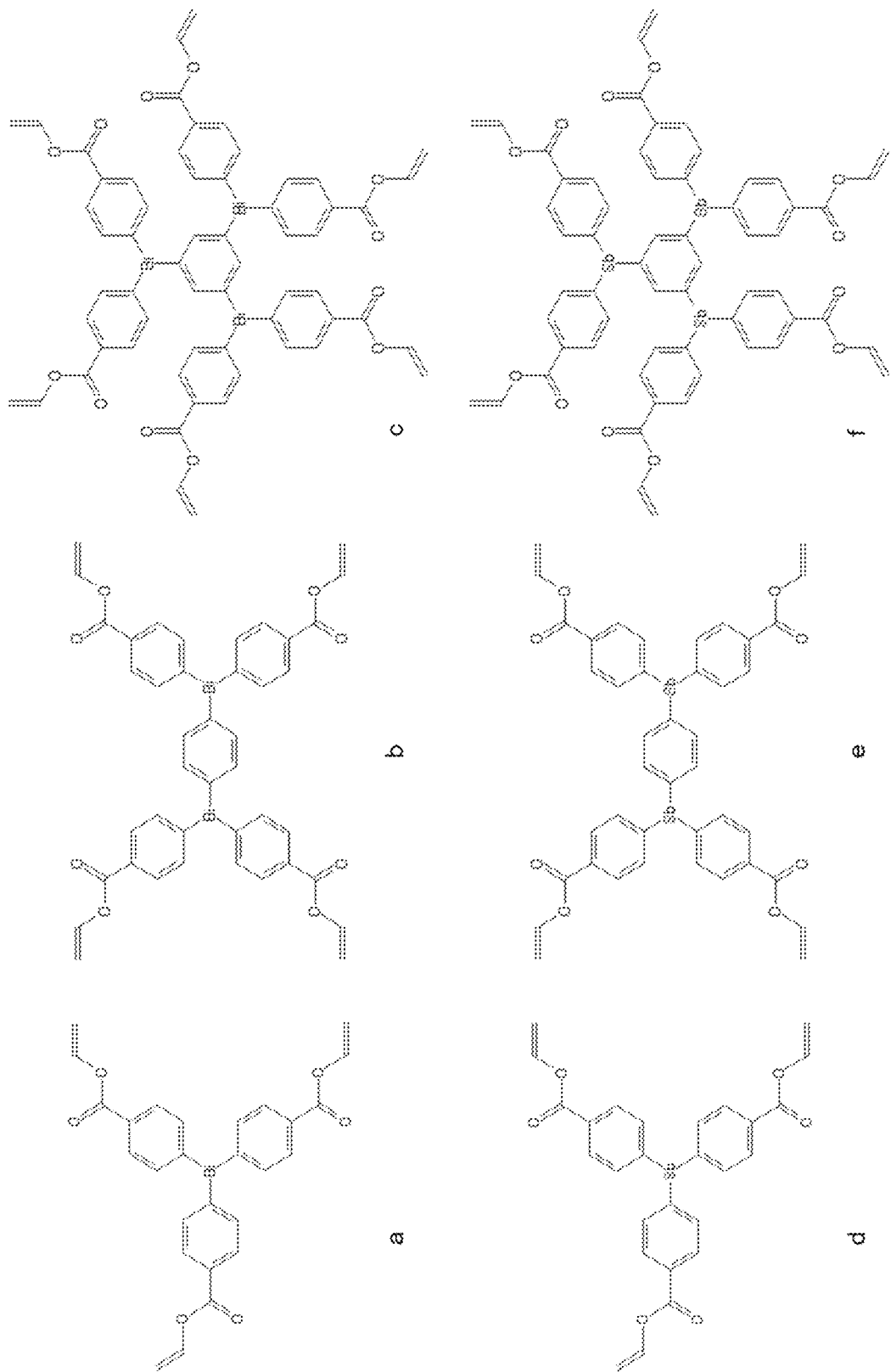
FIG. 14 shows preferred variants of organobismuth(III) and organoantimony(III) molecules according to the present invention comprising vinylbenzoate groups: (a) tris(4-(ethenoxycarbonyl)phenyl)bismuthane, (b) 1,4-bis(di(4-(ethenoxycarbonyl)phenyl)bismuthanyl)benzene, (c) 1,3,5-tris(di(4-(ethenoxycarbonyl)phenyl)bismuthanyl)benzene, (d) tris(4-(ethenoxycarbonyl)-phenyl)stibane, (e) 1,4-bis(di(4-(ethenoxycarbonyl)phenyl)stibanyl)benzene, and (f) 1,3,5-tris(di(4-(ethenoxycarbonyl)phenyl)stibanyl)benzene.
Figure 15:
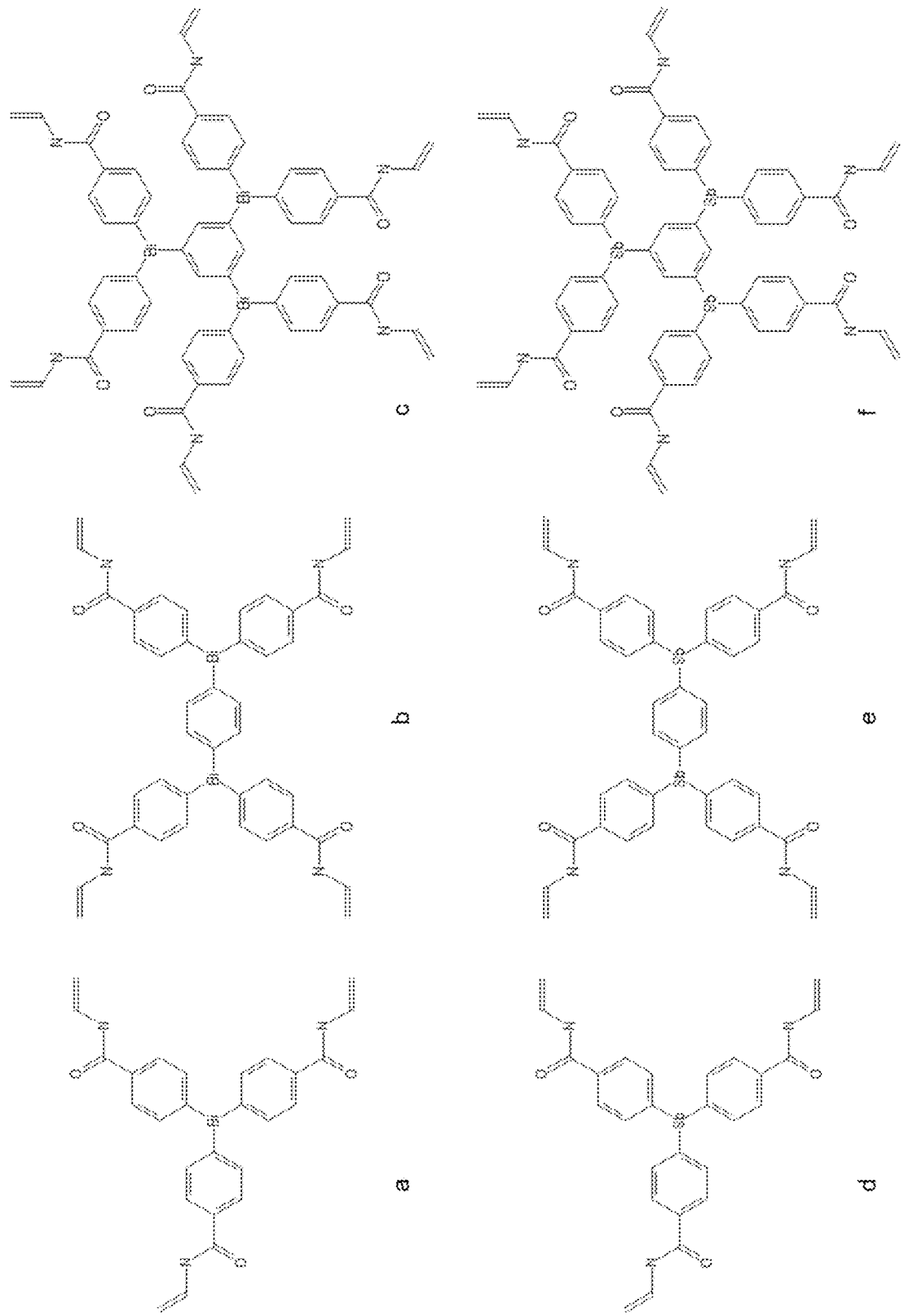
FIG. 15 shows preferred variants of organobismuth(III) and organoantimony(III) molecules according to the present invention comprising N-vinylbenzamide groups: (a) tris(4-(ethenylcarbamoyl)phenyl)bismuthane, (b) 1,4-bis(di(4-(ethenylcarbamoyl)phenyl)bismuthanyl)benzene, (c) 1,3,5-tris(di(4-(ethenylcarbamoyl)phenyl)bismuthanyl)benzene, (d) tris(4-(ethenylcarbamoyl)-phenyl)stibane, (e) 1,4-bis(di(4-(ethenylcarbamoyl)phenyl)stibanyl)benzene, and (f) 1,3,5-tris(di(4-(ethenylcarbamoyl)phenyl)stibanyl)benzene.

Preferred embodiments of organobismuth(III) or organoantimony(III) molecules for organometallic photoresists for DUV or EUV lithography according to this invention include:

organobismuth(III) and organoantimony(III) molecules comprising styrene groups as depicted in FIG. 8, namely (a) 5-(4-ethenylphenyl)-2,8-diethenyl-dibenzobismole, (b) 1,4-bis(2,8-diethenyl-dibenzobismol-5-yl)benzene, (c) 1,3,5-tris(2,8-diethenyl-dibenzobismol-5-yl)benzene, (d) 5-(4-ethenylphenyl)-2,8-diethenyl-dibenzostibole, (e) 1,4-bis(2,8-diethenyl-dibenzostibol-5-yl)benzene, and (f) 1,3,5-tris(2,8-diethenyl-dibenzostibol-5-yl)benzene;

organobismuth(III) and organoantimony(III) molecules comprising cyclopentenyl groups as depicted in FIG. 9, namely (a) tris(cyclopent-2-enyl)bismuthane, (b) 1,4-bis(cyclopent-2-enyl)-bismuthanyl)benzene, (c) 1,3,5-tris(di(cyclopent-2-enyl)bismuthanyl)benzene, (d) tris(cyclopent-2-enyl)stibane, (e) 1,4-bis(di(cyclopent-2-enyl)stibanyl)benzene, and (f) 1,3,5-tris(di(cyclopent-2-enyl)stibanyl)benzene;

organobismuth(III) and organoantimony(III) molecules comprising acrylate groups as depicted in FIG. 10, namely (a) tris(prop-2-enoyloxy)bismuthane, (b) 1,4-bis(di(prop-2-enoyloxy)bismuthanyl)benzene, (c) 1,3,5-tris(di(prop-2-enoyloxy)-bismuthanyl)benzene, (d) tris(prop-2-enoyloxy)stibane, (e) 1,4-bis(di(prop-2-enoyloxy)stibanyl)benzene, and (f) 1,3,5-tris(di(prop-2-enoyloxy)stibanyl)benzene;

organobismuth(III) and organoantimony(III) molecules comprising acrylamide groups as depicted in FIG. 11, namely (a) tris(prop-2-enoylamino)bismuthane, (b) 1,4-bis(di(prop-2-enoylamino)bismuthanyl)benzene, (c) 1,3,5-tris(prop-2-enoylamino)-bismuthanyl)benzene, (d) tris(prop-2-enoylamino)stibane, (e) 1,4-bis(di(prop-2-enoylamino)stibanyl)benzene, and (f) 1,3,5-tris(di(prop-2-enoylamino)-stibanyl)benzene;

organobismuth(III) and organoantimony(III) molecules comprising phenylacrylate groups as depicted in FIG. 12, namely (a) tris(4-(prop-2-enoyloxy)phenyl)bismuthane, (b) 1,4-bis(di(4-(prop-2-enoyloxy)phenyl)bismuthanyl)-benzene, (c) 1,3,5-tris(di(4-(prop-2-enoyloxy)phenyl)bismuthanyl)benzene, (d) tris(4-(prop-2-enoyloxy)phenyl)stibane, (e) 1,4-bis(di(4-(prop-2-enoyloxy)phenyl)stibanyl)-benzene, and (f) 1,3,5-tris(di(4-(prop-2-enoyloxy)phenyl)stibanyl)benzene;

organobismuth(III) and organoantimony(III) molecules comprising phenylacrylamide groups as depicted in FIG. 13, namely (a) tris(4-(prop-2-enoylamino)phenyl)bismuthane, (b) 1,4-bis(di(4-(prop-2-enoylamino)phenyl)-bismuthanyl)benzene, (c) 1,3,5-tris(di(4-(prop-2-enoylamino)phenyl)bismuthanyl)-benzene, (d) tris(4-(prop-2-enoylamino)phenyl)stibane, (e) 1,4-bis(di(4-(prop-2-enoylamino)phenyl)stibanyl)benzene, and (f) 1,3,5-tris(di(4-(prop-2-enoylamino)-phenyl)stibanyl) benzene;

organobismuth(III) and organoantimony(III) molecules comprising vinylbenzoate groups as depicted in FIG. 14, namely (a) tris(4-(prop-2-enoylamino)phenyl)bismuthane, (b) 1,4-bis(di(4-(prop-2-enoylamino)phenyl)-bismuthanyl)benzene, (c) 1,3,5-tris(di(4-(prop-2-enoylamino)phenyl)bismuthanyl)-benzene, (d) tris(4-(prop-2-enoylamino)phenyl)stibane, (e) 1,4-bis(di(4-(prop-2-enoylamino)phenyl)stibanyl)benzene, and (f) 1,3,5-tris(di(4-(prop-2-enoylamino)-phenyl)stibanyl) benzene; and organobismuth(III) and organoantimony(III) molecules comprising N-vinylbenzamide groups as depicted in FIG. 15, namely (a) tris(4-(ethenylcarbamoyl)phenyl)bismuthane, (b) 1,4-bis(di(4-(ethenylcarbamoyl)phenyl)-bismuthanyl)benzene, (c) 1,3,5-tris(di(4-(ethenylcarbamoyl)phenyl)bismuthanyl)-benzene, (d) tris(4-(ethenylcarbamoyl)phenyl)stibane, (e) 1,4-bis(di(4-(ethenyl-carbamoyl)phenyl)stibanyl)benzene, and (f) 1,3,5-tris(di(4-(ethenylcarbamoyl)-phenyl)stibanyl) benzene.

However, the organometallic molecules according to the present invention are not limited to the above specified organobismuth(III) or organoantimone(III) molecules but also encompass along the same lines such organobismuth(III) or oroganoantimone(III) molecule analogues comprising vinyl or ethenyl, isopropenyl, 1,3-butadienyl, alpha-methylstyrene, vinylstyrene, cyclohexenyl, cycloheptenyl, methacrylate, 2,4-pentadienoate, methacrylamide, 2,4-pentadienamide, phenylmethacrylate, phenyl-2,4-pentadienoate, phenylmethacrylamide, phenyl-2,4-pentadienamide, isopropenylbenzoate, butadienylbenzoate, N-isopropenylbenzamide, N-butadienylbenzamide, and derivatives thereof.

In a still more preferred variant, in the organometallic molecule according to the present invention the R groups are either separated from each other or at least two R groups are connected or linked with each other, which influences the rotational degrees of freedom or resonance behavior of the organometallic molecule.

The term "separated from each other" means that the R groups are not interconnected or linked with each other. The term "at least two R groups are linked or connected with each other" means that two or even more than two R groups, which are adjacent, are linked with each other or interconnected. In a preferred variant, the R groups of the organometallic molecule are separated from each other. In a particularly preferred variant, two R groups of the organometallic molecule according to the present invention are linked with each other.

The bond between the at least two R groups can be a covalent bond between any of two C atoms of two adjacent R groups. Alternatively, at least two R groups can be linked or connected via a linking atom or linking group. The linking atom is preferably selected from the group consisting of —C—, —O—, and —S—, and the linking group is preferably selected from the group consisting of —C(O)—, —S(O)—, and —S(O)$_2$—.

In a preferred variant according to the present invention, two of the R groups of the organometallic molecule according to the present invention are connected via a covalent bond between any two carbon atoms of the two R groups. If the at least two R groups are linked with each other, a multicycle ring is formed defined by the linkage of the two R groups with each other and the linkage of the two R groups to the metal element M of the organometallic molecule according to the present invention. The number of the multicycle ring depends on the linkage site or binding site between the two R groups. Preferably, the multicycle ring is a four-membered ring, a five-membered ring, a six-membered ring, a seven-membered ring, etc. If the two R groups linked or connected with each other are phenyl groups, the ring formed by the linkage is a five-membered ring. Preferred organometallic molecules according to the present invention, in which two R groups are linked with each other with a covalent bond between two C atoms of the two R groups, are depicted in FIG. 8.

Preferred embodiments of organobismuth(III) or organoantimony(III) molecules for organometallic photoresists for DUV or EUV lithography according to the present invention, in which two R groups are linked with each other via a covalent bound include: organobismuth(III) and organoantimony(III) molecules comprising styrene groups as depicted in FIG. 8, namely (a) 5-(4-ethenylphenyl)-2,8-diethenyl-dibenzobismole, (b) 1,4-bis(2,8-diethenyl-dibenzobismol-5-yl)benzene, (c) 1,3,5-tris(2,8-diethenyl-dibenzobismol-5-yl)benzene, (d) 5-(4-ethenylphenyl)-2,8-diethenyl-dibenzostibole, (e) 1,4-bis(2,8-diethenyl-dibenzostibol-5-yl)benzene, and (f) 1,3,5-tris(2,8-diethenyl-dibenzostibol-5-yl)benzene.

However, the organometallic molecules according to the present invention in which two R groups are linked with each other via a covalent bound are not limited to the above specified organobismuth(III) or organoantimony(III) molecules but also encompass along the same lines such organobismuth(III) or oroganoantimony(III) molecule analogues comprising vinyl or ethenyl, isopropenyl, 1,3-butadienyl, alpha-methylstyrene, vinylstyrene, cyclopentenyl, cyclohexenyl, cycloheptenyl, acrylate, methacrylate, 2,4-pentadienoate, acrylamide, methacrylamide, 2,4-pentadienamide, phenylacrylate, phenylmethacrylate, phenyl-2,4-pentadienoate, phenylacrylamide, phenylmethacrylamide, phenyl-2,4-pentadienamide, vinylbenzoate, isopropenylbenzoate, butadienylbenzoate, N-vinylbenzamide, N-isopropenylbenzamide, N-butadienylbenzamide, and derivatives thereof.

In a still further preferred variant, the organometallic molecule according to the present invention comprises a linking atom or a linking group between at least one R group and the metal element M.

With a linking atom or linking group, the strength of the bond between the metal element M and the nearest neighbour atom can be adjusted or tuned without thereby limiting the choice of R groups.

The organometallic molecule's weakest bond now is a bond between the metal element M and the linking atom or linking group, such as Bi(III)-linking-atom bond or Bi(III)-linking-group bond or Sb(III)-linking-atom bond or Sb(III)-linking-group-bond.

For controlled/living radical polymerization of organometallic molecules comprising Bi(III) and/or Sb(III) to occur, upon DUV or EUV exposure, it must be the bond between the metal atom and the linking atom or the linking group that dissociates, such that a Bi or Sb radical species is formed. Therefore the organometallic molecule composition is selected such that the organometallic molecule's weakest bond is a bond between Bi(III) and/or Sb(III) and the linking atom or the linking group.

The linking atom is selected from the group consisting of —O—, —S—, —Se—, and —Te—, —Se— and —Te— are less preferred for toxicity reasons. The linking group is selected from the group consisting of —C(H)$_2$—, —N(X)—, and —P(X)—.

The X in the —N(X)— and —P(X)— linking group is preferably selected from the group consisting linear or branched or a cyclic unsubstituted or substituted alkyl group having 1 to 20 carbon atoms; an unsubstituted or substituted aryl group having 3 to 30 carbon atoms; an unsubstituted or a substituted unsaturated or a saturated heterocyclic group having a 3 to 30 membered ring; and derivatives thereof.

In a particularly preferred variant of the linking group, the linear or the branched alkyl group is selected from the group consisting of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, icosayl, and derivatives thereof; and/or the cyclic alkyl group is selected from the group consisting of cyclopentane, cyclohexane, cycloheptane, cyclooctane, and derivatives thereof; and/or the aryl group is selected from the group consisting of phenyl, naphthyl, anthracenyl, phenanthrenyl, and derivatives thereof; and/or the saturated or unsaturated heterocyclic group having one or two heteroatoms is selected from the group consisting of pyrrolidine, pyrrole, tetrahydrofuran, furan, tetrahydrothiophene, thiophene, imidazolidine, imidazole, oxazolidine, oxyzole, thiazolidine, thiazole, dioxolane, dithiolane, piperidine, pyridine, tetrahydropyran, pyran, thiane, thiopyran, diazinane, diazine, in particular pyridazin (1,2-diazin), pyrimidine (1,3-diazin) and pyrazin (1,4-diazin), morpholine, oxazine, thiomorpholine, thiazine, dioxane, dioxine, dithiane, dithiin, quinolone, isoquinoline, and derivatives thereof.

In a particularly preferred variant, the X in the linking group is phenyl.

Figure 16:
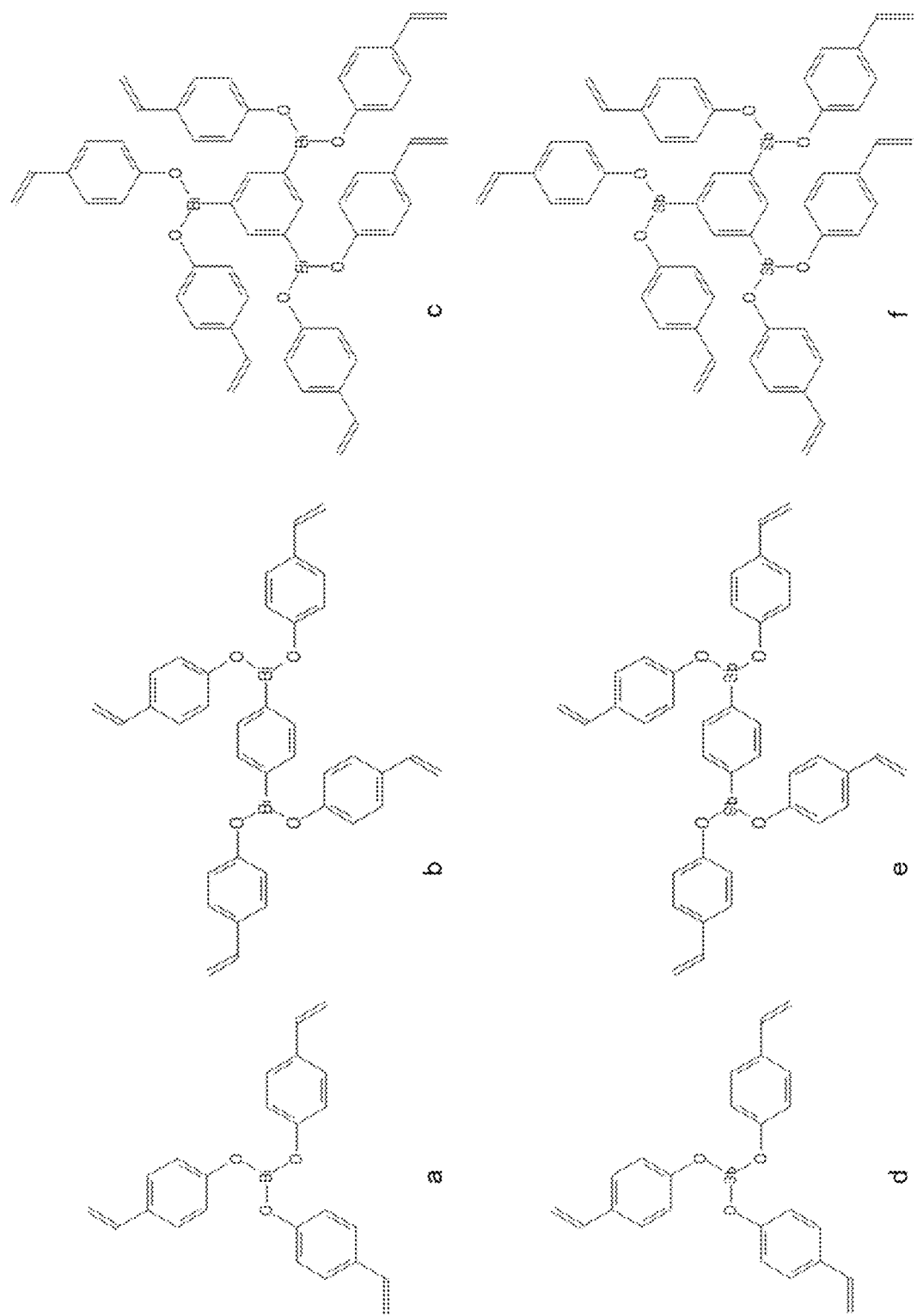
FIG. 16 shows preferred variants of organobismuth(III) and organoantimony(III) molecules according to the present invention comprising-O-linking atoms and styrene groups: (a) tris(4-ethenylphenoxy)bismuthane, (b) 1,4-bis(di(4-ethenylphenoxy)bismuthanyl)benzene, (c) 1,3,5-tris(di(4-ethenylphenoxy)-bismuthanyl)benzene, (d) tris(4-ethenylphenoxy)stibane, (e) 1,4-bis(di(4-ethenylphenoxy)stibanyl) benzene, and (f) 1,3,5-tris(di(4-ethenylphenoxy)-stibanyl) benzene.
Figure 17:
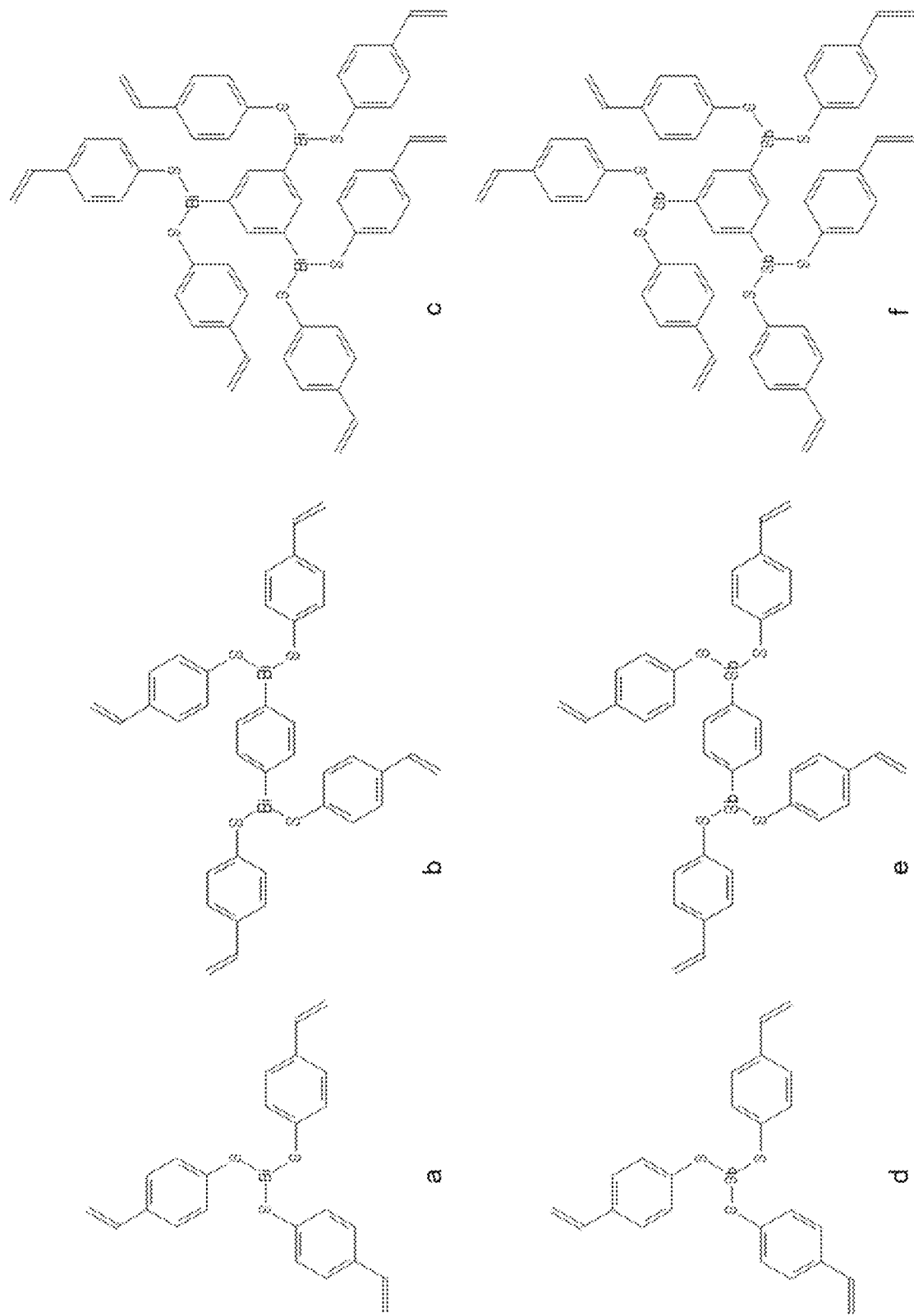
FIG. 17 shows preferred variants of organobismuth(III) and organoantimony(III) molecules according to the present invention comprising —S— linking atoms and styrene groups: (a) tris(4-ethenylphenylsulfanyl)bismuthane, (b) 1,4-bis(di(4-ethenylphenylsulfanyl)bismuthanyl)benzene, (c) 1,3,5-tris(di(4-ethenylphenylsulfanyl)bismuthanyl)benzene, (d) tris(4-ethenylphenylsulfanyl)stibane, (e) 1,4-bis(di(4-ethenylphenylsulfanyl))stibanyl)benzene, and (f) 1,3,5-tris(di(4-ethenylphenylsulfanyl))stibanyl)benzene.

The linking atom or the linking group in one organometallic molecule according to the present invention can be either identical or can be different. For example, the organometallic molecule can have a linking atom —O— between the metal element $M^1$ and $R^{1,1}$ and a linking atom —O— between the metal element $M^1$ and $R^{2,1}$; or the organometallic molecule can have a linking atom —O— between the metal element $M^1$ and $R^{1,1}$ and a linking atom —S— between the metal element $M^1$ and $R^{2,1}$. For ease of synthesizing the organometallic molecule, however, it is preferred to have identical linking atoms or linking groups in one organometallic molecule. Preferred embodiments of organobismuth(III) or organoantimony(III) molecules for organometallic photoresists for DUV or EUV lithography according to this invention include: organobismuth(III) and organoantimony(III) molecules comprising —O— linking atoms and styrene groups as depicted in FIG. 16, namely (a) tris(4-ethenylphenoxy)bismuthane, (b) 1,4-bis(di(4-ethenylphenoxy)bismuthanyl)benzene, (c) 1,3,5-tris(di(4-ethenylphenoxy)bismuthanyl)benzene, (d) tris(4-ethenylphenoxy)-stibane, (e) 1,4-bis(di(4-ethenylphenoxy)stibanyl)benzene, and (f) 1,3,5-tris(di(4-ethenylphenoxy)stibanyl)benzene; and organobismuth(III) and organoantimony(III) molecules comprising —S— linking atoms and styrene groups as depicted in FIG. 17, namely (a) tris(4-ethenylphenylsulfanyl)bismuthane, (b) 1,4-bis(di(4-ethenylphenylsulfanyl)-bismuthanyl)benzene, (c) 1,3,5-tris(di(4-ethenylphenylsulfanyl)bismuthanyl)benzene, (d) tris (4-ethenylphenylsulfanyl)stibane, (e) 1,4-bis(di(4-ethenylphenylsulfanyl))-stibanyl)benzene, and (f) 1,3,5-tris(di(4-ethenylphenylsulfanyl))stibanyl)benzene.

However, the organometallic molecules according to the present invention comprising —O— linking atoms and styrene or —S— linking atoms and styrene are not limited to the above specified organobismuth(III) or organoantimone(III) molecules but also encompass along the same lines such organobismuth(III) or oroganoantimone(III) molecule analogues comprising vinyl or ethenyl, isopropenyl, 1,3-butadienyl, alpha-methylstyrene, vinylstyrene, cyclopentenyl, cyclohexenyl, cycloheptenyl, phenylacrylate, phenylmethacrylate, phenyl-2,4-pentadienoate, phenylacrylamide, phenylmethacrylamide, phenyl-2,4-pentadienamide, vinylbenzoate, isopropenylbenzoate, butadienylbenzoate, N-vinylbenzamide, N-isopropenylbenzamide, N-butadienylbenzamide, and derivatives thereof.

In a most preferred variant, the organobismuth(III) or organoantimony(III) molecules according to the present invention are selected from the group consisting of organobismuth(III) or organoantimony(III) molecules:
With Vinyl Groups:
tris(ethenyl)bismuthane,
1,4-bis(di(ethenyl)bismuthanyl)benzene,
1,3,5-tris(di(ethenyl)bismuthanyl)benzene,
tris(ethenyl)stibane,
1,4-bis(di(ethenyl)stibanyl)benzene,
1,3,5-tris(di(ethenyl)stibanyl)benzene,
With Isopropenyl Groups:
tris(propen-2-yl)bismuthane,
1,4-bis(di(propen-2-yl)bismuthanyl)benzene,
1,3,5-tris(di(propen-2-yl)bismuthanyl)benzene,
tris(propen-2-yl)stibane,
1,4-bis(di(propen-2-yl)stibanyl)benzene,
1,3,5-tris(di(propen-2-yl)stibanyl)benzene,
With 1,3-butadienyl Groups:
tris(buta-1,3-dien-1-yl)bismuthane,
1,4-bis(di(buta-1,3-dien-1-yl)bismuthanyl)benzene,
1,3,5-tris(di(buta-1,3-dien-1-yl)bismuthanyl)benzene,
tris(buta-1,3-dien-1-yl)stibane,
1,4-bis(di(buta-1,3-dien-1-yl)stibanyl)benzene,
1,3,5-tris(di(buta-1,3-dien-1-yl)stibanyl)benzene,
With Styrene Groups:
5-(4-ethenylphenyl)-2,8-diethenyl-dibenzobismole,
1,4-bis(2,8-diethenyl-dibenzobismol-5-yl)benzene,
1,3,5-tris(2,8-diethenyl-dibenzobismol-5-yl)benzene,
5-(4-ethenylphenyl)-2,8-diethenyl-dibenzostibole, 1,4-bis(2,8-diethenyl-dibenzostibol-5-yl)benzene,
1,3,5-tris(2,8-diethenyl-dibenzostibol-5-yl)benzene,
With Alpha-Methylstyrene Groups:
tris(4-propen-2-ylphenyl)bismuthane,
1,4-bis(di(4-propen-2-ylphenyl)bismuthanyl)benzene,
1,3,5-tris(di(4-propen-2-ylphenyl)bismuthanyl)benzene,
tris(4-propen-2-ylphenyl)stibane,
1,4-bis(di(4-propen-2-ylphenyl)stibanyl)benzene,
1,3,5-tris(di(4-propen-2-ylphenyl)stibanyl)benzene,
With Vinylstyrene Groups:
tris(4-buta-1,3-dien-1-ylphenyl)bismuthane,
1,4-bis(di(4-buta-1,3-dien-1-ylphenyl)bismuthanyl)benzene,
1,3,5-tris(di(4-buta-1,3-dien-1-ylphenyl)bismuthanyl)benzene,
tris(4-buta-1,3-dien-1-ylphenyl)stibane,
1,4-bis(di(4-buta-1,3-dien-1-ylphenyl)stibanyl)benzene,
1,3,5-tris(di(4-buta-1,3-dien-1-ylphenyl)stibanyl)benzene,
With Cyclopentenyl Groups:
tris(cyclopent-2-enyl)bismuthane,
1,4-bis(cyclopent-2-enyl)-bismuthanyl)benzene,
1,3,5-tris(di(cyclopent-2-enyl)bismuthanyl)benzene,
tris(cyclopent-2-enyl)stibane,
1,4-bis(di(cyclopent-2-enyl)stibanyl)benzene,
1,3,5-tris(di(cyclopent-2-enyl)stibanyl)benzene,
with cyclohexenyl groups:
tris(cyclohex-2-enyl)bismuthane,
1,4-bis(cyclohex-2-enyl)-bismuthanyl)benzene,
1,3,5-tris(di(cyclohex-2-enyl)bismuthanyl)benzene,
tris(cyclohex-2-enyl)stibane,
1,4-bis(di(cyclohex-2-enyl)stibanyl)benzene,
1,3,5-tris(di(cyclohex-2-enyl)stibanyl)benzene,
With Cycloheptenyl Groups:
tris(cyclohept-2-enyl)bismuthane,
1,4-bis(cyclohept-2-enyl)-bismuthanyl)benzene,
1,3,5-tris(di(cyclohept-2-enyl)bismuthanyl)benzene,
tris(cyclohept-2-enyl)stibane,
1,4-bis(di(cyclohept-2-enyl)stibanyl)benzene,
1,3,5-tris(di(cyclohept-2-enyl)stibanyl)benzene,
With Acrylate Groups:
tris(prop-2-enoyloxy)bismuthane,
1,4-bis(di(prop-2-enoyloxy)bismuthanyl)benzene,
1,3,5-tris(di(prop-2-enoyloxy)bismuthanyl)benzene,
tris(prop-2-enoyloxy)stibane,
1,4-bis(di(prop-2-enoyloxy)stibanyl)benzene,
1,3,5-tris(di(prop-2-enoyloxy)stibanyl)benzene,
With Methacrylate Groups:
tris(2-methylprop-2-enoyloxy)bismuthane,
1,4-bis(di(2-methylprop-2-enoyloxy)bismuthanyl)benzene,
1,3,5-tris(di(2-methylprop-2-enoyloxy)bismuthanyl)benzene,
tris(2-methylprop-2-enoyloxy)stibane,
1,4-bis(di(2-methylprop-2-enoyloxy)stibanyl)benzene,
1,3,5-tris(di(2-methylprop-2-enoyloxy)stibanyl)benzene,
With 2,4-pentadienoate Groups:
tris(penta-2,4-dienoyloxy)bismuthane,
1,4-bis(di(penta-2,4-dienoyloxy)bismuthanyl)benzene,
1,3,5-tris(di(penta-2,4-dienoyloxy)bismuthanyl)benzene,
tris(penta-2,4-dienoyloxy)stibane,
1,4-bis(di(penta-2,4-dienoyloxy)stibanyl)benzene,
1,3,5-tris(di(penta-2,4-dienoyloxy)stibanyl)benzene,
With Acrylamide Groups:
tris(prop-2-enoylamino)bismuthane,
1,4-bis(di(prop-2-enoylamino)bismuthanyl)benzene,
1,3,5-tris(prop-2-enoylamino)bismuthanyl)benzene,
tris(prop-2-enoylamino)stibane,
1,4-bis(di(prop-2-enoylamino)stibanyl)benzene,
1,3,5-tris(di(prop-2-enoylamino)stibanyl)benzene,
With Methacrylamide Groups:
tris(2-methylprop-2-enoylamino)bismuthane,
1,4-bis(di(2-methylprop-2-enoylamino)bismuthanyl)benzene,
1,3,5-tris(di(2-methylprop-2-enoylamino)bismuthanyl)benzene,
tris(2-methylprop-2-enoylamino)stibane,
1,4-bis(di(2-methylprop-2-enoylamino)stibanyl)benzene,
1,3,5-tris(di(2-methylprop-2-enoylamino)stibanyl)benzene,
With 2,4-pentadienamide Groups:
tris(penta-2,4-dienoylamino)bismuthane,
1,4-bis(di(penta-2,4-dienoylamino)bismuthanyl)benzene,
1,3,5-tris(di(penta-2,4-dienoylamino)bismuthanyl)benzene,
tris(penta-2,4-dienoylamino)stibane,
1,4-bis(di(penta-2,4-dienoylamino)stibanyl)benzene,
1,3,5-tris(di(penta-2,4-dienoylamino)stibanyl)benzene,
With Phenylacrylate Groups:
tris(4-(prop-2-enoyloxy)phenyl)bismuthane,
1,4-bis(di(4-(prop-2-enoyloxy)phenyl)bismuthanyl)benzene,
1,3,5-tris(di(4-(prop-2-enoyloxy)phenyl)bismuthanyl)benzene,
tris(4-(prop-2-enoyloxy)phenyl)stibane,
1,4-bis(di(4-(prop-2-enoyloxy)phenyl)stibanyl)benzene,
1,3,5-tris(di(4-(prop-2-enoyloxy)phenyl)stibanyl)benzene,
With Phenylmethacrylate Groups:
tris(4-(2-methylprop-2-enoyloxy)phenyl)bismuthane,
1,4-bis(di(4-(2-methylprop-2-enoyloxy)phenyl)bismuthanyl)benzene,
1,3,5-tris(di(4-(2-methylprop-2-enoyloxy)phenyl)bismuthanyl)benzene,
tris(4-(2-methylprop-2-enoyloxy)phenyl)stibane,
1,4-bis(di(4-(2-methylprop-2-enoyloxy)phenyl)stibanyl)benzene,
1,3,5-tris(di(4-(2-methylprop-2-enoyloxy)phenyl)stibanyl)benzene,
With phenyl-2,4-pentadienoate Groups:
tris(4-(penta-2,4-dienoyloxy)phenyl)bismuthane,
1,4-bis(di(4-(penta-2,4-dienoyloxy)phenyl)bismuthanyl)benzene,
1,3,5-tris(di(4-(penta-2,4-dienoyloxy)phenyl)bismuthanyl)benzene,
tris(4-(penta-2,4-dienoyloxy)phenyl)stibane,
1,4-bis(di(4-(penta-2,4-dienoyloxy)phenyl)stibanyl)benzene,
1,3,5-tris(di(4-(penta-2,4-dienoyloxy)phenyl)stibanyl)benzene,
With Phenylacrylamide Groups:
tris(4-(prop-2-enoylamino)phenyl)bismuthane,
1,4-bis(di(4-(prop-2-enoylamino)phenyl)bismuthanyl)benzene,
1,3,5-tris(di(4-(prop-2-enoylamino)phenyl)bismuthanyl)benzene,
tris(4-(prop-2-enoylamino)phenyl)stibane,
1,4-bis(di(4-(prop-2-enoylamino)phenyl)stibanyl)benzene,
1,3,5-tris(di(4-(prop-2-enoylamino)phenyl)stibanyl)benzene,
With Phenylmethacrylamide Groups:
tris(4-(2-methylprop-2-enoylamino)phenyl)bismuthane,
1,4-bis(di(4-(2-methylprop-2-enoylamino)phenyl)bismuthanyl)benzene,
1,3,5-tris(di(4-(2-methylprop-2-enoylamino)phenyl)bismuthanyl)benzene,
tris(4-(2-methylprop-2-enoylamino)phenyl)stibane,
1,4-bis(di(4-(2-methylprop-2-enoylamino)phenyl)stibanyl)benzene,
1,3,5-tris(di(4-(2-methylprop-2-enoylamino)phenyl)stibanyl)benzene, With phenyl-2,4-pentadienamide Groups:
tris(4-(penta-2,4-dienoylamino)phenyl)bismuthane,
1,4-bis(di(4-(penta-2,4-dienoylamino)phenyl)bismuthanyl)
   benzene,
1,3,5-tris(di(4-(penta-2,4-dienoylamino)phenyl)bismuthanyl)benzene,
tris(4-(penta-2,4-dienoylamino)phenyl)stibane,
1,4-bis(di(4-(penta-2,4-dienoylamino)phenyl)stibanyl)benzene,
1,3,5-tris(di(4-(penta-2,4-dienoylamino)phenyl)stibanyl)
   benzene,
With Vinylbenzoate Groups:
tris(4-(ethenoxycarbonyl)phenyl)bismuthane,
1,4-bis(di(4-(ethenoxycarbonyl)phenyl)bismuthanyl)benzene,
1,3,5-tris(di(4-(ethenoxycarbonyl)phenyl)bismuthanyl)benzene,
tris(4-(ethenoxycarbonyl)phenyl)stibane,
1,4-bis(di(4-(ethenoxycarbonyl)phenyl)stibanyl)benzene,
1,3,5-tris(di(4-(ethenoxycarbonyl)phenyl)stibanyl)benzene,
With Isopropenylbenzoate Groups:
tris(4-(isopropenyloxycarbonyl)phenyl)bismuthane,
1,4-bis(di(4-(isopropenyloxycarbonyl)phenyl)bismuthanyl)
   benzene,
1,3,5-tris(di(4-(isopropenyloxycarbonyl)phenyl)bismuthanyl)benzene,
tris(4-(isopropenyloxycarbonyl)phenyl)stibane,
1,4-bis(di(4-(isopropenyloxycarbonyl)phenyl)stibanyl)benzene,
1,3,5-tris(di(4-(isopropenyloxycarbonyl)phenyl)stibanyl)
   benzene,
With Butadienylbenzoate Groups:
tris(4-(buta-1,3-dienyloxycarbonyl)phenyl)bismuthane,
1,4-bis(di(4-(buta-1,3-dienyloxycarbonyl)phenyl)bismuthanyl)benzene,
1,3,5-tris(di(4-(buta-1,3-dienyloxycarbonyl)phenyl)bismuthanyl)benzene,
tris(4-(buta-1,3-dienyloxycarbonyl)phenyl)stibane,
1,4-bis(di(4-(buta-1,3-dienyloxycarbonyl)phenyl)stibanyl)
   benzene,
1,3,5-tris(di(4-(buta-1,3-dienyloxycarbonyl)phenyl)stibanyl)benzene,
With N-Vinylbenzamide Groups:
tris(4-(ethenylcarbamoyl)phenyl)bismuthane,
1,4-bis(di(4-(ethenylcarbamoyl)phenyl)bismuthanyl)benzene,
1,3,5-tris(di(4-(ethenylcarbamoyl)phenyl)bismuthanyl)benzene,
tris(4-(ethenylcarbamoyl)phenyl)stibane,
1,4-bis(di(4-(ethenylcarbamoyl)phenyl)stibanyl)benzene,
1,3,5-tris(di(4-(ethenylcarbamoyl)phenyl)stibanyl)benzene,
With N-isopropenylbenzamide Groups:
tris(4-(isopropenylcarbmoyl)phenyl)bismuthane,
1,4-bis(di(4-(isopropenylcarbmoyl)phenyl)bismuthanyl)
   benzene,
1,3,5-tris(di(4-(isopropenylcarbmoyl)phenyl)bismuthanyl)
   benzene,
tris(4-(isopropenylcarbmoyl)phenyl)stibane,
1,4-bis(di(4-(isopropenylcarbmoyl)phenyl)stibanyl)benzene,
1,3,5-tris(di(4-(isopropenylcarbmoyl)phenyl)stibanyl)benzene,
With N-butadienylbenzamide Groups:
tris(4-(buta-1,3-dienylcarbamoyl)phenyl)bismuthane,
1,4-bis(di(4-(buta-1,3-dienylcarbamoyl)phenyl)bismuthanyl)benzene,
1,3,5-tris(di(4-(buta-1,3-dienylcarbamoyl)phenyl)bismuthanyl)benzene,
tris(4-(buta-1,3-dienylcarbamoyl)phenyl)stibane,
1,4-bis(di(4-(buta-1,3-dienylcarbamoyl)phenyl)stibanyl)
   benzene,
1,3,5-tris(di(4-(buta-1,3-dienylcarbamoyl)phenyl)stibanyl)
   benzene,
With —O— Linking Atoms and Vinyl Groups:
tris(ethenyloxy)bismuthane,
1,4-bis(di(ethenyloxy)bismuthanyl)benzene,
1,3,5-tris(di(ethenyloxy)bismuthanyl)benzene,
tris(ethenyloxy)stibane,
1,4-bis(di(ethenyloxy)stibanyl)benzene,
1,3,5-tris(di(ethenyloxy)stibanyl)benzene,
With —O— Linking Atoms and Isopropenyl Groups:
tris(propen-2-yloxy)bismuthane,
1,4-bis(di(propen-2-yloxy)bismuthanyl)benzene,
1,3,5-tris(di(propen-2-yloxy)bismuthanyl)benzene,
tris(propen-2-yloxy)stibane,
1,4-bis(di(propen-2-yloxy)stibanyl)benzene,
1,3,5-tris(di(propen-2-yloxy)stibanyl)benzene,
With —O— Linking Atoms and 1,3-butadienyl Groups:
tris(buta-1,3-dien-1-yloxy)bismuthane,
1,4-bis(di(buta-1,3-dien-1-yloxy)bismuthanyl)benzene,
1,3,5-tris(di(buta-1,3-dien-1-yloxy)bismuthanyl)benzene,
tris(buta-1,3-dien-1-yloxy)stibane,
1,4-bis(di(buta-1,3-dien-1-yloxy)stibanyl)benzene,
1,3,5-tris(di(buta-1,3-dien-1-yloxy)stibanyl)benzene,
With —O— Linking Atoms and Styrene Groups:
tris(4-ethenylphenoxy)bismuthane,
1,4-bis(di(4-ethenylphenoxy)bismuthanyl)benzene,
1,3,5-tris(di(4-ethenylphenoxy)bismuthanyl)benzene,
tris(4-ethenylphenoxy)stibane,
1,4-bis(di(4-ethenylphenoxy)stibanyl)benzene,
1,3,5-tris(di(4-ethenylphenoxy)stibanyl)benzene,
With —O— Linking Atoms and alpha-methylstyrene
   Groups:
tris(4-propen-2-ylphenoxy)bismuthane,
1,4-bis(di(4-propen-2-ylphenoxy)bismuthanyl)benzene,
1,3,5-tris(di(4-propen-2-ylphenoxy)bismuthanyl)benzene,
tris(4-propen-2-ylphenoxy)stibane,
1,4-bis(di(4-propen-2-ylphenoxy)stibanyl)benzene,
1,3,5-tris(di(4-propen-2-ylphenoxy)stibanyl)benzene,
With —O— Linking Atoms and Vinylstyrene Groups:
tris(4-buta-1,3-dien-1-ylphenoxy)bismuthane,
1,4-bis(di(4-buta-1,3-dien-1-ylphenoxy)bismuthanyl)benzene,
1,3,5-tris(di(4-buta-1,3-dien-1-ylphenoxy)bismuthanyl)
   benzene,
tris(4-buta-1,3-dien-1-ylphenoxy)stibane,
1,4-bis(di(4-buta-1,3-dien-1-ylphenoxy)stibanyl)benzene,
1,3,5-tris(di(4-buta-1,3-dien-1-ylphenoxy)stibanyl)benzene,
With —O— Linking Atoms and Cyclopentenyl Groups:
tris(cyclopent-2-enyloxy)bismuthane,
1,4-bis(cyclopent-2-enyloxy)-bismuthanyl)benzene,
1,3,5-tris(di(cyclopent-2-enyloxy)bismuthanyl)benzene,
tris(cyclopent-2-enyloxy)stibane,
1,4-bis(di(cyclopent-2-enyloxy)stibanyl)benzene,
1,3,5-tris(di(cyclopent-2-enyloxy)stibanyl)benzene,
With —O— Linking Atoms and Cyclohexenyl Groups:
tris(cyclohex-2-enyloxy)bismuthane,
1,4-bis(cyclohex-2-enyloxy)-bismuthanyl)benzene,
1,3,5-tris(di(cyclohex-2-enyloxy)bismuthanyl)benzene,
tris(cyclohex-2-enyloxy)stibane,
1,4-bis(di(cyclohex-2-enyloxy)stibanyl)benzene, 1,3,5-tris(di(cyclohex-2-enyloxy)stibanyl)benzene, With —O— Linking Atoms and Cycloheptenyl Groups:
tris(cyclohept-2-enyloxy)bismuthane,
1,4-bis(cyclohept-2-enyloxy)-bismuthanyl)benzene,
1,3,5-tris(di(cyclohept-2-enyloxy)bismuthanyl)benzene,
tris(cyclohept-2-enyloxy)stibane,
1,4-bis(di(cyclohept-2-enyloxy)stibanyl)benzene,
1,3,5-tris(di(cyclohept-2-enyloxy)stibanyl)benzene, With —O— Linking Atoms and Phenylacrylate Groups:
tris(4-(prop-2-enoyloxy)phenoxy)bismuthane,
1,4-bis(di(4-(prop-2-enoyloxy)phenoxy)bismuthanyl)benzene,
1,3,5-tris(di(4-(prop-2-enoyloxy)phenoxy)bismuthanyl)benzene,
tris(4-(prop-2-enoyloxy)phenoxy)stibane,
1,4-bis(di(4-(prop-2-enoyloxy)phenoxy)stibanyl)benzene,
1,3,5-tris(di(4-(prop-2-enoyloxy)phenoxy)stibanyl)benzene, With —O— Linking Atoms and Phenylmethacrylate Groups:
tris(4-(2-methylprop-2-enoyloxy)phenoxy)bismuthane,
1,4-bis(di(4-(2-methylprop-2-enoyloxy)phenoxy)bismuthanyl)benzene,
1,3,5-tris(di(4-(2-methylprop-2-enoyloxy)phenoxy)bismuthanyl)benzene,
tris(4-(2-methylprop-2-enoyloxy)phenoxy)stibane,
1,4-bis(di(4-(2-methylprop-2-enoyloxy)phenoxy)stibanyl)benzene,
1,3,5-tris(di(4-(2-methylprop-2-enoyloxy)phenoxy)stibanyl)benzene, With —O— linking Atoms and phenyl-2,4-pentadienoate Groups:
tris(4-(penta-2,4-dienoyloxy)phenoxy)bismuthane,
1,4-bis(di(4-(penta-2,4-dienoyloxy)phenoxy)bismuthanyl)benzene,
1,3,5-tris(di(4-(penta-2,4-dienoyloxy)phenoxy)bismuthanyl)benzene,
tris(4-(penta-2,4-dienoyloxy)phenoxy)stibane,
1,4-bis(di(4-(penta-2,4-dienoyloxy)phenoxy)stibanyl)benzene,
1,3,5-tris(di(4-(penta-2,4-dienoyloxy)phenoxy)stibanyl)benzene, With —O— Linking Atoms and Phenylacrylamide Groups:
tris(4-(prop-2-enoylamino)phenoxy)bismuthane,
1,4-bis(di(4-(prop-2-enoylamino)phenoxy)bismuthanyl)benzene,
1,3,5-tris(di(4-(prop-2-enoylamino)phenoxy)bismuthanyl)benzene,
tris(4-(prop-2-enoylamino)phenoxy)stibane,
1,4-bis(di(4-(prop-2-enoylamino)phenoxy)stibanyl)benzene,
1,3,5-tris(di(4-(prop-2-enoylamino)phenoxy)stibanyl)benzene, With —O— Linking Atoms and Phenylmethacrylamide Groups:
tris(4-(2-methylprop-2-enoylamino)phenoxy)bismuthane,
1,4-bis(di(4-(2-methylprop-2-enoylamino)phenoxy)bismuthanyl)benzene,
1,3,5-tris(di(4-(2-methylprop-2-enoylamino)phenoxy)bismuthanyl)benzene,
tris(4-(2-methylprop-2-enoylamino)phenoxy)stibane,
1,4-bis(di(4-(2-methylprop-2-enoylamino)phenoxy)stibanyl)benzene,
1,3,5-tris(di(4-(2-methylprop-2-enoylamino)phenoxy)stibanyl)benzene, With —O— Linking Atoms and phenyl-2,4-pentadienamide Groups:
tris(4-(penta-2,4-dienoylamino)phenoxy)bismuthane,
1,4-bis(di(4-(penta-2,4-dienoylamino)phenoxy)bismuthanyl)benzene,
1,3,5-tris(di(4-(penta-2,4-dienoylamino)phenoxy)bismuthanyl)benzene,
tris(4-(penta-2,4-dienoylamino)phenoxy)stibane,
1,4-bis(di(4-(penta-2,4-dienoylamino)phenoxy)stibanyl)benzene,
1,3,5-tris(di(4-(penta-2,4-dienoylamino)phenoxy)stibanyl)benzene, With —O— Linking Atoms and Vinylbenzoate Groups:
tris(4-(ethenoxycarbonyl)phenoxy)bismuthane,
1,4-bis(di(4-(ethenoxycarbonyl)phenoxy)bismuthanyl)benzene,
1,3,5-tris(di(4-(ethenoxycarbonyl)phenoxy)bismuthanyl)benzene,
tris(4-(ethenoxycarbonyl)phenoxy)stibane,
1,4-bis(di(4-(ethenoxycarbonyl)phenoxy)stibanyl)benzene,
1,3,5-tris(di(4-(ethenoxycarbonyl)phenoxy)stibanyl)benzene, With —O— Linking Atoms and Isopropenylbenzoate Groups:
tris(4-(isopropenyloxycarbonyl)phenoxy)bismuthane,
1,4-bis(di(4-(isopropenyloxycarbonyl)phenoxy)bismuthanyl)benzene,
1,3,5-tris(di(4-(isopropenyloxycarbonyl)phenoxy)bismuthanyl)benzene,
tris(4-(isopropenyloxycarbonyl)phenoxy)stibane,
1,4-bis(di(4-(isopropenyloxycarbonyl)phenoxy)stibanyl)benzene,
1,3,5-tris(di(4-(isopropenyloxycarbonyl)phenoxy)stibanyl)benzene, With —O— Linking Atoms and Butadienylbenzoate Groups:
tris(4-(buta-1,3-dienyloxycarbonyl)phenoxy)bismuthane,
1,4-bis(di(4-(buta-1,3-dienyloxycarbonyl)phenoxy)bismuthanyl)benzene,
1,3,5-tris(di(4-(buta-1,3-dienyloxycarbonyl)phenoxy)bismuthanyl)benzene,
tris(4-(buta-1,3-dienyloxycarbonyl)phenoxy)stibane,
1,4-bis(di(4-(buta-1,3-dienyloxycarbonyl)phenoxy)stibanyl)benzene,
1,3,5-tris(di(4-(buta-1,3-dienyloxycarbonyl)phenoxy)stibanyl)benzene, With —O— Linking Atoms and N-vinylbenzamide Groups:
tris(4-(ethenylcarbamoyl)phenoxy)bismuthane,
1,4-bis(di(4-(ethenylcarbamoyl)phenoxy)bismuthanyl)benzene,
1,3,5-tris(di(4-(ethenylcarbamoyl)phenoxy)bismuthanyl)benzene,
tris(4-(ethenylcarbamoyl)phenoxy)stibane,
1,4-bis(di(4-(ethenylcarbamoyl)phenoxy)stibanyl)benzene,
1,3,5-tris(di(4-(ethenylcarbamoyl)phenoxy)stibanyl)benzene, With —O— Linking Atoms and N-isopropenylbenzamide Groups:
tris(4-(isopropenylcarbmoyl)phenoxy)bismuthane,
1,4-bis(di(4-(isopropenylcarbmoyl)phenoxy)bismuthanyl)benzene,
1,3,5-tris(di(4-(isopropenylcarbmoyl)phenoxy)bismuthanyl)benzene,
tris(4-(isopropenylcarbmoyl)phenoxy)stibane,
1,4-bis(di(4-(isopropenylcarbmoyl)phenoxy)stibanyl)benzene, 1,3,5-tris(di(4-(isopropenylcarbmoyl)phenoxy)stibanyl)
benzene,
With —O— Linking Atoms and N-butadienylbenzamide
Groups:
tris(4-(buta-1,3-dienylcarbamoyl)phenoxy)bismuthane,
1,4-bis(di(4-(buta-1,3-dienylcarbamoyl)phenoxy)bismuthanyl)benzene,
1,3,5-tris(di(4-(buta-1,3-dienylcarbamoyl)phenoxy)bismuthanyl)benzene,
tris(4-(buta-1,3-dienylcarbamoyl)phenoxy)stibane,
1,4-bis(di(4-(buta-1,3-dienylcarbamoyl)phenoxy)stibanyl)
benzene,
1,3,5-tris(di(4-(buta-1,3-dienylcarbamoyl)phenoxy)stibanyl)benzene,
With —S— Linking Atoms and Vinyl Groups:
tris(ethenylsulfanyl)bismuthane,
1,4-bis(di(ethenylsulfanyl)bismuthanyl)benzene,
1,3,5-tris(di(ethenylsulfanyl)bismuthanyl)benzene,
tris(ethenylsulfanyl)stibane,
1,4-bis(di(ethenylsulfanyl)stibanyl)benzene,
1,3,5-tris(di(ethenylsulfanyl)stibanyl)benzene,
With —S— Linking Atoms and Isopropenyl Groups:
tris(propen-2-ylsulfanyl)bismuthane,
1,4-bis(di(propen-2-ylsulfanyl)bismuthanyl)benzene,
1,3,5-tris(di(propen-2-ylsulfanyl)bismuthanyl)benzene,
tris(propen-2-ylsulfanyl),
1,4-bis(di(propen-2-ylsulfanyl)stibanyl)benzene,
1,3,5-tris(di(propen-2-ylsulfanyl)stibanyl)benzene,
With —S— Linking Atoms and 1,3-butadienyl Groups:
tris(buta-1,3-dien-1-ylsulfanyl)bismuthane,
1,4-bis(di(buta-1,3-dien-1-ylsulfanyl)bismuthanyl)benzene,
1,3,5-tris(di(buta-1,3-dien-1-ylsulfanyl)bismuthanyl)benzene,
tris(buta-1,3-dien-1-ylsulfanyl)stibane,
1,4-bis(di(buta-1,3-dien-1-ylsulfanyl)stibanyl)benzene,
1,3,5-tris(di(buta-1,3-dien-1-ylsulfanyl)stibanyl)benzene,
With —S— Linking Atoms and Styrene Groups:
tris(4-ethenylphenylsulfanyl)bismuthane,
1,4-bis(di(4-ethenylphenylsulfanyl)bismuthanyl)benzene,
1,3,5-tris(di(4-ethenylphenylsulfanyl)bismuthanyl)benzene,
tris(4-ethenylphenylsulfanyl)stibane,
1,4-bis(di(4-ethenylphenylsulfanyl)stibanyl)benzene,
1,3,5-tris(di(4-ethenylphenylsulfanyl)stibanyl)benzene,
With —S— Linking Atoms and alpha-methylstyrene
Groups:
tris(4-propen-2-ylphenylsulfanyl)bismuthane,
1,4-bis(di(4-propen-2-ylphenylsulfanyl)bismuthanyl)benzene,
1,3,5-tris(di(4-propen-2-ylphenylsulfanyl)bismuthanyl)benzene,
tris(4-propen-2-ylphenylsulfanyl)stibane,
1,4-bis(di(4-propen-2-ylphenylsulfanyl)stibanyl)benzene,
1,3,5-tris(di(4-propen-2-ylphenylsulfanyl)stibanyl)benzene,
With —S— Linking Atoms and Vinylstyrene Groups:
tris(4-buta-1,3-dien-1-ylphenylsulfanyl)bismuthane,
1,4-bis(di(4-buta-1,3-dien-1-ylphenylsulfanyl)bismuthanyl)
benzene,
1,3,5-tris(di(4-buta-1,3-dien-1-ylphenylsulfanyl)bismuthanyl)benzene,
tris(4-buta-1,3-dien-1-ylphenylsulfanyl)stibane,
1,4-bis(di(4-buta-1,3-dien-1-ylphenylsulfanyl)stibanyl)benzene,
1,3,5-tris(di(4-buta-1,3-dien-1-ylphenylsulfanyl)stibanyl)
benzene,
With —S— Linking Atoms and Cyclopentenyl Groups:
tris(cyclopent-2-enylsulfanyl)bismuthane,
1,4-bis(cyclopent-2-enylsulfanyl)-bismuthanyl)benzene,
1,3,5-tris(di(cyclopent-2-enylsulfanyl)bismuthanyl)benzene,
tris(cyclopent-2-enylsulfanyl)stibane,
1,4-bis(di(cyclopent-2-enylsulfanyl)stibanyl)benzene,
1,3,5-tris(di(cyclopent-2-enylsulfanyl)stibanyl)benzene,
With —S— Linking Atoms and Cyclohexenyl Groups:
tris(cyclohex-2-enylsulfanyl)bismuthane,
1,4-bis(cyclohex-2-enylsulfanyl)-bismuthanyl)benzene,
1,3,5-tris(di(cyclohex-2-enylsulfanyl)bismuthanyl)benzene,
tris(cyclohex-2-enylsulfanyl)stibane,
1,4-bis(di(cyclohex-2-enylsulfanyl)stibanyl)benzene,
1,3,5-tris(di(cyclohex-2-enylsulfanyl)stibanyl)benzene,
With —S— Linking Atoms and Cycloheptenyl Groups:
tris(cyclohept-2-enylsulfanyl)bismuthane,
1,4-bis(cyclohept-2-enylsulfanyl)-bismuthanyl)benzene,
1,3,5-tris(di(cyclohept-2-enylsulfanyl)bismuthanyl)benzene,
tris(cyclohept-2-enylsulfanyl)stibane,
1,4-bis(di(cyclohept-2-enylsulfanyl)stibanyl)benzene,
1,3,5-tris(di(cyclohept-2-enylsulfanyl)stibanyl)benzene,
With —S— Linking Atoms and Phenylacrylate Groups:
tris(4-(prop-2-enoyloxy)phenylsulfanyl)bismuthane,
1,4-bis(di(4-(prop-2-enoyloxy)phenylsulfanyl)bismuthanyl)
benzene,
1,3,5-tris(di(4-(prop-2-enoyloxy)phenylsulfanyl)bismuthanyl)benzene,
tris(4-(prop-2-enoyloxy)phenylsulfanyl)stibane,
1,4-bis(di(4-(prop-2-enoyloxy)phenylsulfanyl)stibanyl)benzene,
1,3,5-tris(di(4-(prop-2-enoyloxy)phenylsulfanyl)stibanyl)
benzene,
With —S— Linking Atoms and Phenylmethacrylate
Groups:
tris(4-(2-methylprop-2-enoyloxy)phenylsulfanyl)bismuthane,
1,4-bis(di(4-(2-methylprop-2-enoyloxy)phenylsulfanyl)bismuthanyl)benzene,
1,3,5-tris(di(4-(2-methylprop-2-enoyloxy)phenylsulfanyl)
bismuthanyl)benzene,
tris(4-(2-methylprop-2-enoyloxy)phenylsulfanyl)stibane,
1,4-bis(di(4-(2-methylprop-2-enoyloxy)phenylsulfanyl)
stibanyl)benzene,
1,3,5-tris(di(4-(2-methylprop-2-enoyloxy)phenylsulfanyl)
stibanyl)benzene,
With —S— Linking Atoms and phenyl-2,4-pentadienoate
Groups:
tris(4-(penta-2,4-dienoyloxy)phenylsulfanyl)bismuthane,
1,4-bis(di(4-(penta-2,4-dienoyloxy)phenylsulfanyl)bismuthanyl)benzene,
1,3,5-tris(di(4-(penta-2,4-dienoyloxy)phenylsulfanyl)bismuthanyl)benzene,
tris(4-(penta-2,4-dienoyloxy)phenylsulfanyl)stibane,
1,4-bis(di(4-(penta-2,4-dienoyloxy)phenylsulfanyl)stibanyl)benzene,
1,3,5-tris(di(4-(penta-2,4-dienoyloxy)phenylsulfanyl)stibanyl)benzene,
With —S— Linking Atoms and Phenylacrylamide Groups:
tris(4-(prop-2-enoylamino)phenylsulfanyl)bismuthane,
1,4-bis(di(4-(prop-2-enoylamino)phenylsulfanyl)bismuthanyl)benzene,
1,3,5-tris(di(4-(prop-2-enoylamino)phenylsulfanyl)bismuthanyl)benzene,
tris(4-(prop-2-enoylamino)phenylsulfanyl)stibane, 1,4-bis(di(4-(prop-2-enoylamino)phenylsulfanyl)stibanyl)
benzene,
1,3,5-tris(di(4-(prop-2-enoylamino)phenylsulfanyl)stibanyl)benzene,
With —S— Linking Atoms and Phenylmethacrylamide Groups:
tris(4-(2-methylprop-2-enoylamino)phenylsulfanyl)bismuthane,
1,4-bis(di(4-(2-methylprop-2-enoylamino)phenylsulfanyl)bismuthanyl)benzene,
1,3,5-tris(di(4-(2-methylprop-2-enoylamino)phenylsulfanyl)bismuthanyl)benzene,
tris(4-(2-methylprop-2-enoylamino)phenylsulfanyl)stibane,
1,4-bis(di(4-(2-methylprop-2-enoylamino)phenylsulfanyl)stibanyl)benzene,
1,3,5-tris(di(4-(2-methylprop-2-enoylamino)phenylsulfanyl)stibanyl)benzene,
With —S— Linking Atoms and phenyl-2,4-pentadienamide Groups:
tris(4-(penta-2,4-dienoylamino)phenylsulfanyl)bismuthane,
1,4-bis(di(4-(penta-2,4-dienoylamino)phenylsulfanyl)bismuthanyl)benzene,
1,3,5-tris(di(4-(penta-2,4-dienoylamino)phenylsulfanyl)bismuthanyl)benzene,
tris(4-(penta-2,4-dienoylamino)phenylsulfanyl)stibane,
1,4-bis(di(4-(penta-2,4-dienoylamino)phenylsulfanyl)stibanyl)benzene,
1,3,5-tris(di(4-(penta-2,4-dienoylamino)phenylsulfanyl)stibanyl)benzene,
With —S— Linking Atoms and Vinylbenzoate Groups:
tris(4-(ethenoxycarbonyl)phenylsulfanyl)bismuthane,
1,4-bis(di(4-(ethenoxycarbonyl)phenylsulfanyl)bismuthanyl)benzene,
1,3,5-tris(di(4-(ethenoxycarbonyl)phenylsulfanyl)bismuthanyl)benzene,
tris(4-(ethenoxycarbonyl)phenylsulfanyl)stibane,
1,4-bis(di(4-(ethenoxycarbonyl)phenylsulfanyl)stibanyl)benzene,
1,3,5-tris(di(4-(ethenoxycarbonyl)phenylsulfanyl)stibanyl)benzene,
With —S— Linking Atoms and Isopropenylbenzoate Groups:
tris(4-(isopropenyloxycarbonyl)phenylsulfanyl)bismuthane,
1,4-bis(di(4-(isopropenyloxycarbonyl)phenylsulfanyl)bismuthanyl)benzene,
1,3,5-tris(di(4-(isopropenyloxycarbonyl)phenylsulfanyl)bismuthanyl)benzene,
tris(4-(isopropenyloxycarbonyl)phenylsulfanyl)stibane,
1,4-bis(di(4-(isopropenyloxycarbonyl)phenylsulfanyl)stibanyl)benzene,
1,3,5-tris(di(4-(isopropenyloxycarbonyl)phenylsulfanyl)stibanyl)benzene,
With —S— Linking Atoms and Butadienylbenzoate Groups:
tris(4-(buta-1,3-dienyloxycarbonyl)phenylsulfanyl)bismuthane,
1,4-bis(di(4-(buta-1,3-dienyloxycarbonyl)phenylsulfanyl)bismuthanyl)benzene,
1,3,5-tris(di(4-(buta-1,3-dienyloxycarbonyl)phenylsulfanyl)bismuthanyl)benzene,
tris(4-(buta-1,3-dienyloxycarbonyl)phenylsulfanyl)stibane,
1,4-bis(di(4-(buta-1,3-dienyloxycarbonyl)phenylsulfanyl)stibanyl)benzene,
1,3,5-tris(di(4-(buta-1,3-dienyloxycarbonyl)phenylsulfanyl)stibanyl)benzene,
With —S— Linking Atoms and N-Vinylbenzamide Groups:
tris(4-(ethenylcarbamoyl)phenylsulfanyl)bismuthane,
1,4-bis(di(4-(ethenylcarbamoyl)phenylsulfanyl)bismuthanyl)benzene,
1,3,5-tris(di(4-(ethenylcarbamoyl)phenylsulfanyl)bismuthanyl)benzene,
tris(4-(ethenylcarbamoyl)phenylsulfanyl)stibane,
1,4-bis(di(4-(ethenylcarbamoyl)phenylsulfanyl)stibanyl)benzene,
1,3,5-tris(di(4-(ethenylcarbamoyl)phenylsulfanyl)stibanyl)benzene,
With —S— Linking Atoms and N-isopropenylbenzamide Groups:
tris(4-(isopropenylcarbmoyl)phenylsulfanyl)bismuthane,
1,4-bis(di(4-(isopropenylcarbmoyl)phenylsulfanyl)bismuthanyl)benzene,
1,3,5-tris(di(4-(isopropenylcarbmoyl)phenylsulfanyl)bismuthanyl)benzene,
tris(4-(isopropenylcarbmoyl)phenylsulfanyl)stibane,
1,4-bis(di(4-(isopropenylcarbmoyl)phenylsulfanyl)stibanyl)benzene,
1,3,5-tris(di(4-(isopropenylcarbmoyl)phenylsulfanyl)stibanyl)benzene,
With —S— Linking Atoms and N-butadienylbenzamide Groups:
tris(4-(buta-1,3-dienylcarbamoyl)phenylsulfanyl)bismuthane,
1,4-bis(di(4-(buta-1,3-dienylcarbamoyl)phenylsulfanyl)bismuthanyl)benzene,
1,3,5-tris(di(4-(buta-1,3-dienylcarbamoyl)phenylsulfanyl)bismuthanyl)benzene,
tris(4-(buta-1,3-dienylcarbamoyl)phenylsulfanyl)stibane,
1,4-bis(di(4-(buta-1,3-dienylcarbamoyl)phenylsulfanyl)stibanyl)benzene,
1,3,5-tris(di(4-(buta-1,3-dienylcarbamoyl)phenylsulfanyl)stibanyl)benzene;
and derivatives thereof.

The organometallic molecule according to the present invention are characterized in that the smallest of the homolytic dissociation energies of the bond between the metal element M and a R group or the smallest homolytic dissociation energies of the bond between the metal element M and a linking atom or a linking group is preferably larger than about 40 kcal/mol and smaller than about 60 kcal/mol, such that the organometallic molecule has advantageous stability properties and such that upon DUV or EUV exposure the bond dissociates, and a metal radical species is formed. Most preferably, the smallest of the homolytic dissociation energies of the bond between the metal element M and a R group or the smallest of the homolytic dissociation energies of the bond between the metal element M and a linking atom or a linking is about 50 kcal/mol.

FIG. 18 displays the schematics of controlled/living radical polymerization of the exemplary organometallic molecule 5-(4-ethenylphenyl)-2,8-diethenyl-dibenzobismole. FIG. 18 (a) displays a specific example of a controlled/living radical polymerization reaction that can occur upon ultraviolet exposure. FIG. 18 (b) displays generalized the controlled/living radical polymerization reaction that occurs upon ultraviolet exposure.

Ab initio gas phase simulations of the bond energies, i.e., the homolytic dissociation energies, were performed of organobismuth(III) and organoantimony(III) molecules at the Perdew-Burke-Esnzerof and double-zeta valence polarizations (PBE/DZVP) level of theory to gain detailed understanding of the expected relative sensitivity of organobismuth(III) and organoantimony(III) molecules for organometallic photoresists for DUV or EUV lithography according to this invention.

For readability of chemical formulas below, Ph is a benzene/phenyl group, cHex is a cyclohexane group, A is an acrylate group, and Aa is an acrylamide group.

Simulations of the bond energies, i.e., the homolytic dissociation energies, of triphenylbismuthane, tricyclohexylbismuthane, tribenzylbismuthane, triphenylstibane, tricyclohexylstibane, and tribenzylstibane, which are representative for organobismuth(III) and organoantimony(III) molecules comprising Bi or Sb bonded to C only, i.e., organobismuth(III) and organoantimony(III) molecules comprising Bi or Sb bonded to styrene, cyclopentenyl, phenylacrylate, phenylacrylamide, vinylbenzoate, or N-vinylbenzamide groups, depicted in FIGS. 8, 9, 12, 13, 14, and 15, respectively (and, along the same lines, for organobismuth(III) and organoantimony(III) molecules comprising Bi or Sb bonded to and vinyl or ethenyl, isopropenyl, 1,3-butadienyl, alpha-methylstyrene, vinylstyrene, cyclohexenyl, cycloheptenyl, phenylmethacrylate, phenyl-2,4-pentadienoate, phenylmethacrylamide, phenyl-2,4-pentadienamide, isopropenylbenzoate, butadienylbenzoate, N-isopropenylbenzamide, or N-butadienylbenzamide groups, and for organobismuth(III) and organoantimony(III) molecules comprising —C(H)$_2$— linking groups), yield:

| | | |
|---|---|---|
| BiPh$_3$ | Bi—C | 56 kcal/mol |
| Bi(cHex)$_3$ | Bi—C | 40 kcal/mol |
| Bi(CH$_2$Ph)$_3$ | Bi—C | 38 kcal/mol |
| SbPh$_3$ | Sb—C | 61 kcal/mol |
| Sb(cHex)$_3$ | Sb—C | 45 kcal/mol |
| Sb(CH$_2$Ph)$_3$ | Sb—C | 43 kcal/mol |

Simulations of the bond energies, i.e., the homolytic dissociation energies, of tris(prop-2-enoyloxy)bismuthane, di(prop-2-enoyloxy)-phenylbismuthane, tris(prop-2-enoyloxy)stibane, and di(prop-2-enoyloxy)-phenylstibane, which are representative for organobismuth(III) and organoantimony(III) molecules comprising Bi or Sb bonded to acrylate groups depicted in FIG. 10 (and, along the same lines, for organobismuth(III) and organoantimony(III) molecules comprising Bi or Sb bonded to methacrylate or 2,4-pentadienoate groups), yield:

| | | | | |
|---|---|---|---|---|
| BiA$_3$ | Bi—O | 63 kcal/mol | | |
| BiPhA$_2$ | Bi—O | 70 kcal/mol | Bi—C | 49 kcal/mol |
| SbA$_3$ | Sb—O | 68 kcal/mol | | |
| SbPhA$_2$ | Sb—O | 69 kcal/mol | Sb—C | 55 kcal/mol |

For reference and contextual purposes, the acrylate's C—O and C—C bond energies are 105 kcal/mol and 71 kcal/mol, respectively; larger than above bond energies.

Simulations of the bond energies, i.e., the homolytic dissociation energies, of tris(prop-2-enoylamino)bismuthane, di(prop-2-enoylamino)-phenylbismuthane, tris(prop-2-enoylamino)stibane, and di(prop-2-enoylamino)-phenylstibane, which are representative for organobismuth(III) and organoantimony(III) molecules comprising Bi or Sb bonded to acrylamide groups depicted in FIG. 11 (and, along the same lines, for organobismuth(III) and organoantimony(III) molecules comprising Bi or Sb bonded to methacrylamide or 2,4-pentadienamide groups), yield:

| | | | | |
|---|---|---|---|---|
| BiAa$_3$ | Bi—N | 69 kcal/mol | | |
| BiPhAa$_2$ | Bi—N | 60 kcal/mol | Bi—C | 67 kcal/mol |
| SbAa$_3$ | Sb—N | 73 kcal/mol | | |
| SbPhAa$_2$ | Sb—N | 66 kcal/mol | Sb—C | 70 kcal/mol |

For reference and contextual purposes, the acrylamide's C—N and C—C bond energies are 92 kcal/mol and 98 kcal/mol, respectively; larger than above bond energies.

Simulations of the bond energies, i.e., the homolytic dissociation energies, of tri (diphenylamino)bismuthane, tri (diphenylphosphino)bismuthane, tri (diphenylamino) stibane, and tri (diphenylphosphino)stibane, which are representative for organobismuth(III) and organoantimony(III) molecules comprising —N(Ph)- or —P(Ph)- linking groups, yield:

| | | |
|---|---|---|
| Bi(NPh$_2$)$_3$ | Bi—N | 23 kcal/mol |
| Bi(PPh$_2$)$_3$ | Bi—P | 34 kcal/mol |
| Sb(NPh$_2$)$_3$ | Sb—N | 24 kcal/mol |
| Sb(PPh$_2$)$_3$ | Sb—P | 36 kcal/mol |

Simulations of the bond energies, i.e., the homolytic dissociation energies, of triphenoxybismuthane, diphenoxyphenylbismuthane, triphenoxystibane, and diphenoxy-phenylstibane, which are representative for organobismuth(III) and organoantimony(III) molecules comprising —O— linking atoms and styrene groups depicted in FIG. 16 (and, along the same lines, for organobismuth(III) and organoantimony (III) molecules comprising —O— linking atoms and vinyl or ethenyl, isopropenyl, 1,3-butadienyl, alpha-methylstyrene, vinylstyrene, cyclopentenyl, cyclohexenyl, cycloheptenyl, phenylacrylate, phenylmethacrylate, phenyl-2,4-pentadienoate, phenylacrylamide, phenylmethacrylamide, phenyl-2,4-pentadienamide, vinylbenzoate, isopropenylbenzoate, butadienylbenzoate, N-vinylbenzamide, N-isopropenylbenzamide, or N-butadienylbenzamide groups), yield:

| | | | | |
|---|---|---|---|---|
| Bi(OPh)$_3$ | Bi—O | 42 kcal/mol | | |
| BiPh(OPh)$_2$ | Bi—O | 37 kcal/mol | Bi—C | 55 kcal/mol |
| Sb(OPh)$_3$ | Sb—O | 47 kcal/mol | | |
| SbPh(OPh)$_2$ | Sb—O | 43 kcal/mol | Sb—C | 62 kcal/mol |

Simulations of the bond energies, i.e., the homolytic dissociation energies, of triphenylsulfanylbismuthane, diphenylsulfanyl-phenylbismuthane, triphenylsulfanylstibane, and diphenylsulfanyl-phenylstibane, which are representative for organobismuth(III) and organoantimony(III) molecules comprising —S— linking atoms and styrene groups depicted in FIG. 17 (and, along the same lines, for organobismuth(III) and organoantimony(III) molecules comprising —S— linking atoms and vinyl or ethenyl, isopropenyl, 1,3-butadienyl, alpha-methylstyrene, vinylstyrene, cyclopentenyl, cyclohexenyl, cycloheptenyl, phenylacrylate, phenylmethacrylate, phenyl-2,4-pentadienoate, phenylacrylamide, phenylmethacrylamide, phenyl-2,4-pentadienamide, vinylbenzoate, isopropenylbenzoate, butadienylbenzoate, N-vinylbenzamide, N-isopropenylbenzamide, or N-butadienylbenzamide groups), yield:

| | | | | |
|---|---|---|---|---|
| Bi(SPh)$_3$ | Bi—S | 47 kcal/mol | | |
| BiPh(SPh)$_2$ | Bi—S | 47 kcal/mol | Bi—C | 56 kcal/mol |
| Sb(SPh)$_3$ | Sb—S | 48 kcal/mol | | |
| SbPh(SPh)$_2$ | Sb—S | 49 kcal/mol | Sb—C | 61 kcal/mol |

Molecule stability considerations resulted in preferring organobismuth(III) and organoantimony(III) molecules with a lowest bond-energy, i.e., the lowest homolytic dissociation energy, larger than about 40 kcal/mol. Therefore: organobismuth(III) and organoantimony(III) molecules with R groups based on cyclohexyl or alkyl groups are less preferred. Furthermore, also organobismuth(III) and organoantimony(III) molecules comprising —N(Ph)- or —P(Ph)- linking groups are less preferred. Furthermore, also, for example, organobismuth(III) molecules comprising —C(H)$_2$— linking groups or —O— linking atoms are less preferred.

For reference and contextual purposes, ab initio gas phase simulations of the bond energies, i.e., the homolytic dissociation energies, were performed of the organotin (IV) molecule 2,5-dis(tri(prop-2-enoyloxy)stannyl)hexane (U.S. Patent Application Publication No. 2020/0041896), and of the organoantimony (V) molecule di(prop-2-enoyloxy)-triphenylstibane and organotellurium(IV) molecule di(prop-2-enoyloxy)-diphenyltellurium (James Passarelli, et al., Journal of Micro/Nanolithography, MEMS, and MOEMS, 14, 043503 (2015)) at the PBE/DZVP level of theory:

| | | | | |
|---|---|---|---|---|
| A$_3$Sn-L-SnA$_3$ | Sb—O | 77 kcal/mol | Sn—C | 50 kcal/mol |
| SbA$_2$Ph$_3$ | Sb—O | 75 kcal/mol | Sb—C | 53 kcal/mol |
| TeA$_2$Ph$_2$ | Te—O | 62 kcal/mol | Te—C | 67 kcal/mol |

Prior-art experiments found that 2,5-dis(tri(prop-2-enoyloxy)stannyl)hexane and di(prop-2-enoyloxy)-triphenylstibane can generally be advantageously used for EUV photoreactions, whereas di(prop-2-enoyloxy)-diphenyltellurium generally cannot.

Above reference simulations furthermore resulted in preferring organobismuth(III) and organoantimony(III) molecules with a lowest bond-energy, i.e., the lowest homolytic dissociation energy, smaller than about 60 kcal/mol. Therefore: organobismuth(III) and organoantimony(III) molecules comprising acrylamide groups, methacrylamide groups, or 2,4-pentadienamide groups are less preferred. Furthermore, also, for example, tris(prop-2-enoyloxy)bismuthane (BiA$_3$), tris(2-methylprop-2-enoyloxy)bismuthane, tris(penta-2,4-dienoyloxy)bismuthane, tris(prop-2-enoyloxy)stibane (SbA$_3$), tris(2-methylprop-2-enoyloxy)stibane, and tris(penta-2,4-dienoyloxy)stibane are less preferred.

Organobismuth (III) and organoantimony(III) molecules in above described lowest bond-energy range of about 40 kcal/mol to about 60 kcal/mol that have a lowest bond-energy, i.e., a lowest homolytic dissociation energy, of about 50 kcal/mol are most preferred. Therefore: examples of most preferred organobismuth(III) and organoantimony(III) molecules include organobismuth(III) and organoantimony(III) molecules comprising —S— linking atoms.

Sensitivity considerations furthermore resulted in preferring organobismuth(III) and organoantimony(III) molecules with n is 2 or 3 over molecules with n is 1; for somewhat larger organobismuth(III) or organoantimony(III) molecules a smaller number of controlled/living radical polymerization reactions is required to yield a solubility contrast in the ultraviolet exposed areas, while largely maintaining resolution or pattern quality.

Sensitivity considerations furthermore resulted in preferring organobismuth(III) and organoantimony(III) molecules in which all $R^{1,a}$ and $R^{2,n}$ groups present a polymerizable group over molecules with a smaller number of polymerizable groups. Controlled/living radical polymerization reactions scale with the product of radical concentration and polymerizable-unit concentration; it is therefore advantageous to have organobismuth(III) or organoantimony(III) molecules with a large concentration of polymerizable units.

Material's toxicity and chemical waste considerations furthermore resulted in preferring organobismuth(III) and organoantimony(III) molecules comprising vinyl or ethenyl, isopropenyl. 1,3-butadienyl, styrene, alpha-methylstyrene, vinylstyrene, cyclopentenyl, cyclohexenyl, cycloheptenyl, acrylamide, methacrylamide, 2,4-pentadienamide, phenylacrylamide, phenylmethacrylamide, phenyl-2,4-pentadienamide, vinylbenzoate, isopropenylbenzoate, butadienylbenzoate, N-vinylbenzamide, N-isopropenylbenzamide, or N-butadienylbenzamide groups over molecules comprising acrylate, methacrylate, 2,4-pentadienoate, phenylacrylate, phenylmethacrylate, or phenyl-2,4-pentadienoate groups. Furthermore, —Se-and-Te-linking atoms are less preferred.

Organobismuth (III) and organoantimony(III) molecules with R groups based on aryl groups, e.g., phenyl groups, have the advantage of extending the wavelength range that these organobismuth(III) or organoantimony(III) molecules will absorb light into the DUV. Organobismuth (III) or organoantimony(III) molecules taught here that comprise aryl groups, can be used for DUV lithography as well.

Particularly preferred embodiments of the organometallic molecules for organometallic photoresists for EUV lithography according to this invention include:
With Vinyl Groups:
1,4-bis(di(ethenyl)bismuthanyl)benzene,
1,3,5-tris(di(ethenyl)bismuthanyl)benzene,
1,4-bis(di(ethenyl)stibanyl)benzene,
1,3,5-tris(di(ethenyl)stibanyl)benzene,
With Isopropenyl Groups:
1,4-bis(di(propen-2-yl)bismuthanyl)benzene,
1,3,5-tris(di(propen-2-yl)bismuthanyl)benzene,
1,4-bis(di(propen-2-yl)stibanyl)benzene,
1,3,5-tris(di(propen-2-yl)stibanyl)benzene,
With 1,3-butadienyl Groups:
1,4-bis(di(buta-1,3-dien-1-yl)bismuthanyl)benzene,
1,3,5-tris(di(buta-1,3-dien-1-yl)bismuthanyl)benzene,
1,4-bis(di(buta-1,3-dien-1-yl)stibanyl)benzene,
1,3,5-tris(di(buta-1,3-dien-1-yl)stibanyl)benzene,
With Styrene Groups:
1,4-bis(2,8-diethenyl-dibenzobismol-5-yl)benzene,
1,3,5-tris(2,8-diethenyl-dibenzobismol-5-yl)benzene,
1,4-bis(2,8-diethenyl-dibenzostibol-5-yl)benzene,
1,3,5-tris(2,8-diethenyl-dibenzostibol-5-yl)benzene,
With Alpha-Methylstyrene Groups:
1,4-bis(di(4-propen-2-ylphenyl)bismuthanyl)benzene,
1,3,5-tris(di(4-propen-2-ylphenyl)bismuthanyl)benzene,
1,4-bis(di(4-propen-2-ylphenyl)stibanyl)benzene,
1,3,5-tris(di(4-propen-2-ylphenyl)stibanyl)benzene,
With Vinylstyrene Groups:
1,4-bis(di(4-buta-1,3-dien-1-ylphenyl)bismuthanyl)benzene,
1,3,5-tris(di(4-buta-1,3-dien-1-ylphenyl)bismuthanyl)benzene,
1,4-bis(di(4-buta-1,3-dien-1-ylphenyl)stibanyl)benzene,
1,3,5-tris(di(4-buta-1,3-dien-1-ylphenyl)stibanyl)benzene, With Cyclopentenyl Groups:
1,4-bis(cyclopent-2-enyl)-bismuthanyl)benzene,
1,3,5-tris(di(cyclopent-2-enyl)bismuthanyl)benzene,
1,4-bis(di(cyclopent-2-enyl)stibanyl)benzene,
1,3,5-tris(di(cyclopent-2-enyl)stibanyl)benzene,
With Cyclohexenyl Groups:
1,4-bis(cyclohex-2-enyl)-bismuthanyl)benzene,
1,3,5-tris(di(cyclohex-2-enyl)bismuthanyl)benzene,
1,4-bis(di(cyclohex-2-enyl)stibanyl)benzene,
1,3,5-tris(di(cyclohex-2-enyl)stibanyl)benzene,
With Cycloheptenyl Groups:
1,4-bis(cyclohept-2-enyl)-bismuthanyl)benzene,
1,3,5-tris(di(cyclohept-2-enyl)bismuthanyl)benzene,
1,4-bis(di(cyclohept-2-enyl)stibanyl)benzene,
1,3,5-tris(di(cyclohept-2-enyl)stibanyl)benzene,
With Phenylacrylamide Groups:
1,4-bis(di(4-(prop-2-enoylamino)phenyl)bismuthanyl)benzene,
1,3,5-tris(di(4-(prop-2-enoylamino)phenyl)bismuthanyl)benzene,
1,4-bis(di(4-(prop-2-enoylamino)phenyl)stibanyl)benzene,
1,3,5-tris(di(4-(prop-2-enoylamino)phenyl)stibanyl)benzene,
With Phenylmethacrylamide Groups:
1,4-bis(di(4-(2-methylprop-2-enoylamino)phenyl)bismuthanyl)benzene,
1,3,5-tris(di(4-(2-methylprop-2-enoylamino)phenyl)bismuthanyl)benzene,
1,4-bis(di(4-(2-methylprop-2-enoylamino)phenyl)stibanyl)benzene,
1,3,5-tris(di(4-(2-methylprop-2-enoylamino)phenyl)stibanyl)benzene,
With phenyl-2,4-pentadienamide Groups:
1,4-bis(di(4-(penta-2,4-dienoylamino)phenyl)bismuthanyl)benzene,
1,3,5-tris(di(4-(penta-2,4-dienoylamino)phenyl)bismuthanyl)benzene,
1,4-bis(di(4-(penta-2,4-dienoylamino)phenyl)stibanyl)benzene,
1,3,5-tris(di(4-(penta-2,4-dienoylamino)phenyl)stibanyl)benzene,
With Vinylbenzoate Groups:
1,4-bis(di(4-(ethenoxycarbonyl)phenyl)bismuthanyl)benzene,
1,3,5-tris(di(4-(ethenoxycarbonyl)phenyl)bismuthanyl)benzene,
1,4-bis(di(4-(ethenoxycarbonyl)phenyl)stibanyl)benzene,
1,3,5-tris(di(4-(ethenoxycarbonyl)phenyl)stibanyl)benzene,
With Isopropenylbenzoate Groups:
1,4-bis(di(4-(isopropenyloxycarbonyl)phenyl)bismuthanyl)benzene,
1,3,5-tris(di(4-(isopropenyloxycarbonyl)phenyl)bismuthanyl)benzene,
1,4-bis(di(4-(isopropenyloxycarbonyl)phenyl)stibanyl)benzene,
1,3,5-tris(di(4-(isopropenyloxycarbonyl)phenyl)stibanyl)benzene,
With Butadienylbenzoate Groups:
1,4-bis(di(4-(buta-1,3-dienyloxycarbonyl)phenyl)bismuthanyl)benzene,
1,3,5-tris(di(4-(buta-1,3-dienyloxycarbonyl)phenyl)bismuthanyl)benzene,
1,4-bis(di(4-(buta-1,3-dienyloxycarbonyl)phenyl)stibanyl)benzene,
1,3,5-tris(di(4-(buta-1,3-dienyloxycarbonyl)phenyl)stibanyl)benzene,
With N-vinylbenzamide Groups:
1,4-bis(di(4-(ethenylcarbamoyl)phenyl)bismuthanyl)benzene,
1,3,5-tris(di(4-(ethenylcarbamoyl)phenyl)bismuthanyl)benzene,
1,4-bis(di(4-(ethenylcarbamoyl)phenyl)stibanyl)benzene,
1,3,5-tris(di(4-(ethenylcarbamoyl)phenyl)stibanyl)benzene,
With N-isopropenylbenzamide Groups:
1,4-bis(di(4-(isopropenylcarbmoyl)phenyl)bismuthanyl)benzene,
1,3,5-tris(di(4-(isopropenylcarbmoyl)phenyl)bismuthanyl)benzene,
1,4-bis(di(4-(isopropenylcarbmoyl)phenyl)stibanyl)benzene,
1,3,5-tris(di(4-(isopropenylcarbmoyl)phenyl)stibanyl)benzene,
With N-butadienylbenzamide Groups:
1,4-bis(di(4-(buta-1,3-dienylcarbamoyl)phenyl)bismuthanyl)benzene,
1,3,5-tris(di(4-(buta-1,3-dienylcarbamoyl)phenyl)bismuthanyl)benzene,
1,4-bis(di(4-(buta-1,3-dienylcarbamoyl)phenyl)stibanyl)benzene,
1,3,5-tris(di(4-(buta-1,3-dienylcarbamoyl)phenyl)stibanyl)benzene,
With —O— Linking Atoms and Vinyl Groups:
1,4-bis(di(ethenyloxy)stibanyl)benzene,
1,3,5-tris(di(ethenyloxy)stibanyl)benzene,
With —O— Linking Atoms and Isopropenyl Groups:
1,4-bis(di(propen-2-yloxy)stibanyl)benzene,
1,3,5-tris(di(propen-2-yloxy)stibanyl)benzene,
With —O— Linking Atoms and 1,3-butadienyl Groups:
1,4-bis(di(buta-1,3-dien-1-yloxy)stibanyl)benzene,
1,3,5-tris(di(buta-1,3-dien-1-yloxy)stibanyl)benzene,
With —O— Linking Atoms and Styrene Groups:
1,4-bis(di(4-ethenylphenoxy)stibanyl)benzene,
1,3,5-tris(di(4-ethenylphenoxy)stibanyl)benzene,
With —O— Linking Atoms and alpha-methylstyrene Groups:
1,4-bis(di(4-propen-2-ylphenoxy)stibanyl)benzene,
1,3,5-tris(di(4-propen-2-ylphenoxy)stibanyl)benzene,
With —O— Linking Atoms and Vinylstyrene Groups:
1,4-bis(di(4-buta-1,3-dien-1-ylphenoxy)stibanyl)benzene,
1,3,5-tris(di(4-buta-1,3-dien-1-ylphenoxy)stibanyl)benzene,
With —O— Linking Atoms and Cyclopentenyl Groups:
1,4-bis(di(cyclopent-2-enyloxy)stibanyl)benzene,
1,3,5-tris(di(cyclopent-2-enyloxy)stibanyl)benzene,
With —O— Linking Atoms and Cyclohexenyl Groups:
1,4-bis(di(cyclohex-2-enyloxy)stibanyl)benzene,
1,3,5-tris(di(cyclohex-2-enyloxy)stibanyl)benzene,
With —O— Linking Atoms and Cycloheptenyl Groups:
1,4-bis(di(cyclohept-2-enyloxy)stibanyl)benzene,
1,3,5-tris(di(cyclohept-2-enyloxy)stibanyl)benzene,
With —O— Linking Atoms and Phenylacrylamide Groups:
1,4-bis(di(4-(prop-2-enoylamino)phenoxy)stibanyl)benzene,
1,3,5-tris(di(4-(prop-2-enoylamino)phenoxy)stibanyl)benzene,
With —O— Linking Atoms and Phenylmethacrylamide Groups:
1,4-bis(di(4-(2-methylprop-2-enoylamino)phenoxy)stibanyl)benzene,
1,3,5-tris(di(4-(2-methylprop-2-enoylamino)phenoxy)stibanyl)benzene, With —O— Linking Atoms and phenyl-2,4-pentadienamide Groups:
1,4-bis(di(4-(penta-2,4-dienoylamino)phenoxy)stibanyl)benzene,
1,3,5-tris(di(4-(penta-2,4-dienoylamino)phenoxy)stibanyl)benzene,
With —O— Linking Atoms and Vinylbenzoate Groups:
1,4-bis(di(4-(ethenoxycarbonyl)phenoxy)stibanyl)benzene,
1,3,5-tris(di(4-(ethenoxycarbonyl)phenoxy)stibanyl)benzene,
With —O— Linking Atoms and Isopropenylbenzoate Groups:
1,4-bis(di(4-(isopropenyloxycarbonyl)phenoxy)stibanyl)benzene,
1,3,5-tris(di(4-(isopropenyloxycarbonyl)phenoxy)stibanyl)benzene,
With —O— Linking Atoms and Butadienylbenzoate Groups:
1,4-bis(di(4-(buta-1,3-dienyloxycarbonyl)phenoxy)stibanyl)benzene,
1,3,5-tris(di(4-(buta-1,3-dienyloxycarbonyl)phenoxy)stibanyl)benzene,
With —O— Linking Atoms and N-vinylbenzamide Groups:
1,4-bis(di(4-(ethenylcarbamoyl)phenoxy)stibanyl)benzene,
1,3,5-tris(di(4-(ethenylcarbamoyl)phenoxy)stibanyl)benzene,
With —O— Linking Atoms and N-isopropenylbenzamide Groups:
1,4-bis(di(4-(isopropenylcarbmoyl)phenoxy)stibanyl)benzene,
1,3,5-tris(di(4-(isopropenylcarbmoyl)phenoxy)stibanyl)benzene,
With —O— Linking Atoms and N-butadienylbenzamide Groups:
1,4-bis(di(4-(buta-1,3-dienylcarbamoyl)phenoxy)stibanyl)benzene,
1,3,5-tris(di(4-(buta-1,3-dienylcarbamoyl)phenoxy)stibanyl)benzene,
With —S— Linking Atoms and Vinyl Groups:
1,4-bis(di(ethenylsulfanyl)bismuthanyl)benzene,
1,3,5-tris(di(ethenylsulfanyl)bismuthanyl)benzene,
1,4-bis(di(ethenylsulfanyl)stibanyl)benzene,
1,3,5-tris(di(ethenylsulfanyl)stibanyl)benzene,
With —S— Linking Atoms and Isopropenyl Groups:
1,4-bis(di(propen-2-ylsulfanyl)bismuthanyl)benzene,
1,3,5-tris(di(propen-2-ylsulfanyl)bismuthanyl)benzene,
1,4-bis(di(propen-2-ylsulfanyl)stibanyl)benzene,
1,3,5-tris(di(propen-2-ylsulfanyl)stibanyl)benzene,
With —S— Linking Atoms and 1,3-butadienyl Groups:
1,4-bis(di(buta-1,3-dien-1-ylsulfanyl)bismuthanyl)benzene,
1,3,5-tris(di(buta-1,3-dien-1-ylsulfanyl)bismuthanyl)benzene,
1,4-bis(di(buta-1,3-dien-1-ylsulfanyl)stibanyl)benzene,
1,3,5-tris(di(buta-1,3-dien-1-ylsulfanyl)stibanyl)benzene,
With —S— Linking Atoms and Styrene Groups:
1,4-bis(di(4-ethenylphenylsulfanyl)bismuthanyl)benzene,
1,3,5-tris(di(4-ethenylphenylsulfanyl)bismuthanyl)benzene,
1,4-bis(di(4-ethenylphenylsulfanyl)stibanyl)benzene,
1,3,5-tris(di(4-ethenylphenylsulfanyl)stibanyl)benzene,
With —S— Linking Atoms and alpha-methylstyrene Groups:
1,4-bis(di(4-propen-2-ylphenylsulfanyl)bismuthanyl)benzene,
1,3,5-tris(di(4-propen-2-ylphenylsulfanyl)bismuthanyl)benzene,
1,4-bis(di(4-propen-2-ylphenylsulfanyl)stibanyl)benzene,
1,3,5-tris(di(4-propen-2-ylphenylsulfanyl)stibanyl)benzene,
With —S— Linking Atoms and Vinylstyrene Groups:
1,4-bis(di(4-buta-1,3-dien-1-ylphenylsulfanyl)bismuthanyl)benzene,
1,3,5-tris(di(4-buta-1,3-dien-1-ylphenylsulfanyl)bismuthanyl)benzene,
1,4-bis(di(4-buta-1,3-dien-1-ylphenylsulfanyl)stibanyl)benzene,
1,3,5-tris(di(4-buta-1,3-dien-1-ylphenylsulfanyl)stibanyl)benzene,
With —S— Linking Atoms and Cyclopentenyl Groups:
1,4-bis(cyclopent-2-enylsulfanyl)-bismuthanyl)benzene,
1,3,5-tris(di(cyclopent-2-enylsulfanyl)bismuthanyl)benzene,
1,4-bis(di(cyclopent-2-enylsulfanyl)stibanyl)benzene,
1,3,5-tris(di(cyclopent-2-enylsulfanyl)stibanyl)benzene,
With —S— Linking Atoms and Cyclohexenyl Groups:
1,4-bis(cyclohex-2-enylsulfanyl)-bismuthanyl)benzene,
1,3,5-tris(di(cyclohex-2-enylsulfanyl)bismuthanyl)benzene,
1,4-bis(di(cyclohex-2-enylsulfanyl)stibanyl)benzene,
1,3,5-tris(di(cyclohex-2-enylsulfanyl)stibanyl)benzene,
With —S— Linking Atoms and Cycloheptenyl Groups:
1,4-bis(cyclohept-2-enylsulfanyl)-bismuthanyl)benzene,
1,3,5-tris(di(cyclohept-2-enylsulfanyl)bismuthanyl)benzene,
1,4-bis(di(cyclohept-2-enylsulfanyl)stibanyl)benzene,
1,3,5-tris(di(cyclohept-2-enylsulfanyl)stibanyl)benzene,
With —S— Linking Atoms and Phenylacrylamide Groups:
1,4-bis(di(4-(prop-2-enoylamino)phenylsulfanyl)bismuthanyl)benzene,
1,3,5-tris(di(4-(prop-2-enoylamino)phenylsulfanyl)bismuthanyl)benzene,
1,4-bis(di(4-(prop-2-enoylamino)phenylsulfanyl)stibanyl)benzene,
1,3,5-tris(di(4-(prop-2-enoylamino)phenylsulfanyl)stibanyl)benzene,
With —S— Linking Atoms and Phenylmethacrylamide Groups:
1,4-bis(di(4-(2-methylprop-2-enoylamino)phenylsulfanyl)bismuthanyl)benzene,
1,3,5-tris(di(4-(2-methylprop-2-enoylamino)phenylsulfanyl)bismuthanyl)benzene,
1,4-bis(di(4-(2-methylprop-2-enoylamino)phenylsulfanyl)stibanyl)benzene,
1,3,5-tris(di(4-(2-methylprop-2-enoylamino)phenylsulfanyl)stibanyl)benzene,
With —S— Linking Atoms and Phenyl-2,4-pentadienamide Groups:
1,4-bis(di(4-(penta-2,4-dienoylamino)phenylsulfanyl)bismuthanyl)benzene,
1,3,5-tris(di(4-(penta-2,4-dienoylamino)phenylsulfanyl)bismuthanyl)benzene,
1,4-bis(di(4-(penta-2,4-dienoylamino)phenylsulfanyl)stibanyl)benzene,
1,3,5-tris(di(4-(penta-2,4-dienoylamino)phenylsulfanyl)stibanyl)benzene,
With —S— Linking Atoms and Vinylbenzoate Groups:
1,4-bis(di(4-(ethenoxycarbonyl)phenylsulfanyl)bismuthanyl)benzene,
1,3,5-tris(di(4-(ethenoxycarbonyl)phenylsulfanyl)bismuthanyl)benzene,
1,4-bis(di(4-(ethenoxycarbonyl)phenylsulfanyl)stibanyl)benzene,
1,3,5-tris(di(4-(ethenoxycarbonyl)phenylsulfanyl)stibanyl)benzene, With —S— Linking Atoms and Isopropenylbenzoate Groups:
1,4-bis(di(4-(isopropenyloxycarbonyl)phenylsulfanyl)bismuthanyl)benzene,
1,3,5-tris(di(4-(isopropenyloxycarbonyl)phenylsulfanyl) bismuthanyl)benzene,
1,4-bis(di(4-(isopropenyloxycarbonyl)phenylsulfanyl)stibanyl)benzene,
1,3,5-tris(di(4-(isopropenyloxycarbonyl)phenylsulfanyl) stibanyl)benzene,
With —S— Linking Atoms and Butadienylbenzoate Groups:
1,4-bis(di(4-(buta-1,3-dienyloxycarbonyl)phenylsulfanyl) bismuthanyl)benzene,
1,3,5-tris(di(4-(buta-1,3-dienyloxycarbonyl)phenylsulfanyl) bismuthanyl)benzene,
1,4-bis(di(4-(buta-1,3-dienyloxycarbonyl)phenylsulfanyl) stibanyl)benzene,
1,3,5-tris(di(4-(buta-1,3-dienyloxycarbonyl)phenylsulfanyl) stibanyl)benzene,
With —S— Linking Atoms and N-Vinylbenzamide Groups:
1,4-bis(di(4-(ethenylcarbamoyl)phenylsulfanyl)bismuthanyl)benzene,
1,3,5-tris(di(4-(ethenylcarbamoyl)phenylsulfanyl)bismuthanyl)benzene,
1,4-bis(di(4-(ethenylcarbamoyl)phenylsulfanyl)stibanyl) benzene,
1,3,5-tris(di(4-(ethenylcarbamoyl)phenylsulfanyl)stibanyl) benzene,
With —S— Linking Atoms and N-isopropenylbenzamide Groups:
1,4-bis(di(4-(isopropenylcarbmoyl)phenylsulfanyl)bismuthanyl)benzene,
1,3,5-tris(di(4-(isopropenylcarbmoyl)phenylsulfanyl)bismuthanyl)benzene,
1,4-bis(di(4-(isopropenylcarbmoyl)phenylsulfanyl)stibanyl) benzene,
1,3,5-tris(di(4-(isopropenylcarbmoyl)phenylsulfanyl)stibanyl)benzene,
With —S— Linking Atoms and N-butadienylbenzamide Groups:
1,4-bis(di(4-(buta-1,3-dienylcarbamoyl)phenylsulfanyl)bismuthanyl)benzene,
1,3,5-tris(di(4-(buta-1,3-dienylcarbamoyl)phenylsulfanyl) bismuthanyl)benzene,
1,4-bis(di(4-(buta-1,3-dienylcarbamoyl)phenylsulfanyl) stibanyl)benzene,
1,3,5-tris(di(4-(buta-1,3-dienylcarbamoyl)phenylsulfanyl) stibanyl)benzene;
and derivatives thereof.

The synthesis of the organometallic molecules according to the present invention is described exemplary for 1,4-bis (2,8-diethenyl-dibenzobismol-5-yl)benzene. A solution of 2,2'-dilithio-5,5'-diethenyl biphenyl (2 eq, 10 mmol) in ether (50 ml) was added to 1,4-bis(diiodobismuthanyl)benzene (1 eq, 5 mmol) in ether-tetrahydrofuran (10 ml) at room temperature. The mixture was further refluxed for 1 h, then cooled and poured into water. After extraction and concentration, the residue was recrystalized to yield the desired compound.

The synthesis of the organometallic molecules with linking atom according to the present invention is described exemplary for 1,4-bis(di(4-ethenylphenylsulfanyl)bismuthanyl)benzene. A solution of 1,4-bis[tris[bis(trimethylsilyl)amide]bismuthanyl]benzene (1 eq, 1 mmol) in light petroleum (10 ml) was added to 4-ethenylbenzene-1-thiol (4 eq, 4 mmol) in the same solvent (40 ml) at room temperature. The resulting solution was stirred for 1 h and then the solvent was removed in vacuo. The residue was recrystallized from MeCN-ethyl acetate to yield the desired compound.

Due to their distinguished properties as described above, the organometallic molecules according to the present invention, can be formulated into organometallic photoresist compositions that are useful in lithographic processes.

Hence, in a further aspect, the present invention relates to an organometallic photoresist composition, comprising the organometallic molecule according to the present invention.

The content of the organometallic molecule in the organometallic photoresist composition is preferably about 5 to 95% by weight, more preferably 10 to 80% by weight, most preferably 10 to 50% by weight, based on the total weight of the photoresist composition.

The organometallic molecule is preferably capable of undergoing chemical transformations upon exposure of the photoresist composition, in particular DUV irradiation or EUV irradiation, whereby a differential in the solubility of the polymer in either the exposed regions or the unexposed regions is created.

The organometallic photoresist compositions of the invention preferably contain a solvent which is capable of dissolving the organometallic molecule. Examples of such solvents include, but are not limited to, ethers, glycol ethers, aromatic hydrocarbons, ketones, esters and the like. A solvent system including a mixture of the aforementioned solvents is also contemplated herein. Suitable glycol ethers include 2-methoxyethyl ether (diglyme), ethylene glycol monomethyl ether, propylene glycol monomethyl ether, propylene glycol monomethylether acetate (PGMEA) and the like. Suitable aromatic hydrocarbon solvents include toluene, xylene, and benzene. Examples of ketones include methylisobutylketone, 2-heptanone, cycloheptanone, and cyclohexanone. An example of an ether solvent is tetrahydrofuran, whereas ethyl lactate and ethoxy ethyl propionate are examples of ester solvents that may be employed herein.

In addition to the above components, the photoresist composition may also include other components such as a photosensitizer, a pigment, a filler, an antistatic agent, a flame retardant, a defoaming agent, a light stabilizer, an antioxidant, or other additives. If desired, combinations or mixtures of these other components may be used.

The organometallic photoresists for DUV or EUV lithography that comprise the organobismuth(III) or organoantimony(III) molecules according to the present invention, have an improved EUV sensitivity and an improved resolution compared to currently available chemically amplified photoresists for EUV lithography. Organometallic photoresists for DUV or EUV lithography that comprise the organobismuth(III) or organoantimony(III) molecules according to the present invention, have an improved EUV sensitivity compared to organometallic photoresists comprising molecules that crosslink and that don't polymerize (such as organotin clusters disclosed in U.S. Pat. No. 10,775,696). The reason being that controlled/living radical polymerization and crosslinking (which is a termination reaction) scale with the product of radical concentration and polymerizable-unit concentration, and radical concentration squared, respectively; the product of radical concentration and polymerizable-unit concentration is generally larger than the radical concentration squared.

The organometallic photoresists for DUV or EUV lithography that comprise the organobismuth(III) or organoantimony(III) molecules taught here, have an improved resolution or pattern quality compared to organometallic photoresists comprising molecules that polymerize through conventional free-radical polymerization (such as organotin molecules that comprise acrylate groups disclosed in U.S. Patent Application Publication No. 2020/0041896 and organobismuth (V) or organoantimony (V) polymerizable-carboxylate resist platforms).

The organometallic photoresists for DUV or EUV lithography that comprise the organobismuth(III) or organoantimony(III) molecules taught here, have a material's toxicity and chemical waste advantage over currently available chemically amplified photoresists comprising fluorinated photoacid generators and over organometallic photoresists comprising organotin molecules. Organometallic photoresists for DUV or EUV lithography that comprise the organobismuth(III) or organoantimony(III) molecules with vinyl or ethenyl, isopropenyl, 1,3-butadienyl, styrene, alpha-methylstyrene, vinylstyrene, cyclopentenyl, cyclohexenyl, cycloheptenyl, acrylamide, methacrylamide, 2,4-pentadienamide, phenylacrylamide, phenylmethacrylamide, phenyl-2,4-pentadienamide, vinylbenzoate, isopropenylbenzoate, butadienylbenzoate, N-vinylbenzamide, N-isopropenylbenzamide, or N-butadienylbenzamide groups taught here, are particularly appealing as these molecules generally have a toxicity advantage over molecules comprising acrylate, methacrylate, 2,4-pentadienoate, phenylacrylate, phenylmethacrylate, or phenyl-2,4-pentadienoate groups.

The organometallic photoresists for DUV or EUV lithography that comprise the organobismuth(III) or organoantimony(III) molecules taught here are primarily intended for EUV lithography; these organometallic photoresists can however be used for DUV lithography as well.

In a further aspect, the present invention also encompasses a method for using the photoresist composition of the invention to form patterned material features on a substrate. As substrate in the present invention is suitable any substrate conventionally used in processes involving photoresists. For example, the substrate can be silicon, silicon oxide, aluminium, aluminium oxide, gallium arsenide, ceramic, quartz, copper, or any combination thereof, including multilayers. In particular, the substrate comprises a material surface which may comprise a metal conductor layer, a ceramic insulator layer, a semiconductor layer or other material depending on the stage of the manufacture process and the desired material set for the end product. The organometallic photoresist composition of the invention is especially useful for EUV lithographic processes used in the manufacture of integrated circuits on semiconductor substrates but can be used for DUV lithography as well. The organometallic photoresist composition of the invention used in lithographic processes create patterned material layer structures such as metal wiring lines, holes for contacts or vias, insulation sections (e.g., damascene trenches or shallow trench isolation), trenches for capacitor structures, ion implanted semiconductor structures for transistors, and the like as might be used in integrated circuit devices.

After exposure, the photoresist structure with the desired pattern is obtained or developed by contacting the photoresist layer with an aqueous alkaline solution which selectively dissolves the areas of the photoresist which were exposed to radiation in the case of a positive photoresist (or the unexposed areas in the case of a negative photoresist). Some aqueous alkaline solutions or developers comprise aqueous solutions of tetramethyl ammonium hydroxide. The resulting lithographic structure on the substrate is then typically dried to remove any remaining developer. If a top coat has been used, it can be dissolved by the developer in this step.

The pattern from the photoresist structure may then be transferred to the exposed portions of underlying material of the substrate by etching with a suitable etchant using techniques known in the art. In one embodiment the transfer is done by reactive ion etching or by wet etching. Once the desired pattern transfer has taken place, any remaining photoresist may be removed using conventional stripping techniques. Alternatively, the pattern may be transferred by ion implantation to form a pattern of ion implanted material.

In a preferred variant of the method according to the present invention, the energy ray with which the patternwise irradiation of the photoresist composition is conducted, is a DUV irradiation or preferably an EUV irradiation.

The invention claimed is:

1. An organometallic photoresist composition comprising:
    a first organometallic molecule having at least Bi as a metal element, and having an oxidation state of 3+, and at least one first organometallic molecule polymerizable group R, wherein the first organometallic molecule is sensitive to DUV and EUV radiation;
    a second organometallic molecule having at least Sb as a metal element, and having an oxidation state of 3+, and at least one second organometallic molecule polymerizable group R, wherein the second organometallic molecule is sensitive to DUV and EUV radiation;
    a solvent that dissolves the first and second organometallic molecules.

2. The organometallic photoresist composition according to claim 1, wherein both the first organometallic molecule and the second organometallic molecule have the general formula (I):

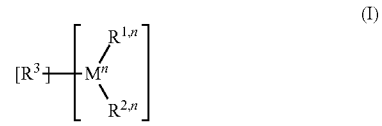

wherein
    M represents the metal element;
    at least one R group of $R^1$, $R^2$ and $R^3$ represents the polymerizable group;
    the remaining R group(s) of $R^1$, $R^2$ and $R^3$ represent a non-polymerizable group; and
    n is an integer in a range from 1 to the maximum number of hydrogen atoms of the $R^3$ group.

3. The organometallic photoresist composition according to claim 2, wherein n is an integer in a range from 1 to 12.

4. The organometallic photoresist composition according to claim 1, wherein the first organometallic molecule has one of the general formulae (a), (b), or (c), and the second organometallic molecule has one of the general formulae (d), (e), or (f):

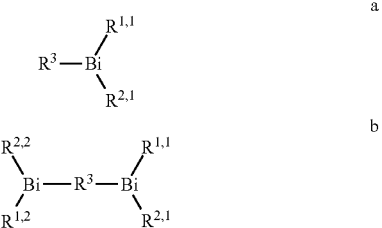

-continued

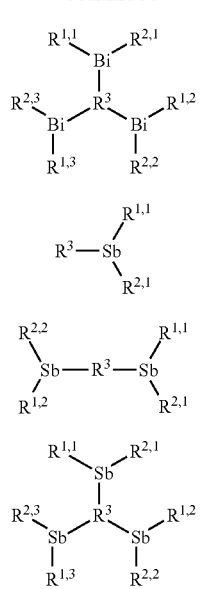

wherein
at least one R group of $R^1$, $R^2$ and $R^3$ represents the polymerizable group; and
the remaining R group(s) of $R^1$, $R^2$ and $R^3$ represent a non-polymerizable group.

5. The organometallic photoresist composition according to claim 2, wherein the polymerizable group is selected from the group consisting of a linear, a branched, a cyclic, or a heterocyclic unsaturated monomer having an alkenyl group or an alkynyl group.

6. The organometallic photoresist composition according to claim 2, wherein the polymerizable group is selected from the group consisting of vinyl, isopropenyl, 1,3-butadienyl, styrene, alpha-methylstyrene, vinylstyrene, cyclopentenyl, cyclohexenyl, cycloheptenyl, acrylate, methacrylate, 2,4-pentadienoate, acrylamide, methacrylamide, 2,4-pentadienamide, phenylacrylate, phenylmethacrylate, phenyl-2,4-pentadienoate, phenylacrylamide, phenylmethacrylamide, phenyl-2,4-pentadienamide, vinylbenzoate, isopropenylbenzoate, butadienylbenzoate, N-vinylbenzamide, N-isopropenylbenzamide, N-butadienylbenzamide, and derivatives thereof; and/or the non-polymerizable group is selected from the group consisting of linear or branched or a cyclic unsubstituted or substituted alkyl group having 1 to 20 carbon atoms; an unsubstituted or substituted aryl group having 3 to 30 carbon atoms; an unsubstituted or an unsubstituted unsaturated or a saturated heterocyclic group having a 3 to 30 membered ring; and derivatives thereof.

7. The organometallic photoresist composition according to claim 6, wherein the linear or the branched alkyl group is selected from the group consisting of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, icosayl, and derivatives thereof; and/or the cyclic alkyl group is selected from the group consisting of cyclopentane, cyclohexane, cycloheptane, cyclooctane, and derivatives thereof; and/or the aryl group is selected from the group consisting of phenyl, naphthyl, anthracenyl, phenanthrenyl, and derivatives thereof; and/or the saturated or unsaturated heterocyclic group having one or two heteroatoms is selected from the group consisting of pyrrolidine, pyrrole, tetrahydrofuran, furan, tetrahydrothiophene, thiophene, imidazolidine, imidazole, oxazolidine, oxyzole, thiazolidine, thiazole, dioxolane, dithiolane, piperidine, pyridine, tetrahydropyran, pyran, thiane, thiopyran, diazinane, diazine, in particular pyridazin (1,2-diazin), pyrimidine (1,3-diazin) and pyrazin (1,4-diazin), morpholine, oxazine, thiomorpholine, thiazine, dioxane, dioxine, dithiane, dithiin, quinolone, isoquinoline, and derivatives thereof.

8. The organometallic photoresist composition according to claim 2, wherein the R groups are either separated from each other or at least two R groups are connected via a covalent bond, or a connecting atom, selected from the group consisting of —C—, —O—, —S—, or a connecting group, selected from the group consisting of —C(O)—, —S(O)—, and —S(O)$_2$—, between any of two C atoms of the two R groups.

9. The organometallic photoresist composition according to 2, wherein all R groups are polymerizable groups.

10. The organometallic photoresist composition according to claim 2, further comprising a linking atom or linking group between at least one R group and the metal element M.

11. The organometallic photoresist composition according to claim 10, wherein the linking atom is selected from the group consisting of —O—, —S—, —Se—, —Te—, and/or the linking group is selected from the group consisting of —C(H)$_2$—, —N(X)—, and —P(X)—, wherein X is selected from the group consisting linear or branched or a cyclic unsubstituted or substituted alkyl group having 1 to 20 carbon atoms; an unsubstituted or substituted aryl group having 3 to 30 carbon atoms; an unsubstituted or a substituted unsaturated or a saturated heterocyclic group having a 3 to 30 membered ring; and derivatives thereof.

12. The organometallic photoresist composition according to claim 1, comprising from 10 to 80% by weight, based on the total weight of the photoresist composition, of the first organometallic molecule and the second organometallic molecule, and
the solvent is selected from the group consisting of a glycol ether, an aromatic hydrocarbon, an ester and mixtures thereof.

13. The organometallic photoresist composition according to claim 2, wherein the smallest of the homolytic dissociation energies of the bond between the metal element M and a R group or of the bond between the metal element M and a linking atom or a linking group is larger than 40 kcal/mol and smaller than 60 kcal/mol.

14. The organometallic photoresist composition according to claim 12, wherein the first organometallic molecule is an organobismuth(III) molecule and the second organometallic molecule is an organoantimony(III) molecule, wherein the organobismuth(III) and the organoantimony(III) molecules are selected from the group consisting of:
tris(ethenyl)bismuthane,
1,4-bis(di(ethenyl)bismuthanyl)benzene,
1,3,5-tris(di(ethenyl)bismuthanyl)benzene,
1,4-bis(di(ethenyl)stibanyl)benzene,
1,3,5-tris(di(ethenyl)stibanyl)benzene,
tris(propen-2-yl)bismuthane,
1,4-bis(di(propen-2-yl)bismuthanyl)benzene,
1,3,5-tris(di(propen-2-yl)bismuthanyl)benzene,
tris(propen-2-yl)stibane,
1,4-bis(di(propen-2-yl)stibanyl)benzene,
1,3,5-tris(di(propen-2-yl)stibanyl)benzene,
tris(buta-1,3-dien-1-yl)bismuthane,
1,4-bis(di(buta-1,3-dien-1-yl)bismuthanyl)benzene,
1,3,5-tris(di(buta-1,3-dien-1-yl)bismuthanyl)benzene, tris(buta-1,3-dien-1-yl)stibane,
1,4-bis(di(buta-1,3-dien-1-yl)stibanyl)benzene,
1,3,5-tris(di(buta-1,3-dien-1-yl)stibanyl)benzene,
5-(4-ethenylphenyl)-2,8-diethenyl-dibenzobismole,
1,4-bis(2,8-diethenyl-dibenzobismol-5-yl)benzene,
1,3,5-tris(2,8-diethenyl-dibenzobismol-5-yl)benzene,
5-(4-ethenylphenyl)-2,8-diethenyl-dibenzostibole,
1,4-bis(2,8-diethenyl-dibenzostibol-5-yl)benzene,
1,3,5-tris(2,8-diethenyl-dibenzostibol-5-yl)benzene,
tris(4-propen-2-ylphenyl)bismuthane,
1,4-bis(di(4-propen-2-ylphenyl)bismuthanyl)benzene,
1,3,5-tris(di(4-propen-2-ylphenyl)bismuthanyl)benzene,
tris(4-propen-2-ylphenyl)stibane,
1,4-bis(di(4-propen-2-ylphenyl)stibanyl)benzene,
1,3,5-tris(di(4-propen-2-ylphenyl)stibanyl)benzene,
tris(4-buta-1,3-dien-1-ylphenyl)bismuthane,
1,4-bis(di(4-buta-1,3-dien-1-ylphenyl)bismuthanyl)benzene,
1,3,5-tris(di(4-buta-1,3-dien-1-ylphenyl)bismuthanyl)benzene,
tris(4-buta-1,3-dien-1-ylphenyl)stibane,
1,4-bis(di(4-buta-1,3-dien-1-ylphenyl)stibanyl)benzene,
1,3,5-tris(di(4-buta-1,3-dien-1-ylphenyl)stibanyl)benzene,
tris(cyclopent-2-enyl)bismuthane,
1,4-bis(cyclopent-2-enyl)-bismuthanyl)benzene,
1,3,5-tris(di(cyclopent-2-enyl)bismuthanyl)benzene,
tris(cyclopent-2-enyl)stibane,
1,4-bis(di(cyclopent-2-enyl)stibanyl)benzene,
1,3,5-tris(di(cyclopent-2-enyl)stibanyl)benzene,
tris(cyclohex-2-enyl)bismuthane,
1,4-bis(cyclohex-2-enyl)-bismuthanyl)benzene,
1,3,5-tris(di(cyclohex-2-enyl)bismuthanyl)benzene,
tris(cyclohex-2-enyl)stibane,
1,4-bis(di(cyclohex-2-enyl)stibanyl)benzene,
1,3,5-tris(di(cyclohex-2-enyl)stibanyl)benzene,
tris(cyclohept-2-enyl)bismuthane,
1,4-bis(cyclohept-2-enyl)-bismuthanyl)benzene,
1,3,5-tris(di(cyclohept-2-enyl)bismuthanyl)benzene,
tris(cyclohept-2-enyl)stibane,
1,4-bis(di(cyclohept-2-enyl)stibanyl)benzene,
1,3,5-tris(di(cyclohept-2-enyl)stibanyl)benzene,
tris(prop-2-enoyloxy)bismuthane,
1,4-bis(di(prop-2-enoyloxy)bismuthanyl)benzene,
1,3,5-tris(di(prop-2-enoyloxy)bismuthanyl)benzene,
tris(prop-2-enoyloxy)stibane,
1,4-bis(di(prop-2-enoyloxy)stibanyl)benzene,
1,3,5-tris(di(prop-2-enoyloxy)stibanyl)benzene,
tris(2-methylprop-2-enoyloxy)bismuthane,
1,4-bis(di(2-methylprop-2-enoyloxy)bismuthanyl)benzene,
1,3,5-tris(di(2-methylprop-2-enoyloxy)bismuthanyl)benzene,
tris(2-methylprop-2-enoyloxy)stibane,
1,4-bis(di(2-methylprop-2-enoyloxy)stibanyl)benzene,
1,3,5-tris(di(2-methylprop-2-enoyloxy)stibanyl)benzene,
tris(penta-2,4-dienoyloxy)bismuthane,
1,4-bis(di(penta-2,4-dienoyloxy)bismuthanyl)benzene,
1,3,5-tris(di(penta-2,4-dienoyloxy)bismuthanyl)benzene,
tris(penta-2,4-dienoyloxy)stibane,
1,4-bis(di(penta-2,4-dienoyloxy)stibanyl)benzene,
1,3,5-tris(di(penta-2,4-dienoyloxy)stibanyl)benzene,
tris(prop-2-enoylamino)bismuthane,
1,4-bis(di(prop-2-enoylamino)bismuthanyl)benzene,
1,3,5-tris(prop-2-enoylamino)bismuthanyl)benzene,
tris(prop-2-enoylamino)stibane,
1,4-bis(di(prop-2-enoylamino)stibanyl)benzene,
1,3,5-tris(di(prop-2-enoylamino)stibanyl)benzene,
tris(2-methylprop-2-enoylamino)bismuthane,
1,4-bis(di(2-methylprop-2-enoylamino)bismuthanyl)benzene,
1,3,5-tris(di(2-methylprop-2-enoylamino)bismuthanyl)benzene,
tris(2-methylprop-2-enoylamino)stibane,
1,4-bis(di(2-methylprop-2-enoylamino)stibanyl)benzene,
1,3,5-tris(di(2-methylprop-2-enoylamino)stibanyl)benzene,
tris(penta-2,4-dienoylamino)bismuthane,
1,4-bis(di(penta-2,4-dienoylamino)bismuthanyl)benzene,
1,3,5-tris(di(penta-2,4-dienoylamino)bismuthanyl)benzene,
tris(penta-2,4-dienoylamino)stibane,
1,4-bis(di(penta-2,4-dienoylamino)stibanyl)benzene,
1,3,5-tris(di(penta-2,4-dienoylamino)stibanyl)benzene,
tris(4-(prop-2-enoyloxy)phenyl)bismuthane,
1,4-bis(di(4-(prop-2-enoyloxy)phenyl)bismuthanyl)benzene,
1,3,5-tris(di(4-(prop-2-enoyloxy)phenyl)bismuthanyl)benzene,
tris(4-(prop-2-enoyloxy)phenyl)stibane,
1,4-bis(di(4-(prop-2-enoyloxy)phenyl)stibanyl)benzene,
1,3,5-tris(di(4-(prop-2-enoyloxy)phenyl)stibanyl)benzene,
tris(4-(2-methylprop-2-enoyloxy)phenyl)bismuthane,
1,4-bis(di(4-(2-methylprop-2-enoyloxy)phenyl)bismuthanyl)benzene,
1,3,5-tris(di(4-(2-methylprop-2-enoyloxy)phenyl)bismuthanyl)benzene,
tris(4-(2-methylprop-2-enoyloxy)phenyl)stibane,
1,4-bis(di(4-(2-methylprop-2-enoyloxy)phenyl)stibanyl)benzene,
1,3,5-tris(di(4-(2-methylprop-2-enoyloxy)phenyl)stibanyl)benzene,
tris(4-(penta-2,4-dienoyloxy)phenyl)bismuthane,
1,4-bis(di(4-(penta-2,4-dienoyloxy)phenyl)bismuthanyl)benzene,
1,3,5-tris(di(4-(penta-2,4-dienoyloxy)phenyl)bismuthanyl)benzene,
tris(4-(penta-2,4-dienoyloxy)phenyl)stibane,
1,4-bis(di(4-(penta-2,4-dienoyloxy)phenyl)stibanyl)benzene,
1,3,5-tris(di(4-(penta-2,4-dienoyloxy)phenyl)stibanyl)benzene,
tris(4-(prop-2-enoylamino)phenyl)bismuthane,
1,4-bis(di(4-(prop-2-enoylamino)phenyl)bismuthanyl)benzene,
1,3,5-tris(di(4-(prop-2-enoylamino)phenyl)bismuthanyl)benzene,
tris(4-(prop-2-enoylamino)phenyl)stibane,
1,4-bis(di(4-(prop-2-enoylamino)phenyl)stibanyl)benzene,
1,3,5-tris(di(4-(prop-2-enoylamino)phenyl)stibanyl)benzene,
tris(4-(2-methylprop-2-enoylamino)phenyl)bismuthane,
1,4-bis(di(4-(2-methylprop-2-enoylamino)phenyl)bismuthanyl)benzene,
1,3,5-tris(di(4-(2-methylprop-2-enoylamino)phenyl)bismuthanyl)benzene,
tris(4-(2-methylprop-2-enoylamino)phenyl)stibane,
1,4-bis(di(4-(2-methylprop-2-enoylamino)phenyl)stibanyl)benzene,
1,3,5-tris(di(4-(2-methylprop-2-enoylamino)phenyl)stibanyl)benzene, tris(4-(penta-2,4-dienoylamino)phenyl)bismuthane,
1,4-bis(di(4-(penta-2,4-dienoylamino)phenyl)bismuthanyl)benzene,
1,3,5-tris(di(4-(penta-2,4-dienoylamino)phenyl)bismuthanyl)benzene,
tris(4-(penta-2,4-dienoylamino)phenyl)stibane,
1,4-bis(di(4-(penta-2,4-dienoylamino)phenyl)stibanyl)benzene,
1,3,5-tris(di(4-(penta-2,4-dienoylamino)phenyl)stibanyl)benzene,
tris(4-(ethenoxycarbonyl)phenyl)bismuthane,
1,4-bis(di(4-(ethenoxycarbonyl)phenyl)bismuthanyl)benzene,
1,3,5-tris(di(4-(ethenoxycarbonyl)phenyl)bismuthanyl)benzene,
tris(4-(ethenoxycarbonyl)phenyl)stibane,
1,4-bis(di(4-(ethenoxycarbonyl)phenyl)stibanyl)benzene,
1,3,5-tris(di(4-(ethenoxycarbonyl)phenyl)stibanyl)benzene,
tris(4-(isopropenyloxycarbonyl)phenyl)bismuthane,
1,4-bis(di(4-(isopropenyloxycarbonyl)phenyl)bismuthanyl)benzene,
1,3,5-tris(di(4-(isopropenyloxycarbonyl)phenyl)bismuthanyl)benzene,
tris(4-(isopropenyloxycarbonyl)phenyl)stibane,
1,4-bis(di(4-(isopropenyloxycarbonyl)phenyl)stibanyl)benzene,
1,3,5-tris(di(4-(isopropenyloxycarbonyl)phenyl)stibanyl)benzene,
tris(4-(buta-1,3-dienyloxycarbonyl)phenyl)bismuthane,
1,4-bis(di(4-(buta-1,3-dienyloxycarbonyl)phenyl)bismuthanyl)benzene,
1,3,5-tris(di(4-(buta-1,3-dienyloxycarbonyl)phenyl)bismuthanyl)benzene,
tris(4-(buta-1,3-dienyloxycarbonyl)phenyl)stibane,
1,4-bis(di(4-(buta-1,3-dienyloxycarbonyl)phenyl)stibanyl)benzene,
1,3,5-tris(di(4-(buta-1,3-dienyloxycarbonyl)phenyl)stibanyl)benzene,
tris(4-(ethenylcarbamoyl)phenyl)bismuthane,
1,4-bis(di(4-(ethenylcarbamoyl)phenyl)bismuthanyl)benzene,
1,3,5-tris(di(4-(ethenylcarbamoyl)phenyl)bismuthanyl)benzene,
tris(4-(ethenylcarbamoyl)phenyl)stibane,
1,4-bis(di(4-(ethenylcarbamoyl)phenyl)stibanyl)benzene,
1,3,5-tris(di(4-(ethenylcarbamoyl)phenyl)stibanyl)benzene,
tris(4-(isopropenylcarbmoyl)phenyl)bismuthane,
1,4-bis(di(4-(isopropenylcarbmoyl)phenyl)bismuthanyl)benzene,
1,3,5-tris(di(4-(isopropenylcarbmoyl)phenyl)bismuthanyl)benzene,
tris(4-(isopropenylcarbmoyl)phenyl)stibane,
1,4-bis(di(4-(isopropenylcarbmoyl)phenyl)stibanyl)benzene,
1,3,5-tris(di(4-(isopropenylcarbmoyl)phenyl)stibanyl)benzene,
tris(4-(buta-1,3-dienylcarbamoyl)phenyl)bismuthane,
1,4-bis(di(4-(buta-1,3-dienylcarbamoyl)phenyl)bismuthanyl)benzene,
1,3,5-tris(di(4-(buta-1,3-dienylcarbamoyl)phenyl)bismuthanyl)benzene,
tris(4-(buta-1,3-dienylcarbamoyl)phenyl)stibane,
1,4-bis(di(4-(buta-1,3-dienylcarbamoyl)phenyl)stibanyl)benzene,
1,3,5-tris(di(4-(buta-1,3-dienylcarbamoyl)phenyl)stibanyl)benzene,
tris(ethenyloxy)bismuthane,
1,4-bis(di(ethenyloxy)bismuthanyl)benzene,
1,3,5-tris(di(ethenyloxy)bismuthanyl)benzene,
tris(ethenyloxy)stibane,
1,4-bis(di(ethenyloxy)stibanyl)benzene,
1,3,5-tris(di(ethenyloxy)stibanyl)benzene,
tris(propen-2-yloxy)bismuthane,
1,4-bis(di(propen-2-yloxy)bismuthanyl)benzene,
1,3,5-tris(di(propen-2-yloxy)bismuthanyl)benzene,
tris(propen-2-yloxy)stibane,
1,4-bis(di(propen-2-yloxy)stibanyl)benzene,
1,3,5-tris(di(propen-2-yloxy)stibanyl)benzene,
tris(buta-1,3-dien-1-yloxy)bismuthane,
1,4-bis(di(buta-1,3-dien-1-yloxy)bismuthanyl)benzene,
1,3,5-tris(di(buta-1,3-dien-1-yloxy)bismuthanyl)benzene,
tris(buta-1,3-dien-1-yloxy)stibane,
1,4-bis(di(buta-1,3-dien-1-yloxy)stibanyl)benzene,
1,3,5-tris(di(buta-1,3-dien-1-yloxy)stibanyl)benzene,
tris(4-ethenylphenoxy)bismuthane,
1,4-bis(di(4-ethenylphenoxy)bismuthanyl)benzene,
1,3,5-tris(di(4-ethenylphenoxy)bismuthanyl)benzene,
tris(4-ethenylphenoxy)stibane,
1,4-bis(di(4-ethenylphenoxy)stibanyl)benzene,
1,3,5-tris(di(4-ethenylphenoxy)stibanyl)benzene,
tris(4-propen-2-ylphenoxy)bismuthane,
1,4-bis(di(4-propen-2-ylphenoxy)bismuthanyl)benzene,
1,3,5-tris(di(4-propen-2-ylphenoxy)bismuthanyl)benzene,
tris(4-propen-2-ylphenoxy)stibane,
1,4-bis(di(4-propen-2-ylphenoxy)stibanyl)benzene,
1,3,5-tris(di(4-propen-2-ylphenoxy)stibanyl)benzene,
tris(4-buta-1,3-dien-1-ylphenoxy)bismuthane,
1,4-bis(di(4-buta-1,3-dien-1-ylphenoxy)bismuthanyl)benzene,
1,3,5-tris(di(4-buta-1,3-dien-1-ylphenoxy)bismuthanyl)benzene,
tris(4-buta-1,3-dien-1-ylphenoxy)stibane,
1,4-bis(di(4-buta-1,3-dien-1-ylphenoxy)stibanyl)benzene,
1,3,5-tris(di(4-buta-1,3-dien-1-ylphenoxy)stibanyl)benzene,
tris(cyclopent-2-enyloxy)bismuthane,
1,4-bis(cyclopent-2-enyloxy)-bismuthanyl)benzene,
1,3,5-tris(di(cyclopent-2-enyloxy)bismuthanyl)benzene,
tris(cyclopent-2-enyloxy)stibane,
1,4-bis(di(cyclopent-2-enyloxy)stibanyl)benzene,
1,3,5-tris(di(cyclopent-2-enyloxy)stibanyl)benzene,
tris(cyclohex-2-enyloxy)bismuthane,
1,4-bis(cyclohex-2-enyloxy)-bismuthanyl)benzene,
1,3,5-tris(di(cyclohex-2-enyloxy)bismuthanyl)benzene,
tris(cyclohex-2-enyloxy)stibane,
1,4-bis(di(cyclohex-2-enyloxy)stibanyl)benzene,
1,3,5-tris(di(cyclohex-2-enyloxy)stibanyl)benzene,
tris(cyclohept-2-enyloxy)bismuthane,
1,4-bis(cyclohept-2-enyloxy)-bismuthanyl)benzene,
1,3,5-tris(di(cyclohept-2-enyloxy)bismuthanyl)benzene,
tris(cyclohept-2-enyloxy)stibane,
1,4-bis(di(cyclohept-2-enyloxy)stibanyl)benzene,
1,3,5-tris(di(cyclohept-2-enyloxy)stibanyl)benzene,
tris(4-(prop-2-enoyloxy)phenoxy)bismuthane,
1,4-bis(di(4-(prop-2-enoyloxy)phenoxy)bismuthanyl)benzene,
1,3,5-tris(di(4-(prop-2-enoyloxy)phenoxy)bismuthanyl)benzene, tris(4-(prop-2-enoyloxy)phenoxy)stibane,
1,4-bis(di(4-(prop-2-enoyloxy)phenoxy)stibanyl)benzene,
1,3,5-tris(di(4-(prop-2-enoyloxy)phenoxy)stibanyl)benzene,
tris(4-(2-methylprop-2-enoyloxy)phenoxy)bismuthane,
1,4-bis(di(4-(2-methylprop-2-enoyloxy)phenoxy)bismuthanyl)benzene,
1,3,5-tris(di(4-(2-methylprop-2-enoyloxy)phenoxy)bismuthanyl)benzene,
tris(4-(2-methylprop-2-enoyloxy)phenoxy)stibane,
1,4-bis(di(4-(2-methylprop-2-enoyloxy)phenoxy)stibanyl)benzene,
1,3,5-tris(di(4-(2-methylprop-2-enoyloxy)phenoxy)stibanyl)benzene,
tris(4-(penta-2,4-dienoyloxy)phenoxy)bismuthane,
1,4-bis(di(4-(penta-2,4-dienoyloxy)phenoxy)bismuthanyl)benzene,
1,3,5-tris(di(4-(penta-2,4-dienoyloxy)phenoxy)bismuthanyl)benzene,
tris(4-(penta-2,4-dienoyloxy)phenoxy)stibane,
1,4-bis(di(4-(penta-2,4-dienoyloxy)phenoxy)stibanyl)benzene,
1,3,5-tris(di(4-(penta-2,4-dienoyloxy)phenoxy)stibanyl)benzene,
tris(4-(prop-2-enoylamino)phenoxy)bismuthane,
1,4-bis(di(4-(prop-2-enoylamino)phenoxy)bismuthanyl)benzene,
1,3,5-tris(di(4-(prop-2-enoylamino)phenoxy)bismuthanyl)benzene,
tris(4-(prop-2-enoylamino)phenoxy)stibane,
1,4-bis(di(4-(prop-2-enoylamino)phenoxy)stibanyl)benzene,
1,3,5-tris(di(4-(prop-2-enoylamino)phenoxy)stibanyl)benzene,
tris(4-(2-methylprop-2-enoylamino)phenoxy)bismuthane,
1,4-bis(di(4-(2-methylprop-2-enoylamino)phenoxy)bismuthanyl)benzene,
1,3,5-tris(di(4-(2-methylprop-2-enoylamino)phenoxy)bismuthanyl)benzene,
tris(4-(2-methylprop-2-enoylamino)phenoxy)stibane,
1,4-bis(di(4-(2-methylprop-2-enoylamino)phenoxy)stibanyl)benzene,
1,3,5-tris(di(4-(2-methylprop-2-enoylamino)phenoxy)stibanyl)benzene,
tris(4-(penta-2,4-dienoylamino)phenoxy)bismuthane,
1,4-bis(di(4-(penta-2,4-dienoylamino)phenoxy)bismuthanyl)benzene,
1,3,5-tris(di(4-(penta-2,4-dienoylamino)phenoxy)bismuthanyl)benzene,
tris(4-(penta-2,4-dienoylamino)phenoxy)stibane,
1,4-bis(di(4-(penta-2,4-dienoylamino)phenoxy)stibanyl)benzene,
1,3,5-tris(di(4-(penta-2,4-dienoylamino)phenoxy)stibanyl)benzene,
tris(4-(ethenoxycarbonyl)phenoxy)bismuthane,
1,4-bis(di(4-(ethenoxycarbonyl)phenoxy)bismuthanyl)benzene,
1,3,5-tris(di(4-(ethenoxycarbonyl)phenoxy)bismuthanyl)benzene,
tris(4-(ethenoxycarbonyl)phenoxy)stibane,
1,4-bis(di(4-(ethenoxycarbonyl)phenoxy)stibanyl)benzene,
1,3,5-tris(di(4-(ethenoxycarbonyl)phenoxy)stibanyl)benzene,
tris(4-(isopropenyloxycarbonyl)phenoxy)bismuthane,
1,4-bis(di(4-(isopropenyloxycarbonyl)phenoxy)bismuthanyl)benzene,
1,3,5-tris(di(4-(isopropenyloxycarbonyl)phenoxy)bismuthanyl)benzene,
tris(4-(isopropenyloxycarbonyl)phenoxy)stibane,
1,4-bis(di(4-(isopropenyloxycarbonyl)phenoxy)stibanyl)benzene,
1,3,5-tris(di(4-(isopropenyloxycarbonyl)phenoxy)stibanyl)benzene,
tris(4-(buta-1,3-dienyloxycarbonyl)phenoxy)bismuthane,
1,4-bis(di(4-(buta-1,3-dienyloxycarbonyl)phenoxy)bismuthanyl)benzene,
1,3,5-tris(di(4-(buta-1,3-dienyloxycarbonyl)phenoxy)bismuthanyl)benzene,
tris(4-(buta-1,3-dienyloxycarbonyl)phenoxy)stibane,
1,4-bis(di(4-(buta-1,3-dienyloxycarbonyl)phenoxy)stibanyl)benzene,
1,3,5-tris(di(4-(buta-1,3-dienyloxycarbonyl)phenoxy)stibanyl)benzene,
tris(4-(ethenylcarbamoyl)phenoxy)bismuthane,
1,4-bis(di(4-(ethenylcarbamoyl)phenoxy)bismuthanyl)benzene,
1,3,5-tris(di(4-(ethenylcarbamoyl)phenoxy)bismuthanyl)benzene,
tris(4-(ethenylcarbamoyl)phenoxy)stibane,
1,4-bis(di(4-(ethenylcarbamoyl)phenoxy)stibanyl)benzene,
1,3,5-tris(di(4-(ethenylcarbamoyl)phenoxy)stibanyl)benzene,
tris(4-(isopropenylcarbmoyl)phenoxy)bismuthane,
1,4-bis(di(4-(isopropenylcarbmoyl)phenoxy)bismuthanyl)benzene,
1,3,5-tris(di(4-(isopropenylcarbmoyl)phenoxy)bismuthanyl)benzene,
tris(4-(isopropenylcarbmoyl)phenoxy)stibane,
1,4-bis(di(4-(isopropenylcarbmoyl)phenoxy)stibanyl)benzene,
1,3,5-tris(di(4-(isopropenylcarbmoyl)phenoxy)stibanyl)benzene,
tris(4-(buta-1,3-dienylcarbamoyl)phenoxy)bismuthane,
1,4-bis(di(4-(buta-1,3-dienylcarbamoyl)phenoxy)bismuthanyl)benzene,
1,3,5-tris(di(4-(buta-1,3-dienylcarbamoyl)phenoxy)bismuthanyl)benzene,
tris(4-(buta-1,3-dienylcarbamoyl)phenoxy)stibane,
1,4-bis(di(4-(buta-1,3-dienylcarbamoyl)phenoxy)stibanyl)benzene,
1,3,5-tris(di(4-(buta-1,3-dienylcarbamoyl)phenoxy)stibanyl)benzene,
tris(ethenylsulfanyl)bismuthane,
1,4-bis(di(ethenylsulfanyl)bismuthanyl)benzene,
1,3,5-tris(di(ethenylsulfanyl)bismuthanyl)benzene,
tris(ethenylsulfanyl)stibane,
1,4-bis(di(ethenylsulfanyl)stibanyl)benzene,
1,3,5-tris(di(ethenylsulfanyl)stibanyl)benzene,
tris(propen-2-ylsulfanyl)bismuthane,
1,4-bis(di(propen-2-ylsulfanyl)bismuthanyl)benzene,
1,3,5-tris(di(propen-2-ylsulfanyl)bismuthanyl)benzene,
tris(propen-2-ylsulfanyl)stibane,
1,4-bis(di(propen-2-ylsulfanyl)stibanyl)benzene,
1,3,5-tris(di(propen-2-ylsulfanyl)stibanyl)benzene,
tris(buta-1,3-dien-1-ylsulfanyl)bismuthane,
1,4-bis(di(buta-1,3-dien-1-ylsulfanyl)bismuthanyl)benzene,
1,3,5-tris(di(buta-1,3-dien-1-ylsulfanyl)bismuthanyl)benzene, tris(buta-1,3-dien-1-ylsulfanyl)stibane,
1,4-bis(di(buta-1,3-dien-1-ylsulfanyl)stibanyl)benzene,
1,3,5-tris(di(buta-1,3-dien-1-ylsulfanyl)stibanyl)benzene,
tris(4-ethenylphenylsulfanyl)bismuthane,
1,4-bis(di(4-ethenylphenylsulfanyl)bismuthanyl)benzene,
1,3,5-tris(di(4-ethenylphenylsulfanyl)bismuthanyl)benzene,
tris(4-ethenylphenylsulfanyl)stibane,
1,4-bis(di(4-ethenylphenylsulfanyl)stibanyl)benzene,
1,3,5-tris(di(4-ethenylphenylsulfanyl)stibanyl)benzene,
tris(4-propen-2-ylphenylsulfanyl)bismuthane,
1,4-bis(di(4-propen-2-ylphenylsulfanyl)bismuthanyl)benzene,
1,3,5-tris(di(4-propen-2-ylphenylsulfanyl)bismuthanyl)benzene,
tris(4-propen-2-ylphenylsulfanyl)stibane,
1,4-bis(di(4-propen-2-ylphenylsulfanyl)stibanyl)benzene,
1,3,5-tris(di(4-propen-2-ylphenylsulfanyl)stibanyl)benzene,
tris(4-buta-1,3-dien-1-ylphenylsulfanyl)bismuthane,
1,4-bis(di(4-buta-1,3-dien-1-ylphenylsulfanyl)bismuthanyl)benzene,
1,3,5-tris(di(4-buta-1,3-dien-1-ylphenylsulfanyl)bismuthanyl)benzene,
tris(4-buta-1,3-dien-1-ylphenylsulfanyl)stibane,
1,4-bis(di(4-buta-1,3-dien-1-ylphenylsulfanyl)stibanyl)benzene,
1,3,5-tris(di(4-buta-1,3-dien-1-ylphenylsulfanyl)stibanyl)benzene,
tris(cyclopent-2-enylsulfanyl)bismuthane,
1,4-bis(cyclopent-2-enylsulfanyl)-bismuthanyl)benzene,
1,3,5-tris(di(cyclopent-2-enylsulfanyl)bismuthanyl)benzene,
tris(cyclopent-2-enylsulfanyl)stibane,
1,4-bis(di(cyclopent-2-enylsulfanyl)stibanyl)benzene,
1,3,5-tris(di(cyclopent-2-enylsulfanyl)stibanyl)benzene,
tris(cyclohex-2-enylsulfanyl)bismuthane,
1,4-bis(cyclohex-2-enylsulfanyl)-bismuthanyl)benzene,
1,3,5-tris(di(cyclohex-2-enylsulfanyl)bismuthanyl)benzene,
tris(cyclohex-2-enylsulfanyl)stibane,
1,4-bis(di(cyclohex-2-enylsulfanyl)stibanyl)benzene,
1,3,5-tris(di(cyclohex-2-enylsulfanyl)stibanyl)benzene,
tris(cyclohept-2-enylsulfanyl)bismuthane,
1,4-bis(cyclohept-2-enylsulfanyl)-bismuthanyl)benzene,
1,3,5-tris(di(cyclohept-2-enylsulfanyl)bismuthanyl)benzene,
tris(cyclohept-2-enylsulfanyl)stibane,
1,4-bis(di(cyclohept-2-enylsulfanyl)stibanyl)benzene,
1,3,5-tris(di(cyclohept-2-enylsulfanyl)stibanyl)benzene,
tris(4-(prop-2-enoyloxy)phenylsulfanyl)bismuthane,
1,4-bis(di(4-(prop-2-enoyloxy)phenylsulfanyl)bismuthanyl)benzene,
1,3,5-tris(di(4-(prop-2-enoyloxy)phenylsulfanyl)bismuthanyl)benzene,
tris(4-(prop-2-enoyloxy)phenylsulfanyl)stibane,
1,4-bis(di(4-(prop-2-enoyloxy)phenylsulfanyl)stibanyl)benzene,
1,3,5-tris(di(4-(prop-2-enoyloxy)phenylsulfanyl)stibanyl)benzene,
tris(4-(2-methylprop-2-enoyloxy)phenylsulfanyl)bismuthane,
1,4-bis(di(4-(2-methylprop-2-enoyloxy)phenylsulfanyl)bismuthanyl)benzene,
1,3,5-tris(di(4-(2-methylprop-2-enoyloxy)phenylsulfanyl)bismuthanyl)benzene,
tris(4-(2-methylprop-2-enoyloxy)phenylsulfanyl)stibane,
1,4-bis(di(4-(2-methylprop-2-enoyloxy)phenylsulfanyl)stibanyl)benzene,
1,3,5-tris(di(4-(2-methylprop-2-enoyloxy)phenylsulfanyl)stibanyl)benzene,
tris(4-(penta-2,4-dienoyloxy)phenylsulfanyl)bismuthane,
1,4-bis(di(4-(penta-2,4-dienoyloxy)phenylsulfanyl)bismuthanyl)benzene,
1,3,5-tris(di(4-(penta-2,4-dienoyloxy)phenylsulfanyl)bismuthanyl)benzene,
tris(4-(penta-2,4-dienoyloxy)phenylsulfanyl)stibane,
1,4-bis(di(4-(penta-2,4-dienoyloxy)phenylsulfanyl)stibanyl)benzene,
1,3,5-tris(di(4-(penta-2,4-dienoyloxy)phenylsulfanyl)stibanyl)benzene,
tris(4-(prop-2-enoylamino)phenylsulfanyl)bismuthane,
1,4-bis(di(4-(prop-2-enoylamino)phenylsulfanyl)bismuthanyl)benzene,
1,3,5-tris(di(4-(prop-2-enoylamino)phenylsulfanyl)bismuthanyl)benzene,
tris(4-(prop-2-enoylamino)phenylsulfanyl)stibane,
1,4-bis(di(4-(prop-2-enoylamino)phenylsulfanyl)stibanyl)benzene,
1,3,5-tris(di(4-(prop-2-enoylamino)phenylsulfanyl)stibanyl)benzene,
tris(4-(2-methylprop-2-enoylamino)phenylsulfanyl)bismuthane,
1,4-bis(di(4-(2-methylprop-2-enoylamino)phenylsulfanyl)bismuthanyl)benzene,
1,3,5-tris(di(4-(2-methylprop-2-enoylamino)phenylsulfanyl)bismuthanyl)benzene,
tris(4-(2-methylprop-2-enoylamino)phenylsulfanyl)stibane,
1,4-bis(di(4-(2-methylprop-2-enoylamino)phenylsulfanyl)stibanyl)benzene,
1,3,5-tris(di(4-(2-methylprop-2-enoylamino)phenylsulfanyl)stibanyl)benzene,
tris(4-(penta-2,4-dienoylamino)phenylsulfanyl)bismuthane,
1,4-bis(di(4-(penta-2,4-dienoylamino)phenylsulfanyl)bismuthanyl)benzene,
1,3,5-tris(di(4-(penta-2,4-dienoylamino)phenylsulfanyl)bismuthanyl)benzene,
tris(4-(penta-2,4-dienoylamino)phenylsulfanyl)stibane,
1,4-bis(di(4-(penta-2,4-dienoylamino)phenylsulfanyl)stibanyl)benzene,
1,3,5-tris(di(4-(penta-2,4-dienoylamino)phenylsulfanyl)stibanyl)benzene,
tris(4-(ethenoxycarbonyl)phenylsulfanyl)bismuthane,
1,4-bis(di(4-(ethenoxycarbonyl)phenylsulfanyl)bismuthanyl)benzene,
1,3,5-tris(di(4-(ethenoxycarbonyl)phenylsulfanyl)bismuthanyl)benzene,
tris(4-(ethenoxycarbonyl)phenylsulfanyl)stibane,
1,4-bis(di(4-(ethenoxycarbonyl)phenylsulfanyl)stibanyl)benzene,
1,3,5-tris(di(4-(ethenoxycarbonyl)phenylsulfanyl)stibanyl)benzene,
tris(4-(isopropenyloxycarbonyl)phenylsulfanyl)bismuthane,
1,4-bis(di(4-(isopropenyloxycarbonyl)phenylsulfanyl)bismuthanyl)benzene,
1,3,5-tris(di(4-(isopropenyloxycarbonyl)phenylsulfanyl)bismuthanyl)benzene, tris(4-(isopropenyloxycarbonyl)phenylsulfanyl)stibane,
1,4-bis(di(4-(isopropenyloxycarbonyl)phenylsulfanyl)stibanyl)benzene,
1,3,5-tris(di(4-(isopropenyloxycarbonyl)phenylsulfanyl)stibanyl)benzene,
tris(4-(buta-1,3-dienyloxycarbonyl)phenylsulfanyl)bismuthane,
1,4-bis(di(4-(buta-1,3-dienyloxycarbonyl)phenylsulfanyl)bismuthanyl)benzene,
1,3,5-tris(di(4-(buta-1,3-dienyloxycarbonyl)phenylsulfanyl)bismuthanyl)benzene,
tris(4-(buta-1,3-dienyloxycarbonyl)phenylsulfanyl)stibane,
1,4-bis(di(4-(buta-1,3-dienyloxycarbonyl)phenylsulfanyl)stibanyl)benzene,
1,3,5-tris(di(4-(buta-1,3-dienyloxycarbonyl)phenylsulfanyl)stibanyl)benzene,
tris(4-(ethenylcarbamoyl)phenylsulfanyl)bismuthane,
1,4-bis(di(4-(ethenylcarbamoyl)phenylsulfanyl)bismuthanyl)benzene,
1,3,5-tris(di(4-(ethenylcarbamoyl)phenylsulfanyl)bismuthanyl)benzene,
tris(4-(ethenylcarbamoyl)phenylsulfanyl)stibane,
1,4-bis(di(4-(ethenylcarbamoyl)phenylsulfanyl)stibanyl)benzene,
1,3,5-tris(di(4-(ethenylcarbamoyl)phenylsulfanyl)stibanyl)benzene,
tris(4-(isopropenylcarbmoyl)phenylsulfanyl)bismuthane,
1,4-bis(di(4-(isopropenylcarbmoyl)phenylsulfanyl)bismuthanyl)benzene,
1,3,5-tris(di(4-(isopropenylcarbmoyl)phenylsulfanyl)bismuthanyl)benzene,
tris(4-(isopropenylcarbmoyl)phenylsulfanyl)stibane,
1,4-bis(di(4-(isopropenylcarbmoyl)phenylsulfanyl)stibanyl)benzene,
1,3,5-tris(di(4-(isopropenylcarbmoyl)phenylsulfanyl)stibanyl)benzene,
tris(4-(buta-1,3-dienylcarbamoyl)phenylsulfanyl)bismuthane,
1,4-bis(di(4-(buta-1,3-dienylcarbamoyl)phenylsulfanyl)bismuthanyl)benzene,
1,3,5-tris(di(4-(buta-1,3-dienylcarbamoyl)phenylsulfanyl)bismuthanyl)benzene,
tris(4-(buta-1,3-dienylcarbamoyl)phenylsulfanyl)stibane,
1,4-bis(di(4-(buta-1,3-dienylcarbamoyl)phenylsulfanyl)stibanyl)benzene,
1,3,5-tris(di(4-(buta-1,3-dienylcarbamoyl)phenylsulfanyl)stibanyl)benzene;
and derivatives of the afore mentioned organometallic molecules.

15. The organometallic photoresist composition according to claim 14, wherein the first organometallic molecule and the second organometallic molecule are present in an amount from 10 to 50% by weight, based on the total weight of the photoresist composition.

\* \* \* \* \*